(12) United States Patent
Nomoto et al.

(10) Patent No.: US 7,830,011 B2
(45) Date of Patent: Nov. 9, 2010

(54) SEMICONDUCTOR ELEMENT AND WAFER LEVEL CHIP SIZE PACKAGE THEREFOR

(75) Inventors: Kentaro Nomoto, Hamakita (JP); Yuki Igawa, Hamamatsu (JP); Hiroshi Saitoh, Iwata-gun (JP); Takashi Sato, Hamamatsu (JP); Toshio Ohashi, Hamakita (JP); Yoshihiro Ohkura, Iwata-gun (JP)

(73) Assignee: Yamaha Corporation, Shizuoka-ken (JP)

( * ) Notice: Subject to any disclaimer, the term of this patent is extended or adjusted under 35 U.S.C. 154(b) by 677 days.

(21) Appl. No.: 11/076,055

(22) Filed: Mar. 10, 2005

(65) Prior Publication Data
US 2005/0199995 A1 Sep. 15, 2005

(30) Foreign Application Priority Data

| Mar. 15, 2004 | (JP) | 2004-072375 |
| Mar. 19, 2004 | (JP) | 2004-080837 |
| May 28, 2004 | (JP) | 2004-158984 |
| Jun. 10, 2004 | (JP) | 2004-172562 |
| Jun. 11, 2004 | (JP) | 2004-173986 |
| Dec. 3, 2004 | (JP) | 2004-351806 |

(51) Int. Cl.
*H01L 23/48* (2006.01)
(52) U.S. Cl. ............... 257/758; 257/774; 257/E23.02; 438/118; 438/622
(58) Field of Classification Search ........... 257/706, 257/773, E23.02
See application file for complete search history.

(56) References Cited

U.S. PATENT DOCUMENTS 5,294,812 A 3/1994 Hashimoto et al.

| 5,656,863 A | 8/1997 | Yasunaga et al. |
| 5,894,172 A | 4/1999 | Hyozo et al. |
| 6,225,695 B1 | 5/2001 | Chia et al. |
| 6,261,919 B1 | 7/2001 | Omizo |

(Continued)

FOREIGN PATENT DOCUMENTS

JP 62-079652 4/1987

(Continued)

OTHER PUBLICATIONS

Article entitled Nikkei Micro Device, Part 1, pp. 44-51 (1998).

*Primary Examiner*—Thao X Le
*Assistant Examiner*—Ajay K Arora
(74) *Attorney, Agent, or Firm*—Dickstein Shapiro LLP

(57) ABSTRACT

A semiconductor device, encapsulated in a wafer level chip size package (WLCSP), includes a plurality of pad electrodes formed on the surface of a semiconductor chip, wherein a first insulating layer is formed on the surface of the semiconductor chip except the pad electrodes; a plurality of connection electrodes and at least one heat-dissipation electrode are formed on the surface of the first insulating layer; the pad electrodes and the connection electrodes are mutually connected via a first wiring portion; the heat-dissipation electrode is connected with a second wiring portion; and a second insulating layer is formed to enclose the electrodes and wiring portions, wherein the second wiring portion is arranged in proximity to a heating portion of the semiconductor chip and is formed on the surface of the first insulating layer except the prescribed region corresponding to the first wiring portion.

9 Claims, 36 Drawing Sheets

U.S. PATENT DOCUMENTS

| | | | |
|---|---|---|---|
| 6,627,988 B2 * | 9/2003 | Andoh | 257/706 |
| 6,674,162 B2 | 1/2004 | Takao | |
| 6,924,558 B2 * | 8/2005 | Hanaoka | 257/786 |
| 2001/0004133 A1 * | 6/2001 | Ihara | 257/750 |
| 2003/0132529 A1 * | 7/2003 | Yeo et al. | 257/778 |
| 2005/0167800 A1 | 8/2005 | Naya | |

FOREIGN PATENT DOCUMENTS

| | | |
|---|---|---|
| JP | 02-125412 | 5/1990 |
| JP | 02-134894 A | 5/1990 |
| JP | 04-113660 A | 4/1992 |
| JP | 04-113690 | 4/1992 |
| JP | 06-302604 | 10/1994 |
| JP | 09-213696 | 8/1997 |
| JP | 09213696 | 8/1997 |
| JP | 09-246416 | 9/1997 |
| JP | 2699938 | 9/1997 |
| JP | 9-320911 | 12/1997 |
| JP | 10-242332 | 9/1998 |
| JP | 10-321775 A | 12/1998 |
| JP | 11-045951 | 2/1999 |
| JP | 11-067998 A | 3/1999 |
| JP | 11-74431 | 3/1999 |
| JP | 11-087428 | 3/1999 |
| JP | H11-191599 | 7/1999 |
| JP | 11-354578 | 12/1999 |
| JP | 2000-114129 | 4/2000 |
| JP | 2000-188359 | 7/2000 |
| JP | 2000199965 | 7/2000 |
| JP | 2000-216184 A | 8/2000 |
| JP | 2000-228489 | 8/2000 |
| JP | 2001-077236 A | 3/2001 |
| JP | 2001-085285 | 3/2001 |
| JP | 2001-094000 A | 4/2001 |
| JP | 2001-110951 | 4/2001 |
| JP | 2001-168139 | 6/2001 |
| JP | 2001-244372 A | 9/2001 |
| JP | 2001-284381 | 10/2001 |
| JP | 2001-291793 | 10/2001 |
| JP | 2002-057433 A | 2/2002 |
| JP | 2002-158310 A | 5/2002 |
| JP | 2002-299341 | 10/2002 |
| JP | 2002-329815 | 11/2002 |
| JP | 2003-124389 A | 4/2003 |
| JP | 2003-124390 | 4/2003 |
| JP | 2003218278 | 7/2003 |
| JP | 2003-332504 | 11/2003 |
| JP | 2003332504 | 11/2003 |
| JP | 2004012783 | 1/2004 |
| JP | 2004-221371 | 8/2004 |
| JP | 2005-203695 | 7/2005 |

* cited by examiner

FORMATION OF INSULATING LAYER

FORMATION OF WIRING

REMOVAL OF RESIST LAYER

FORMATION OF POSTS

REMOVAL OF RESIST LAYER

FORMATION OF MOLDED RESIN
ATTACHMENT OF SOLDER BALLS

SEMICONDUCTOR ELEMENT AND WAFER LEVEL CHIP SIZE PACKAGE THEREFOR

BACKGROUND OF THE INVENTION

1. Field of the Invention

This invention relates to semiconductor elements and wafer level chip size packages (WLCSP) therefor.

This application claims priority on Japanese Patent Applications Nos. 2004-158984, 2004-72375, 2004-80837, 2004-175262, 2004-173986, and 2004-351806, the contents of which are incorporated herein by reference.

2. Description of the Related Art

In semiconductor devices such as LSI devices, integrated circuits such as transistors and various electronic components are formed on surfaces of semiconductor chips, which thus generate heat when operated. In order to avoid error and malfunction due to excessive heat generated in semiconductor chips, various heatsink structures and heat dissipation structures for effectively dissipating heat from semiconductor devices have been developed. For example, Japanese Patent Application Publication No. 2002-158310 teaches a semiconductor device equipped with a heat dissipation structure in which heat dissipation electrodes, which are connected with a board, dissipate heat generated by the surface of a semiconductor chip towards the board via an insulating resin (or an insulating layer). In this semiconductor device, the surface areas and side areas of the semiconductor chip are covered with the insulating resin (or insulating layer).

In addition, Japanese Patent Application Publication No. 2001-77236 teaches a semiconductor device equipped with a heat dissipation structure in which a relatively large amount of heat generated by a pad serving as a power source is dissipated via under-fill materials formed on the surface of a semiconductor element by means of heat dissipation patterns (corresponding to wiring portions) of a film substrate, which is arranged in the peripheral portion of the surface of the semiconductor element. In this semiconductor device, wiring portions are formed beside the surface of the semiconductor chip in which integrated circuits are formed.

Wafer level chip size packages (WLCSP) are manufactured such that before a wafer is cut into numerous individual semiconductor chips, wiring portions and electrode portions for establishing electric connections between semiconductor chips and boards are formed on surfaces of semiconductor chips and are enclosed in resins. In WLCSP, wiring portions, electrode portions, and insulating portions are formed at desired positions so that they do not project beyond side areas of a semiconductor chip. This realizes downsizing of a semiconductor device.

Both of the semiconductor device disclosed in Japanese Patent Application Publication No. 2002-158310, in which side areas of a semiconductor chip are enclosed in an insulating layer, and semiconductor device disclosed in Japanese Patent Application Publication No. 2001-77236 are not suited to WLCSP.

Conventionally, WLCSP is not equipped with a heat dissipation structure allowing efficient dissipation of heat generated by a semiconductor chip. Hence, it is strongly demanded that WLCSP be equipped with an effective heat dissipation structure in order to improve the reliability of semiconductor devices.

Due to recent developments regarding IC devices and LSI devices, which are highly advanced to realize high-speed processing and high integration of circuit elements, various types of structures regarding chips and packages realizing efficient heat dissipation from semiconductor devices have been developed and put into practical uses.

Great advances have been achieved in reducing sizes, thicknesses, and weights of electronic devices such as notebook computers and cellular phones equipped with digital cameras. As for chip housings for semiconductor elements, chip size packages (CSP) are recently substituted for conventional dual in-line packages (DIP).

For example, chip size packages (CSP) are designed such that semiconductor elements are connected to carrier substrates via metal bumps, and metal bumps used for attaching semiconductor elements onto printed-circuit boards are formed on the lower surfaces of the carrier substrates. Recent developments bring wafer level chip size packages (WLCSP) to have metal pads, allowing connections with external devices, which are formed on prescribed surfaces (or electronic-circuit fabricated surfaces) of semiconductor substrates on which electronic circuits are formed.

In addition, various structures have been developed to increase heat dissipation abilities for semiconductor elements in conventional chip size packages. For example, Japanese Patent Application Publication No. H10-321775 teaches a heatsink structure in which a thermal conduction sheet attached to a planar surface opposite to a prescribed surface of a CPS is brought into contact with a metal heatsink having a plurality of channels, which engage with metal heatsink plates to dissipate heat generated by a semiconductor element. Japanese Patent Application Publication No. H11-67998 teaches a heatsink structure in which an irregularities film having irregularities realizing height differences is formed on a planar surface opposite to a prescribed surface of a CSP so as to dissipate heat generated by a semiconductor element.

In the heatsink structure disclosed in Japanese Patent Application Publication No. H10-321775 in which metal heatsink plates are attached to the planar surface opposite to the prescribed surface of the CSP, heat dissipation effects must be limited due to the limited area of the planar surface.

In the heatsink structure disclosed in Japanese Patent Application Publication No. H11-67998, heat dissipation effects can be increased because the overall area is increased due to irregularities formed on the planar surface; however, there still remains a problem due to the limited heat dissipation effects thereof.

The conventional WLCSP has a very narrow surface area, which does not provide space for arranging a marking space thereon. This causes difficulty for the human operator to discriminate the direction of the semiconductor element.

Conventionally, semiconductor chips are mounted on boards in two steps, that is, a first step for realizing temporary bonding using the adhesive and a second step for realizing fixed bonding using the solder. This makes it very difficult for the manufacturer to reduce the production cycle in manufacturing of semiconductor chips and to reduce the manufacturing cost therefor. In addition, it is very difficult to downsize manufacturing machines, which causes bottlenecks in reducing the manufacturing cost. For this reason, various methods have been developed to efficiently mount semiconductor chips onto boards by use of magnetic materials and are put into practical uses, which are disclosed in the following documents, for example.

Japanese Patent Application Publication No. 2002-57433;
Japanese Patent No. 2,699,938;
Japanese Patent Application Publication No. H04-113690; and
Japanese Patent Application Publication No. H02-134894.

Conventional methods for mounting semiconductor chips onto boards by using magnetic materials will be described with reference to FIGS. 20 and 21.

FIG. 35 is a cross sectional view showing a first example of the mounting method, wherein reference numeral 201 designates a chip module, and reference numeral 202 designates a wiring board on which the chip member 201 is mounted. The chip module 201 is designed such that a pair of electrode terminals 204 are attached to both sides of a chip substrate 203 on which an electronic circuit is formed; a permanent magnet 205 is adhered to the bottom of the chip substrate 203; and a sealing member 206 is formed on the upper surface of the chip substrate 203. The wiring board 202 is designed such that electrode patterns 208 are formed at prescribed positions on a substrate 207 on which wiring patterns (not shown) are formed; and a magnetic material 209 is arranged between the electrode patterns 208.

In procedures for mounting the chip module 201 onto the wiring board 202, the chip module 201 is arranged above the wiring board 202 so as to establish positioning between the electrode terminals 204 and the electrode patterns 208; then, the chip module 201 is moved downward so that the electrode terminals 204 are brought into contact with the electrode patterns 208, whereby it is possible to complete mounting procedures. Herein, the permanent magnet 205 of the chip module 201 attracts the magnetic material 209 of the wiring board 202, whereby it is possible to securely fix the chip module 201 to the wiring board 202 with prescribed positioning therebetween.

FIG. 36 is a cross sectional view showing a second example of the mounting method, wherein reference numeral 211 designates an IC chip, and reference numeral 212 designates a printed-circuit board. Herein, a plurality of electrode pads 213 are formed on a prescribed surface 211a of the IC chip 211, and magnetic materials 214 are embedded in the prescribed surface 211a of the IC chip 211. Wiring patterns 215 are formed on the printed-circuit board 212, and magnetic materials 216 are embedded in the printed-circuit board 212. In addition, solder balls 217 for establishing electric connections with the wiring patterns 215 are affixed onto the electrode pads 213.

In procedures for mounting the IC chip 211 onto the printed-circuit board 212, the solder balls 217 are affixed onto the electrode pads 213 of the IC chip 211; then, the IC chip 211 is positioned above the printed-circuit board 212 so as to establish positioning between the solder balls 217 and the wiring patterns 215; thereafter, the solder balls 217 are melted so that the IC chip 211 is securely mounted on the printed-circuit board 212. Herein, the magnetic materials 214 and 216 are both magnetized, so that the IC chip 211 is fixed to the printed-circuit board 212 with prescribed positioning therebetween.

The aforementioned methods require processes for positioning the permanent magnet 205 and the magnetic materials 209, 214, and 216 as well as processes for magnetizing the magnetic materials 209, 214, and 216. This increases the number of parts and the number of manufacturing processes, which in turn increase the manufacturing cost. When the permanent magnet 205 and the magnetic materials 209, 214, and 216 are changed in positioning, it is necessary to redesign products, which causes excessive cost in designing.

Before the chip module 201 is mounted on the wiring board 202 as shown in FIG. 35, it is necessary to attach the permanent magnet 205 to the chip module 201 and to correspondingly attach the magnetic material 209 to the wiring board 202, wherein due to the provision of the permanent magnet 205 and the magnetic material 209, the product should be increased in the overall height and volume, which causes unwanted limitations against the downsizing and thickness reduction of the product.

In order to mount the IC chip 211 incorporating the magnetic materials 214 onto the printed-circuit board 212 incorporating the magnetic materials 216, the thickness of the IC chip 211 must be increased to be greater than the thickness of the magnetic materials 214, and the thickness of the printed-circuit board 212 must be increased to be greater than the thickness of the magnetic materials 216. This causes unwanted limitations against the downsizing and thickness reduction of the product.

In WLCSP, integrated circuits are formed in a matrix form on the surface of a silicon wafer (or a semiconductor wafer), which is subjected to mirror surface processing, in accordance with thin-film formation techniques, lithography techniques, and etching techniques, wherein bumps and protective insulating films are formed on integrated circuits; thereafter, the semiconductor wafer is cut into individual pieces along scribing lines by use of a dicing saw and the like.

In the aforementioned manufacturing process, it is necessary to identify semiconductor wafers in order to manage WLCSP products in units of lots. Japanese Patent Application Publication No. H02-125412 teaches a semiconductor wafer having a bar code, which is put into practical use.

FIG. 41 is a perspective view showing an example of a semiconductor wafer having bar codes, wherein a dicer blade 302 is used to perform cutting on prescribed areas in proximity to an orientation flat 301a of a semiconductor wafer 301 or on peripheral areas of the semiconductor wafer 301, thus forming bar-like hollows 303a, 303b, . . . , all of which collectively server as a bar code 303.

In order to manage individual WLCSP products, identification codes for product management are formed on surfaces opposite to prescribed surfaces of packages in which electronic circuits are formed.

FIG. 42 is a perspective view showing an example of a package (i.e., a WLCSP 304) having identification codes, wherein an ink dot laser printer is used to print identification codes 306 representing a production code and characteristics on a backside surface 304a opposite to a prescribed surface of the WLCSP 4 on which bumps 305 are formed.

FIG. 43 is a perspective view showing another example of a package (i.e., a WLCSP 307) having identification codes, wherein a laser processing machine is used to form irregularities (i.e., identification codes 308) representing a product code and characteristics on a backside surface 307a opposite to a prescribed surface of the WLCSP 307 on which bumps 305 are formed.

The WLCSP 304 in which the identification codes 306 are printed using ink may suffer from various problems in which due to various factors such as dispersions of printing of ink, degrading of ink, and power fluctuations of the ink dot laser printer, the identification codes 306 are deviated in concentration and become unclear in reading. This causes error, malfunction, and difficulty in reading with regard to the identification codes 306. In addition, the WLCSP 304 requires a specially designed machine, i.e., an ink dot laser printer, in order to print the identification codes 306, which is troublesome.

The WLCSP 307 in which a laser processing machine is used to form the identification codes 308 may suffer from various problems in which due to various factors such as dispersions of irregularities and power fluctuations of the laser processing machine, the identification codes 308 are deviated in concentration and become unclear in reading. This causes error, malfunction, and difficulty in reading with regard to the identification codes 308. In addition, the WLCSP 307 requires a specially designed machine, i.e., a laser processing machine, in order to form the identification codes 308 realized by irregularities.

Due to technological advances of cellular phones and information terminals, which are reduced in sizes and weights and are highly advanced in performance, it is demanded that LSI devices and semiconductor devices be packaged with high integration and density of circuits and components. Wafer level chip size packages (WLCSP) are designed to realize highly integrated semiconductor devices, wherein wafer treatment and packaging are integrated in manufacturing.

FIG. 50 is a cross sectional view showing a semiconductor device encapsulated in a WLCSP, wherein re-wiring layers 477 are connected with pad electrodes (not shown) formed on a semiconductor chip 453; metal posts 480 enclosed in an enclosed resin 473 are formed on the re-wiring layers 477; and external terminals 481 such as solder balls are attached to the surfaces of the metal posts 480. This is disclosed in a magazine entitled "Nikkei Micro Device", p.p. 44-71, 1998 August issue published in Japan. Japanese Patent Application Publication No. 2000-216184 teaches a first modification adapted to the semiconductor device in which metal posts are embedded in shield layers formed inside of openings of resins. Japanese Patent Application Publication No. 2001-244372 teaches a second modification adapted to the semiconductor device in which metal posts have spherical shapes.

However, the aforementioned semiconductor device and its first modification teach that external terminals whose diameters are greater than those of metal posts are attached onto the 'columnar' metal posts, wherein diameters of post bases (see 477b) for re-wiring layers are substantially identical to those of metal posts. This indicates a relatively great ratio of the area that the post bases occupy the re-wring layers, so that the re-wiring layers are limited in areas used for re-drawing of wires. Due to such a relatively small degree of freedom regarding re-wiring (or re-drawing of wires), the aforementioned structure have difficulty in coping with complicated arrangement of external terminals in LSI devices. In addition, this limits the total density of external terminals (i.e., the number of external terminals per unit area).

The freedom of degree regarding re-wiring may be improved by adopting multi-layered structures to re-wiring layers. However, this may greatly push up the manufacturing cost, which is inconvenient for manufacturers.

The second modification may be advantageous in that by forming metal posts in spherical shapes, metal posts serving as terminal bases are reduced in areas of surfaces lying close to external terminals. However, the reduction of the terminal base causes a reduction of the joining strength of the external terminal, whereby the semiconductor device should be degraded in reliability. In addition, 'spherical' metal posts may be easily destructed or easily separated off from the semiconductor chip.

Japanese Patent Application Publication No. 2001-94000 teaches an example of a semiconductor device enclosed in a chip size package (CPS) in which a semiconductor chip is connected with a base substrate via external terminals for establishing electric connection with a printed-circuit board.

Japanese Patent Application Publication No. 2003-124389 teaches an example of a wafer level chip size package (WLCSP) realizing further downsizing of a semiconductor device including a semiconductor substrate in which external terminals are formed on a prescribed surface for fabricating electronic circuits.

FIG. 61 is a perspective view showing a chip size package (CSP) 501; and FIG. 62 is a cross sectional view of the CSP 501, wherein a semiconductor chip 503 is electrically connected with circuits and wires formed on the surface of a base substrate 502; an insulating resin tape 504 is adhered to the backside of the base substrate 502; metal bumps 505 for establishing electric connections with the semiconductor chip 503 are exposed on the resin tape 504; and V-shaped channel portions 506 are formed and elongated two-dimensionally on the surface and backside of the base substrate 502.

Due to the formation of the V-shaped channel portions 506 on the surface and backside of the base substrate 502, the CSP 501 is disadvantageous in that the base substrate 502 is slightly reduced in rigidity and the end portions thereof may be easily deformed. When the CSP 501 is mounted on a printed-circuit board by heating reflow, end portions of the base substrate 502 are easily deformed in response to the bending of the printed-circuit board, whereby the metal bumps 505 may not be destroyed and are not likely to be badly deformed towards adjacent lands on the printed-circuit board.

FIG. 63 is a cross sectional view showing a conventionally known example of a WLCSP 511, wherein an integrated circuit 513 is formed on a surface 512a of a silicon substrate 512; a resin enclosing layer 514 composed of an insulating resin is formed to entirely cover the surface 512a including the integrated circuit 513; and solder bumps (or electrodes) 515 for establishing electric connections with the integrated circuit 513 are partially exposed on the surface 514a of the resin enclosed layer 514.

The area occupied by the WLCSP 511 is substantially identical to the overall surface area of the silicon substrate 512. Compared with the CSP 501, the WLCSP 511 is reduced in the area for fabricating electronic circuits and is reduced in size.

The aforementioned CSP 501 in which the V-shaped channel portions 506 are formed on the surface and backside of the base substrate 502 can reliably prevent solder bridges and lines from being destroyed and broken due to the curvature of the printed-circuit board. However, it is very difficult to avoid the occurrence of the entire curvature of the CSP 501 including the semiconductor chip 503.

That is, the formation of the V-shaped channel portions 506 on the surface and backside of the base substrate 502 may not adequately avoid the entire curvature of the CSP 501 including the semiconductor chip 503.

Similar to the CSP 501, it is very difficult to avoid the occurrence of the entire curvature of the WLCSP 511 including the silicon substrate 512.

SUMMARY OF THE INVENTION

It is an object of the invention to provide a semiconductor device that can be manufactured in the form of the WLCSP and that can efficiently dissipate heat generated by a semiconductor chip to the exterior thereof.

It is another object of the invention to provide a semiconductor element and a wafer level chip size package therefor, which can improve heat dissipation characteristics without increasing the effective area of the semiconductor element, which is easy to discriminate the direction of the semiconductor element, and which can be processed to present information specifically designated by the semiconductor element.

It is a further object of the invention to provide a semiconductor element and a board therefor, which can realize downsizing and thickness reduction of a product without increasing the number of parts and manufacturing processes and without increasing the overall height and volume of the product.

It is a further object of the invention to provide a semiconductor element and a manufacturing method therefor, in which identification information can be easily applied to the semiconductor element without causing any damage.

It is a further object of the invention to provide a semiconductor device encapsulated in a WLCSP, in which a degree of freedom regarding re-wiring is improved without using multi-layered structures for re-wiring layers, which copes with complicated arrangement of external terminals and increasing density of external terminals, and which guarantees a high joining strength of an external terminal connected with a metal post.

It is a further object of the invention to provide a semiconductor device, which can reliably avoid the occurrence of the curvature of a semiconductor substrate, which is thus improved in strength and improved in heat dissipation.

In a first aspect of the invention, a semiconductor device includes a semiconductor chip, having a rectangular shape, in which a plurality of pad electrodes are formed on a surface thereof; a first insulating layer that is formed to cover the surface of the semiconductor chip except prescribed regions corresponding to the pad electrodes; a plurality of connection electrodes that are arranged on the surface of the semiconductor chip so as to establish electric connections with an external device; at least one heat-dissipation electrode that is arranged on the surface of the semiconductor chip and is connected with the external device; a first wiring portion that is formed on a surface of the first insulating layer to establish electric connections between the pad electrodes and the connection electrodes; a second wiring portion that is formed on the surface of the first insulating layer and is connected with the heat-dissipation electrode; and a second insulating layer for enclosing the first wiring portion and the second wiring portion in such a way that the connection electrodes and the heat-dissipation electrode are exposed on the surface of the semiconductor chip, wherein the second wiring portion is arranged in proximity to a heating portion of the semiconductor chip and is formed to cover the surface of the first insulating surface except a prescribed area corresponding to the first wiring portion.

In the above, the first wiring portion is formed in the center area of the surface of the first insulating layer, and the second wiring portion is formed in the peripheral area of the surface of the first insulating layer. Alternatively, the second wiring portion is formed in the center area of the surface of the first insulating layer. In addition, a semiconductor unit is constituted using the aforementioned semiconductor device attached on to a board having at least one land, which is brought into contact with the heat-dissipation electrode.

Even though the semiconductor device is realized in the form of a WLCSP, it is possible to efficiently dissipate heat generated by the semiconductor chip via the heat-dissipation electrode because the second wiring portion can be increased in area. It is possible to form a plurality of second wiring portions that are connected with a plurality of heat-dissipation electrodes. In addition, when an engagement portion is formed to establish a mutual engagement between the second wiring portion and the first or second insulating layer, it is possible to prevent the second wiring portion from separating from the first or second insulating layer. Thus, it is possible to improve heat-dissipation efficiency and reliability of the semiconductor device.

In a second aspect of the invention, a semiconductor element includes a plurality of channels or hollows (e.g., holes) that are formed on a backside surface opposite to a prescribed surface of a semiconductor substrate on which an electronic circuit is formed. Herein, the channels or hollows can be formed different from each other in terms of widths thereof or in terms of distances therebetween.

A wafer level chip size package includes the aforementioned semiconductor element having a plurality of channels or hollows, which are appropriately changed in widths thereof or in distances therebetween so as to increase the overall area used for the purpose of heat dissipation. Thus, it is possible to improve heat dissipation characteristics and to easily discriminate the direction of the package, wherein it is also possible to realize identification information by appropriately changing shapes and sizes of the channels or hollows, which make is possible to easily identify and manage the package.

In a third aspect of the invention, a semiconductor element includes a plurality of first terminals for establishing electric connections with an external device and at least one second terminal that is not connected with the external device and is equipped with a first magnetic material, which is composed of a ferromagnetic material or a weak magnetic material. The ferromagnetic material is composed of at least one element selected from among iron (Fe), cobalt (Co), nickel (Ni), gadolinium (Gd), terbium (Tb), dysprosium (Dy), holmium (Ho), erbium (Er), and thulium (Tm). It is possible to additionally attach a sensor for sensing a physical quantity onto another surface opposite to the prescribed surface of the semiconductor element.

An electronic device is constituted using the aforementioned semiconductor element that is attached onto a board, wherein a second magnetic material is attached onto a surface of the board directly opposite to the prescribed surface of the semiconductor element in correspondence with the first magnetic material, whereby the semiconductor element is fixed to the board with prescribed positioning therebetween by magnetic attraction occurring between the first magnetic material and the second magnetic material, thus improving the reliability and yield in manufacturing.

In a fourth aspect of the invention, a semiconductor element includes a semiconductor substrate having a prescribed surface for fabricating an electronic circuit, wherein a surface opposite to the prescribed surface of the semiconductor substrate is divided into a plurality areas, which differ from each other in surface roughness so as to designate an identification mark. Alternatively, a photosensitive layer having a prescribed pattern for designating an identification mark is formed on a surface opposite to the prescribed surface of the semiconductor substrate. The photosensitive layer is composed of a photosensitive polyimide resin, a polyurethane resin, an acrylic resin, or a photosensitive SOG, wherein the prescribed pattern is realized by the photolithography technique. The identification mark represents a character, a numeral, a symbol, a code, or an image.

In a fifth aspect of the invention, a semiconductor device encapsulated in a wafer level chip size package (WLCSP) includes a metal post that is enclosed in a resin and is formed on a re-wiring layer connected with a pad electrode, wherein an external terminal joins a prescribed surface of the metal post, which is greater than its opposite surface lying close to the re-wiring layer. For example, the metal post has a tapered shape whose sectional area is gradually increased in the direction from the re-wiring layer to the external terminal.

Since the prescribed surface of the metal post lying close to the external terminal is made greater than the opposite surface of the metal post lying close to the re-wiring layer, it is possible to reduce a ratio of the area that the post base occupies on the re-wiring layer. Hence, without using multi-layered structures for the re-wiring layer, it is possible to increase the degree of freedom regarding re-wiring, whereby the semiconductor device can cope with complicated arrangement of external terminals and increasing density of external terminals. In addition, the semiconductor device can adequately secure the prescribed surface of the metal post lying close to the external terminal. Compared with the conventional metal post having a spherical shape, the aforementioned metal post is not likely destroyed and separated off from the semiconductor chip due to stress. Therefore, the semiconductor device can be improved in reliability. In preliminary testing performed before the external terminal joins the metal post, it is possible to easily establish alignment between the metal post and a tester probe.

In a sixth aspect of the invention, a semiconductor device includes a semiconductor substrate having a first surface for fabricating an electronic circuit; a resin enclosed layer composed of an insulating resin, which is formed on the first surface of the semiconductor substrate; a plurality of external terminals that are connected with the electronic circuit and that are partially exposed on the resin enclosed layer; a plurality of channels or hollows formed on the resin enclosed layer; and a plurality of channels or hollows formed on a second surface opposite to the first surface of the semiconductor substrate. The channels are elongated in a prescribed direction, or they are formed to rectangularly cross each other. In addition, the channels or hollows can be appropriately changed in shapes or sizes. Furthermore, the hollows can be arranged in a limited area, so that no hollow is formed in the other area.

Due to the formation of the channels or hollows, it is possible to increase the overall area of the surface of the semiconductor device, which is thus improved in heat-dissipation characteristics. In addition, it is possible to avoid the curvature of the semiconductor device.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

1. First Embodiment

Figure 1:
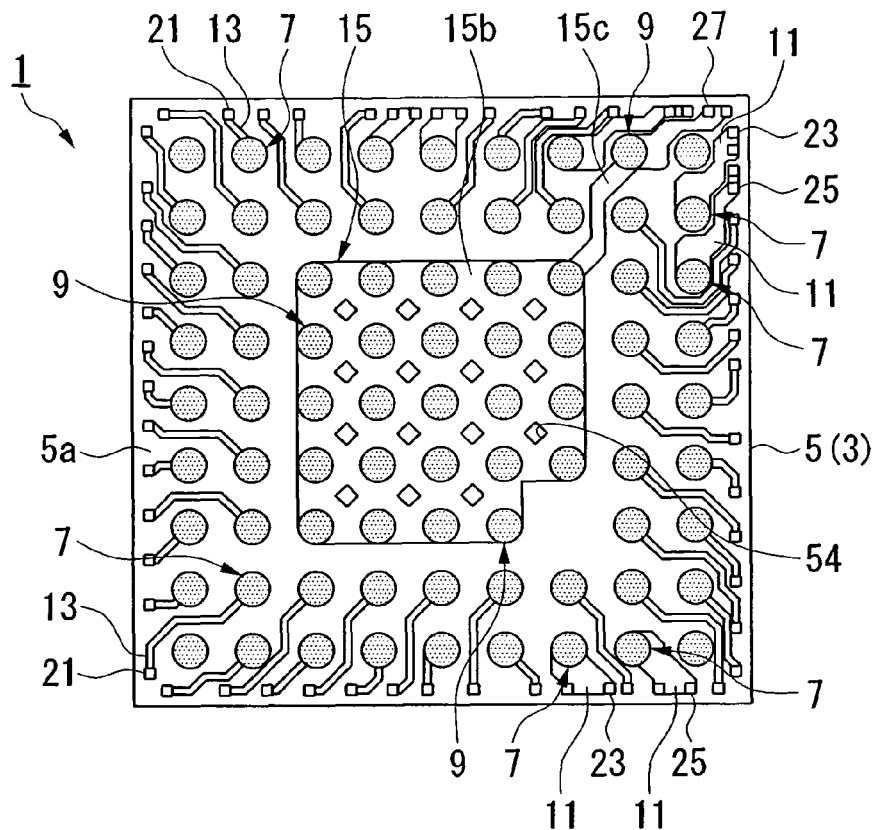
FIG. 1 is a plan view showing a semiconductor device including a semiconductor chip in accordance with a first embodiment of the invention.
Figure 2:
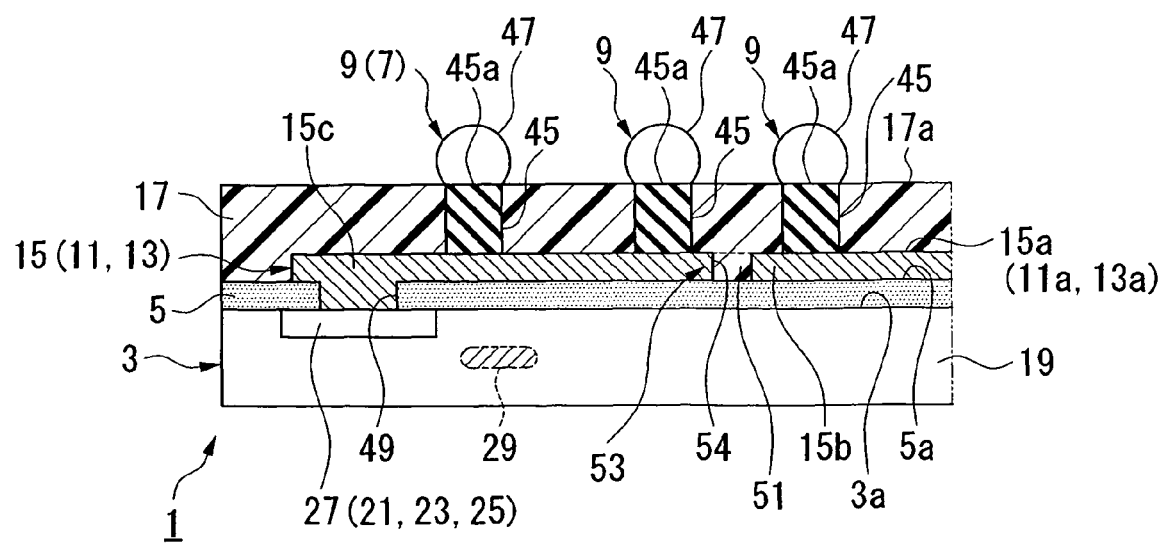
FIG. 2 is a cross sectional view showing essential parts of the semiconductor device.

A semiconductor device according to a first embodiment of the invention will be described with reference to FIGS. 1, 2, 3, 4A-4F, and 5. As shown in FIGS. 1 and 2, a semiconductor device 1 includes a semiconductor chip 3 having a rectangular plate-like shape in plan view, an insulating layer 5 (serving as a first insulating layer) formed on a surface 3a of the semiconductor chip 3, a plurality of connection electrodes 7 and heat-dissipation electrodes 9 arranged on the surface 3a of the semiconductor chip 3, a plurality of wiring portions 11, 13, and 15 that are formed on a surface Sa of the insulating layer 5 so as to establish mutual connections between the semiconductor chip 3 and the connection electrodes 7 or the heat-dissipation electrodes 9, and a molded resin 17 (serving as a second insulating layer), which covers the surface 5a of the insulating layer 5 in such a condition that the electrodes 7 and 9 are exposed to the surface 3a of the semiconductor chip 3 and which encloses the electrodes 7 and 9 and the wiring portions 11, 13, and 15 therein.

That is, the semiconductor device 1 has a WLCSP-like structure in which the insulating layer 5, molded resin 17, electrodes 7 and 9, and wiring portions 11, 13, and 15 are formed not to horizontally project from the surface 3a of the semiconductor chip 3.

In the semiconductor chip 3, signal pad electrodes 21, power pad electrodes 23, ground pad electrodes 25, and heat-dissipation pads 27 are formed on the surface of a substrate 19, which has a rectangular shape in plan view. Electronic circuits including transistors and other electronic components are formed on the surface of the substrate 19, which is composed of silicon (Si).

The signal pad electrodes 21, power pad electrodes 23, ground pad electrodes 25, and heat-dissipation pads 27 are each composed of aluminum (Al) and are arranged in the periphery of the surface 3a of the semiconductor chip 3. The semiconductor chip 3 is constituted similar to conventional semiconductor chips used for QFP-type semiconductor devices.

The signal pad electrodes 21 input and output electric signals with regard to various components formed on the substrate 19. The power pad electrodes 23 supply power to electronic circuits incorporated in the semiconductor chip 3.

The ground pad electrodes 5 are used to ground electronic circuits of the semiconductor chip 3. The signal pad electrodes 21, power pad electrodes 23, and ground pad electrodes 25 collectively serve as pad electrodes for establishing electric connections between electronic circuits of the semiconductor chip 3 and other electronic circuits (or external circuits) on a printed-circuit board (not shown) for mounting the semiconductor chip 1.

The heat-dissipation pads 27 dissipate heat generated by various components formed on the substrate 19 from the semiconductor chip 3, so that they are arranged adjacent to a heating portion of the substrate 19.

Figure 3:
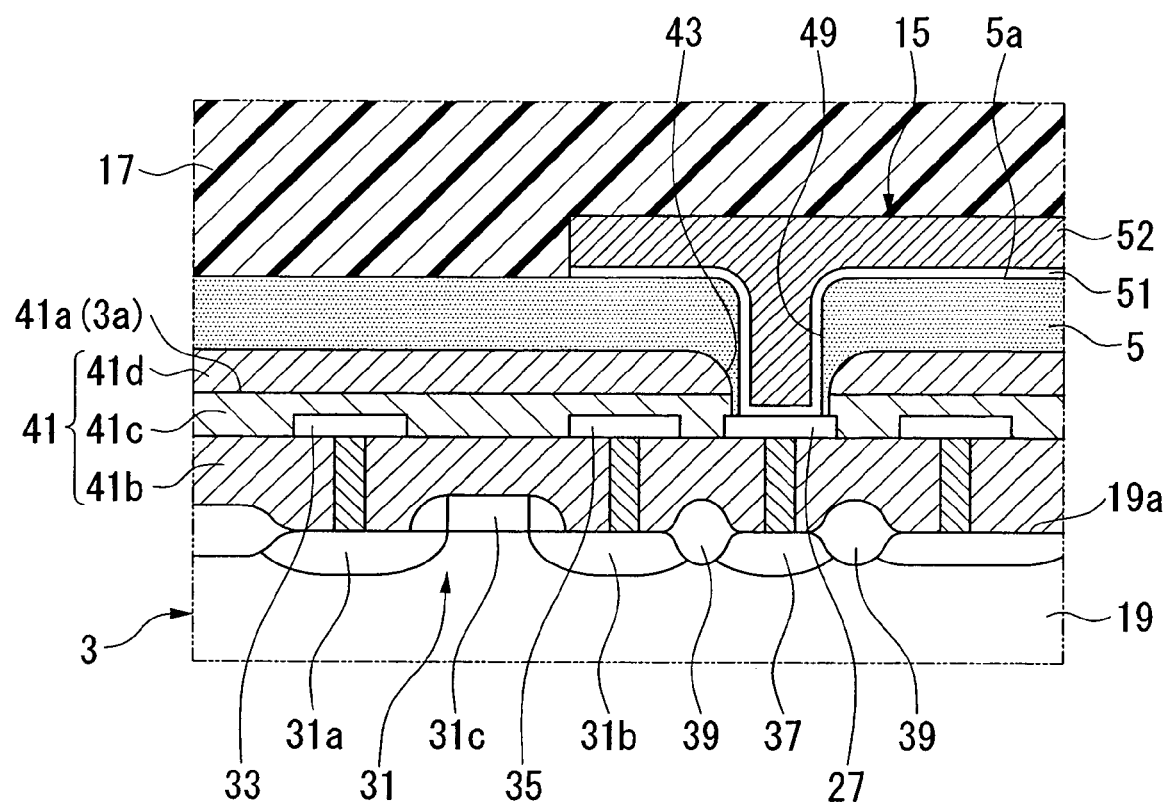
FIG. 3 is a cross sectional view showing essential parts with regard to connections between the semiconductor chip and wiring portions.

Specifically, as shown in FIG. 3, a source diffusion region 31a and a drain diffusion region 31b, which are included in a transistor 31 formed on a surface 19a of the substrate 19, are respectively connected with electrodes 33 and 35. These electrodes 33 and 35 are connected by means of wires formed in a passivation film 41 and are connected with the power pad electrode 23 and the ground pad electrode 25 via electronic circuits and wires (not shown). A heat-dissipation diffusion region 37 connected with the heat-dissipation pad 27 is formed adjacent to the drain diffusion region 31b of the transistor 31 on the surface 19a of the substrate 19. Insulating regions 39, which are each composed of a field oxidation film ($SiO_2$) or shallow trench ($SiO_2$), are formed to encompass the heat-dissipation diffusion region 37, whereby the drain diffusion region 31b is electrically insulated from the heat-dissipation diffusion region 37. In this structure, heat generated by a lower channel of a gate electrode 31c of the transistor 31 is transmitted to the heat-dissipation pad 27 via the heat-dissipation diffusion region 37, which is formed adjacent to the drain diffusion region 13b.

It is possible to modify the aforementioned structure in such a way that the heat-dissipation diffusion region 37 is formed adjacent to the source diffusion region 31a of the transistor 31 via the insulating regions 39. In addition, it is possible to appropriately adjust the potential of the heat-dissipation pad 27 and the polarity of impurities of the heat-dissipation diffusion region 37, which thus serves as an electrode for supplying power to electronic circuits of the semiconductor chip 3 or an electrode for ground the semiconductor chip 3.

The semiconductor chip 3 includes the passivation film 41 that is formed to cover the surface 19a of the substrate 19 except the heat-dissipation pad 27. A hollow 43 is formed in the passivation film 41 so that the heat-dissipation pad 27 is exposed externally of a surface 41a of the passivation film 41. In addition, other hollows (not shown) are formed in the passivation film 41 so that the power pad electrode 23 and the ground pad electrode 25 are respectively exposed externally of the surface 41a of the passivation film 41.

The passivation film 41 is constituted by the lamination of thin insulating films, namely, a first insulating film 41b and a second insulating film 41c, both of which are composed of silicon dioxide ($SiO_2$), and a third insulating film 41d composed of silicon nitride (SiN). The passivation film 41 has a high heat resistance and a high electric insulation. The surface 41a of the passivation film 41 serves as the surface 3a of the semiconductor chip 3.

The insulating layer 5 is formed by use of an insulating resin composed of polyimide (PI), which is an electrically insulating material. The insulating layer 5 is formed to cover the surface 3a of the semiconductor chip 3 and interior walls of the hollow 43, which is defined by the heat-dissipation pad 27 and the passivation film 41. In addition, the insulating film 5 covers interior walls of other hollows (not shown), which are defined by the signal pad electrode 21, power pad electrode 23, ground pad electrode 25, and passivation film 41 respectively.

As shown in FIG. 2, the connection electrodes 7 and heat-dissipation electrodes 9 are used to establish electric connections between the semiconductor chip 3 and electronic circuits of the board (not shown) for mounting the semiconductor device 1. These electrodes 7 and 9 are each constituted by posts 45 and solder balls 47, wherein the posts 45 having cylindrical shapes are elongated from prescribed surfaces (i.e., surfaces 11a and 13a of first wiring portions 11 and 13 connected with the pad electrodes 21, 23, and 25, and a surface 15a of a second wiring portion 15 connected with the heat-dissipation pad 27) to a surface 17a of the molded resin 17, and the solder balls 47 are attached onto upper ends 45a of the posts 45 so as to project from the surface 17a of the molded resin 17. The posts 45 are each composed of copper (Cu), wherein the upper ends 45a thereof are adjusted in height to form a planar plane together with the surface 17a of the molded resin 17. The solder balls 47 are each formed by shaping solder materials roughly into spheres.

As shown in FIG. 1, the connection electrodes 7 connected with the first wiring portions 11 and 13 are formed in the peripheral area of the surface 5a of the insulating layer 5 and are arranged adjacent to the pad electrodes 21, 23, and 25 of the semiconductor chip 3. The heat-dissipation electrodes 9 connected with the second wiring portion 15 are not arranged in the peripheral area but are arranged in the center area of the surface 5a of the insulating layer 5, wherein the heat-dissipation electrode 9 is also arranged in an intermediate area between the heat-dissipation pad 27 and the center area.

The connection electrodes 7 and the heat-dissipation electrodes 9 are arranged adjacent to each other with equal distances therebetween, which do not cause short-circuits of electronic circuits of the semiconductor chip 3.

As shown in FIG. 2, the second wiring portion 15 connected with the heat-dissipation pad 27 is partially embedded in a hollow 49 defined between the heat-dissipation pad 27 and the insulating layer 5, wherein it is formed between the insulating layer 5 and the molded resin 17 and is elongated from the opening of the hollow 49 to reach the lower ends of the posts 45 of the heat-dissipation electrodes 9. As shown in FIG. 3, the second wiring portion 15 is constituted by an under barrier metal 51 and a wiring layer 52, which are sequentially formed on the surface Sa of the insulating layer 5. The wiring layer 52 is composed of copper (Cu). In order to improve the adhesion between the heat-dissipation pad 27 and the wiring layer 52, the under barrier metal 51 is composed of titanium (Ti) or chromium (Cr), wherein it is adequately reduced in thickness compared with the thickness of the wiring layer 52.

The first wiring portions 11 and 13 connected with the signal pad electrodes 21, power pad electrodes 23, and ground pad electrode 25 are formed in structures similar to the structure of the second wiring portions 15, wherein they are elongated to reach the lower ends of the connection electrodes 7 (regarding signal input/output, power supply, and ground), which are arranged in the peripheral area of the surface 5a of the insulating layer 5.

As shown in FIG. 1, the second wiring portion 15 is constituted by a sheet 15b having a rectangular shape in plan view, which is formed in the center area of the surface 5a of the insulating layer 5, and a connection wiring portion 15c that is formed in the peripheral area of the semiconductor chip 3 and is connected with the heat-dissipation pad 27. As shown in FIGS. 1 and 2, a plurality of holes 54 are formed to penetrate through the second wiring portion 15 in its thickness direction, wherein they are each formed at prescribed positions between the heat-dissipation electrodes 9 in plan view.

The connection wiring portion 15c is formed adjacent to the heating portion 29 in the semiconductor chip 3.

The first wiring portions 11 and 13 electrically connect the connection electrodes 7 with the signal pad electrodes 21, power pad electrodes 23, and ground pad electrodes 25. Herein, the connection electrodes 7 are arranged adjacent to the signal pad electrodes 21, power pad electrodes 23, and ground pad electrodes 25, the first wiring portions 11 and 13 are each decreased in length compared with the length of the connection wiring portion 15c of the second wiring portion 15. This makes it possible to realize high-speed transmission of electric signals between the connection electrodes 7 and the signal pad electrodes 21, power pad electrodes 23, and ground pad electrodes 25.

It is necessary to flow a relatively large amount of current through the first wiring portion 11, which is connected with the power pad electrodes 23 and ground pad electrodes 25. Thus, the first wiring portion 11 is increased in thickness compared with the thickness of the other first wiring portion 13 connected with the signal pad electrode 21.

The molded resin 17 is composed of electrically insulating materials, wherein it covers the surface 5a of the insulating layer 5 and also encloses the posts 45 of the electrodes 7 and 9 and the wiring portions 11, 13, and 15. The molded resin 17 is composed of resin materials whose hardness is lower than the hardness of the wiring portions 11, 13, and 15. The molded resin 17 is formed in a rectangular shape substantially identical to that of the semiconductor chip 3 in plan view.

The molded resin 17 has projections 51 embedded in the holes 54 of the second wiring portion 15. A pair of the hole 54 and the projection 51 form an engagement portion 53 for establishing mutual engagement between the second wiring portion 15 and the molded resin 17.

Next, the manufacturing method of the semiconductor device 1 will be described below.

Figure 4A:
FIG. 4A is a cross sectional view showing a first step for manufacturing the semiconductor device, wherein an insulating layer is formed on the surface of a semiconductor chip.
Figure 4B:
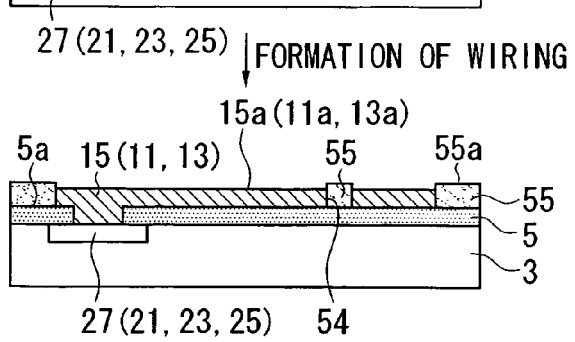
FIG. 4B is a cross sectional view showing a second step for manufacturing the semiconductor device, wherein a first resist layer is formed on the surface of the insulating layer.

First, as shown in FIG. 4A, the insulating layer 5 is formed on the surface 3a of the semiconductor chip 3 so as to form an opening 5b just above each of the pad electrodes 21, 23, and 25 and the heat-dissipation pad 27. As shown in FIG. 4B, a first resist layer 25 is formed on the surface 5a of the insulating layer 5 except at prescribed positions used for the formation of each of the wiring portions 11, 13, and 15, wherein it includes a prescribed region used for the formation of the hole 54 of the second wiring portion 15.

Figure 4C:
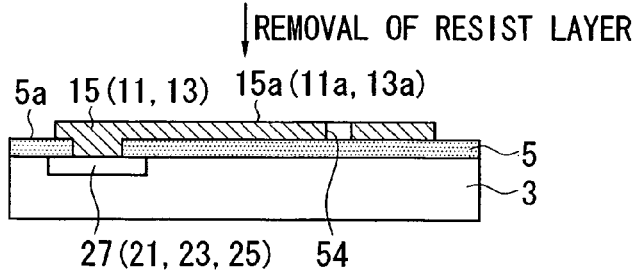
FIG. 4C is a cross sectional view showing a third step for manufacturing the semiconductor device, wherein the first resist layer is removed.

Copper materials are placed into prescribed portions in which the first resist layer 55 is not formed, in other words, exposed portions of the insulating layer 5, thus forming each of the wiring portions 11, 13, and 15. Herein, each of the surfaces 11a, 13a, and 15a of the wiring portions 11, 13, and 15 are reduced in thickness compared with the thickness of a surface 55a of the first resist layer 55. After the completion of the formation of the wiring portions 11, 13, and 15, the first resist layer 55 is removed as shown in FIG. 4C.

Figure 4D:
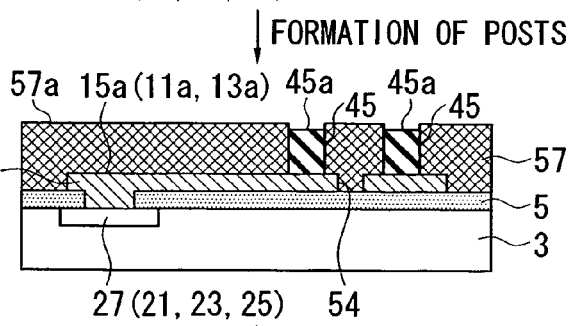
FIG. 4D is a cross sectional view showing a fourth step for manufacturing the semiconductor device, wherein a second resist layer is formed to form posts.
Figure 4E:
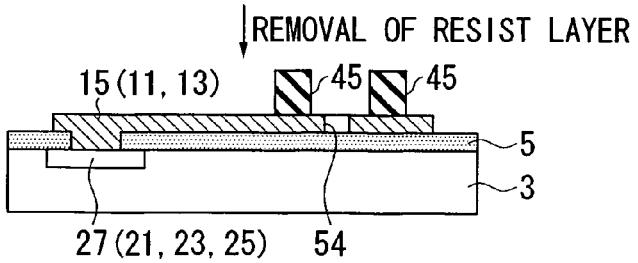
FIG. 4E is a cross sectional view showing a fifth step for manufacturing the semiconductor device, wherein the second resist layer is removed.

As shown in FIG. 4D, a second resist layer 57 is formed on each of the surfaces 11a, 13a, and 15a of the wiring portions 11, 13, and 15 except at prescribed positions used for the formation of the posts 45. In this state, each of the surfaces 11a, 13a, and 15a of the wiring portions 11, 13, and 15 is partially exposed. Copper materials are placed into prescribed portions in which the second resist layer 57 is not formed, in other words, prescribed portions in which the wiring portions 27 are exposed, thus forming the posts 45. After the completion of the formation of the posts 45, the second resist layer 57 is removed as shown in FIG. 4E.

Figure 4F:
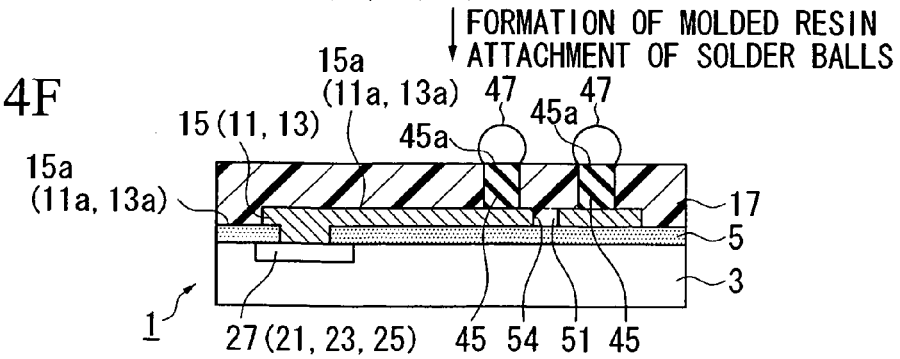
FIG. 4F is a cross sectional view showing a sixth step for manufacturing the semiconductor device, wherein a molded resin is formed, and solder balls are attached onto the upper ends of the posts.

Lastly, as shown in FIG. 4F, the molded resin 17 is formed to cover the surface 5a of the insulating layer 5 and to enclose the wiring portions 11, 13, and 15 as well as the posts 45 in such a way that the upper ends 45a of the posts 45 are exposed. Then, the solder balls 47 are attached onto the upper ends 45a of the posts 45. Thus, the manufacturing of the semiconductor device 1 is completed.

Figure 5:
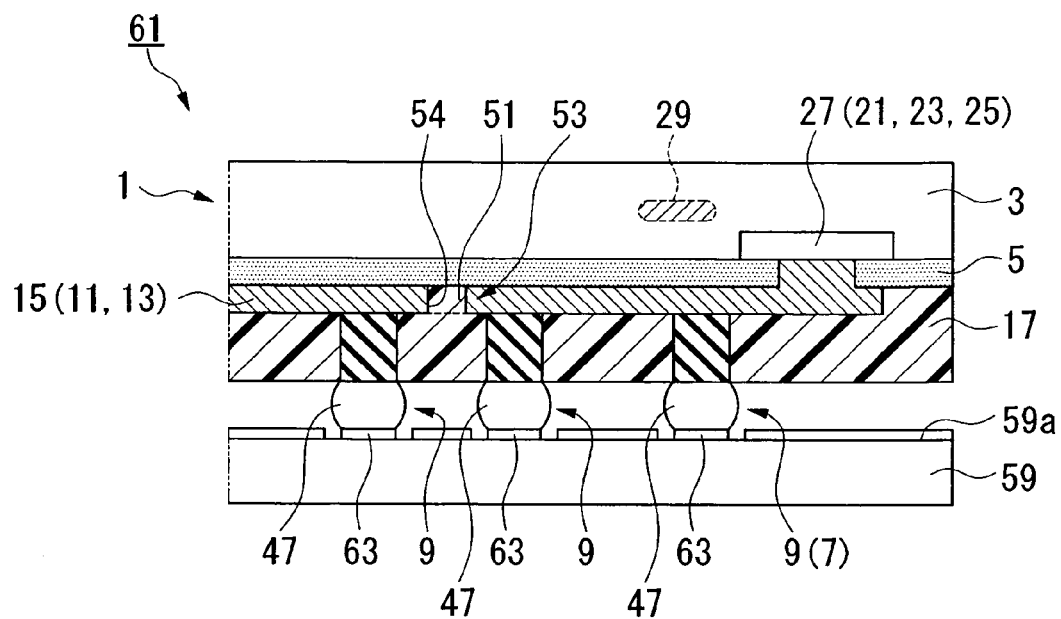
FIG. 5 is a cross sectional view showing the overall structure of a semiconductor unit in which the semiconductor device is mounted on the board.

The aforementioned semiconductor device 1 is mounted on a board 59 so as to produce a semiconductor unit 61 as shown in FIG. 5. A plurality of lands 63 are formed on a surface 59a of the board 59 and are brought into contact with the solder balls 47 attached to the electrodes 7 and 9.

When the semiconductor device 1 operates in the semiconductor unit 61, heat generated by the heating portion 29 of the semiconductor chip 3 is transmitted to the heat-dissipation pad 27 adjoining thereto, via which the heat is further transmitted to the lands 63 of the board 59 by way of the second wiring portion 15 and the heat-dissipation electrodes 9. Thus, it is possible to dissipate the heat of the semiconductor chip 3 to the exterior of the semiconductor device 1.

In the semiconductor device 1, the second wiring portion 15 used for heat dissipation is arranged in the center area of the surface 5a of the insulating layer 5 except the peripheral area in which the first wiring portions 11 and 13 connected with the pad electrodes 21, 23, and 25 are arranged, whereby it is possible to increase the area for the formation of the sheet 15b of the second wiring portion 15. In addition, the connection wiring portion 15c of the second wiring portion 15 and the heat-dissipation pad 27 are formed adjacent to the heating portion 29 of the semiconductor chip 3.

This allows the second wiring portion 15 to efficiently absorb the heat generated by the semiconductor chip 3 by way of the insulating layer 5 and the heat-dissipation pad 27. Thus, even though the semiconductor device 1 is constituted in the form of the WLCSP, it is possible to efficiently dissipate the heat of the semiconductor chip 3 towards the heat-dissipation electrodes 9.

The second wiring portion 15 and the molded resin 17 are mutually engaged with each other by means of the engagement portions 53. Therefore, even through the second wiring portion 15 and the molded resin 17 are composed of different materials having different coefficients of thermal expansion, the second wiring portion 15 is deformed to suit the thermal deformation of the molded resin 17. That is, even though the second wiring portion 15 is formed in a relatively large area on the surface 5a of the insulating layer 5, it is possible to prevent the second wiring portion 15 from separating from the molded resin 17 due to the thermal deformation of the molded resin 17. Thus, it is possible to improve the reliability of the semiconductor device 1.

The present embodiment can be realized using the conventional structure adapted to the semiconductor chip in which the pad electrodes 21, 23, and 25 and the heat-dissipation pad 27 are formed in the peripheral area of the surface 3a of the semiconductor chip 3, wherein the first wiring portions 11 and 13 are additionally formed in the peripheral area of the surface 5a of the insulating layer 5. This makes it possible to easily form the second wiring portion 15 on the surface 5a of the insulating layer 5 without changing the arrangement of the pad electrodes 21, 23, and 25 and the heat-dissipation pad 27 in the semiconductor chip 3. Thus, it is possible to reduce the manufacturing cost of the semiconductor device 1.

In the semiconductor device 1 and the semiconductor unit 61, it is possible to dissipate heat from the heat-dissipation electrodes 9, which are connected with the second wiring portion 15, to electronic circuits formed on the board 59. This allows the second wiring portion 15 to efficiently dissipate heat, absorbed from the semiconductor chip 3, to the exterior of the semiconductor device 1. That is, it is possible to improve the heat-dissipation efficiency with regard to the semiconductor device 1.

The present embodiment can be modified in a variety of ways, which will be described below.

Figure 6:
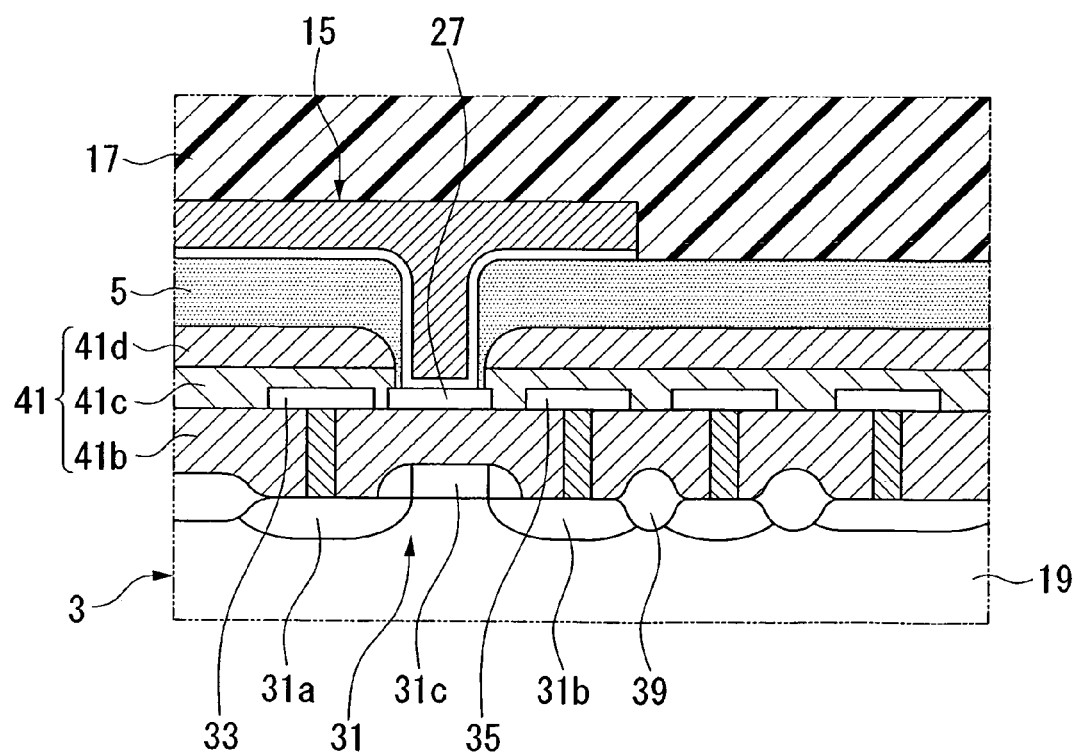
FIG. 6 is a cross sectional view showing a first modified example of the first embodiment in which a heat-dissipation pad is formed above a gate electrode of a transistor in a semiconductor chip.

In the present embodiment, the heat-dissipation pads 27 are electrically connected with the substrate 19 via wires. Of course, the heat-dissipation pads 27 are not necessarily connected with the substrate 19. For example, as shown in FIG. 6, it is possible to modify the present embodiment such that the heat-dissipation pad 27 is formed above the gate electrode 31c of the transistor 31. In this case, it is possible to further improve the heat-dissipation efficiency with regard to the semiconductor device 1 because the heat-dissipation pad 27 is arranged in proximity to the gate electrode 31c whose amount of heat is the highest compared with other components of the semiconductor chip 3.

It is possible to modify the present embodiment such that the heat-dissipation pad 27 is formed above the heat-dissipation diffusion region 37 of the substrate 19, wherein the heat-dissipation pad 27 is not electrically connected with the heat-dissipation diffusion region 37. Alternatively, it is possible to form the heat-dissipation pads 27 above the gate electrode 31c and the heat-dissipation diffusion region 37 respectively.

Figure 7:
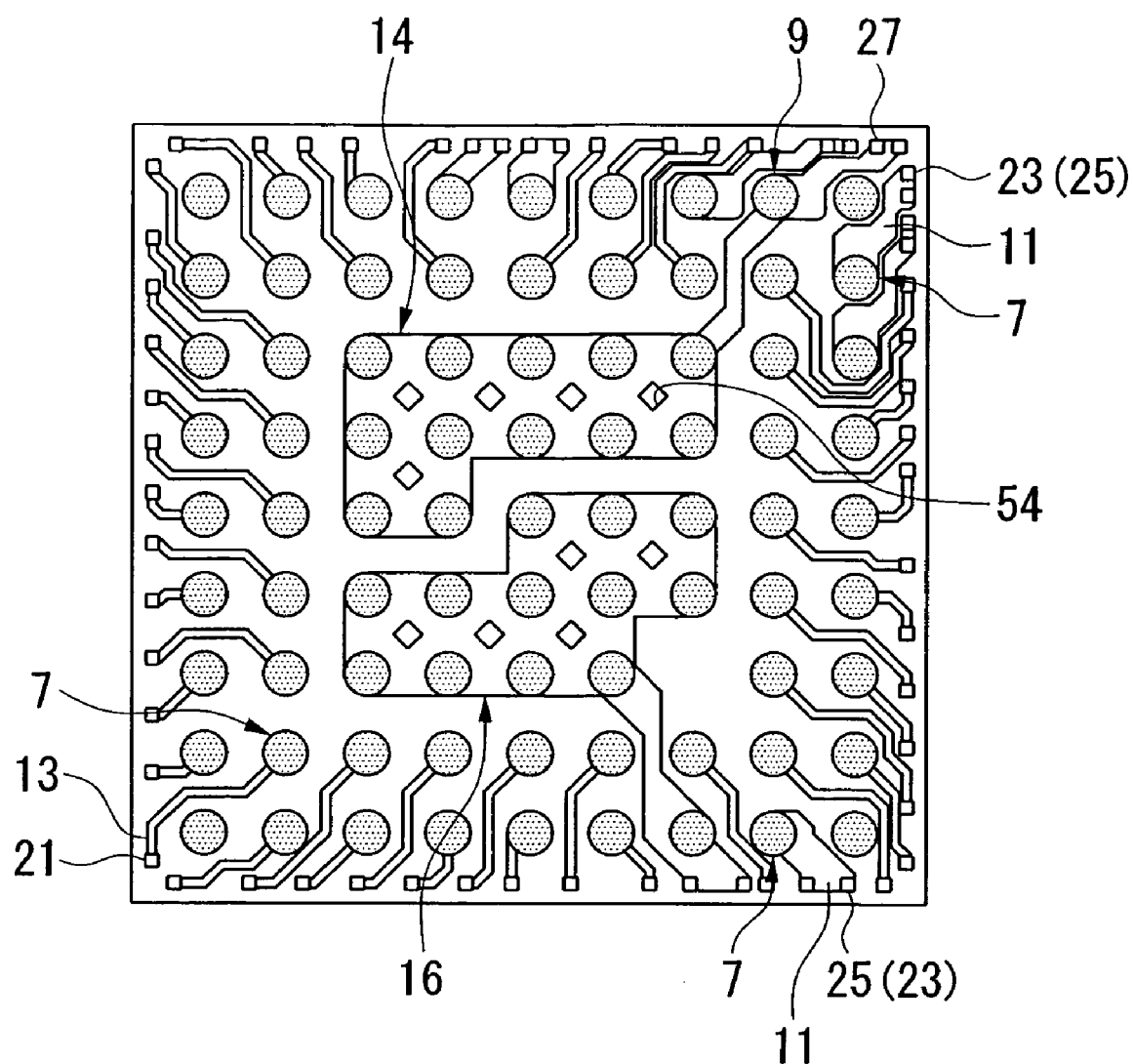
FIG. 7 is a plan view showing a second modified example of the first embodiment in which a plurality of second wiring layers are formed on the surface of an insulating layer.
Figure 8:
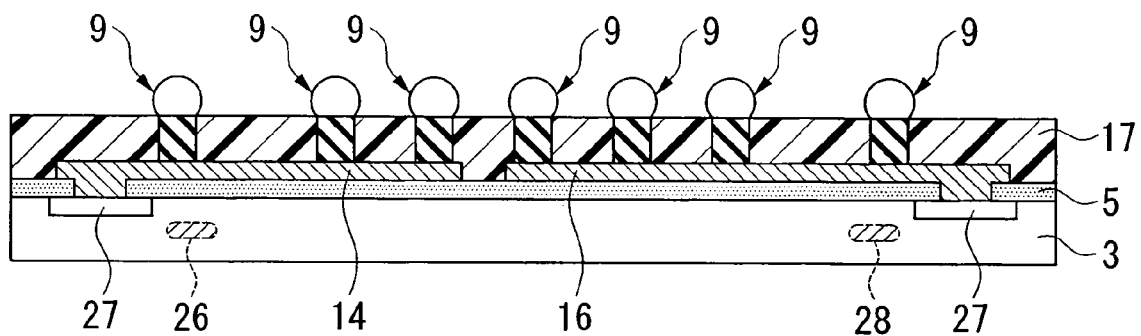
FIG. 8 is a cross sectional view showing the second modified example of the first embodiment shown in FIG. 7.

In the present embodiment, a single second wiring portion 15 is formed on the surface 5a of the insulating layer 5. When the semiconductor chip 3 includes a plurality of heating portions, it is possible to modify the present embodiment such that as shown in FIGS. 7 and 8, a plurality of second wiring portions (i.e., second wiring portions 14 and 16) are formed on the surface 5a of the insulating layer 5. In this case, the second wiring portions 14 and 16 are individually arranged in proximity to different heating portions 26 and 28; that is, they can efficiently absorb heat respectively generated by the heating portions 26 and 28.

In the above, the heat-dissipation pads 27 are arranged adjacent to the heating portions 26 and 28 and are respectively connected with the second wiring portions 14 and 16. The second wiring portions 14 and 16 are mutually insulated from each other; hence, it is possible to avoid occurrence of short-circuits between the heat-dissipation pads 27 with respect to electronic circuits of the semiconductor chip 3. Therefore, it is possible to avoid the occurrence of error and malfunction in the semiconductor device 1, which is thus improved in reliability.

Figure 9:
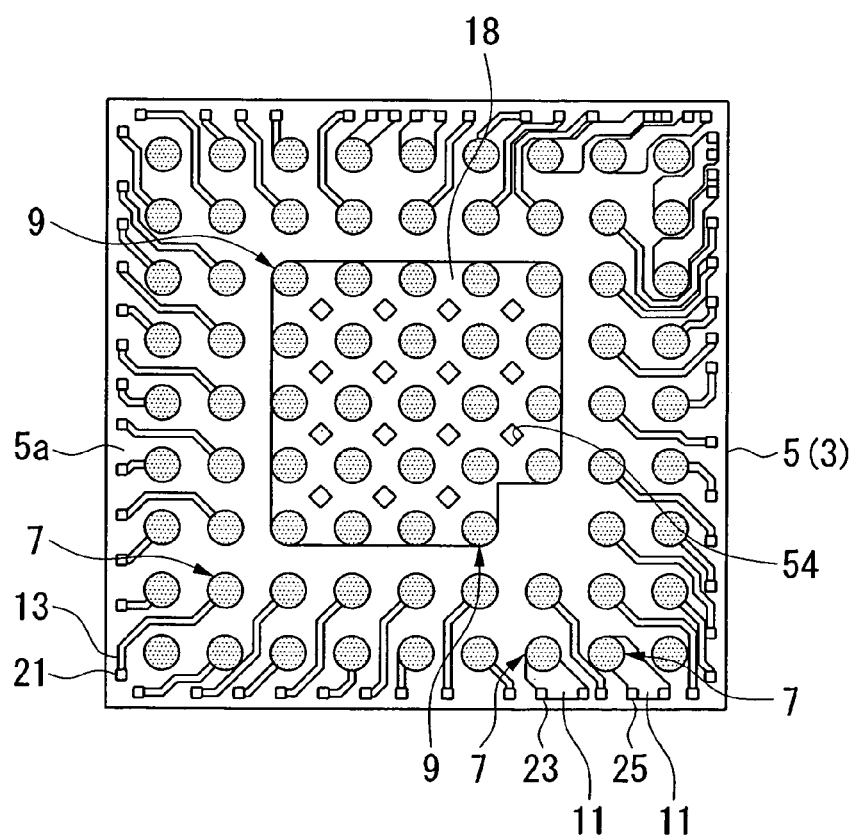
FIG. 9 is a plan view showing a third modified example of the first embodiment in which a second wiring portion is constituted by a sheet.
Figure 10:
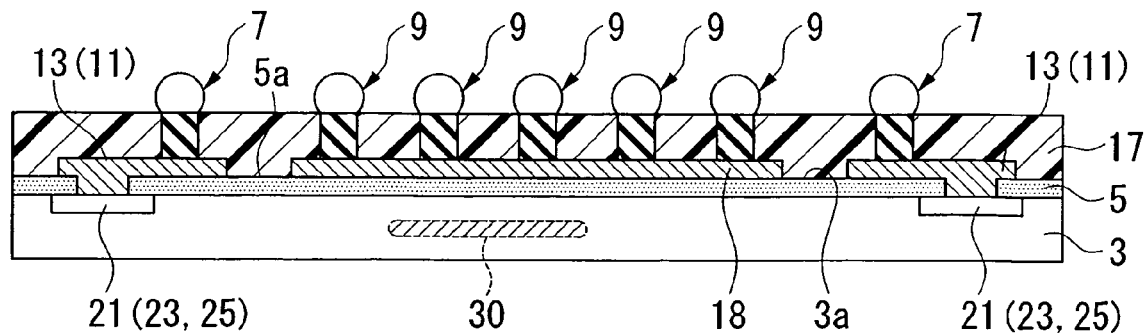
FIG. 10 is a cross sectional view showing the third modified example of the first embodiment shown in FIG. 9.

In the present embodiment, the second wiring portion 15 is constituted by the sheet 15b and the connection wiring portion 15c. When a heating portion 30 exists in the center area of the semiconductor chip 3, it is possible to modify the present embodiment such that as shown in FIGS. 9 and 10, a second wiring portion 18 is constituted by a sheet that is arranged to cover only the center area of the insulating layer 5. This allows the second wiring portion 18 to absorb heat generated by the heating portion 30 via the insulating layer 5.

In the present embodiment, the second wiring portion 15 is formed in the center area of the surface 5a of the insulating layer 5. Herein, the second wiring layer 15 is not necessarily formed in the center area but is formed to cover prescribed areas of the surface 5a of the insulating layer 5 except areas corresponding to the first wiring layers 11 and 13. When the pad electrodes 21, 23, and 25 and the heat-dissipation pads 27 are arranged in the center area of the semiconductor chip 3, it is possible to modify the present embodiment such that as shown in FIG. 11, first wiring portions 12 are formed in the center area of the insulating layer 5 inside of the pad electrodes 21, 23, and 25 and the heat-dissipation pads 27, and a second wiring layer 20 having a sheet-like shape is formed in the peripheral area of the insulating layer 5 outside of the pad electrodes 21, 23, and 25 and the heat-dissipation pads 27.

Figure 11:
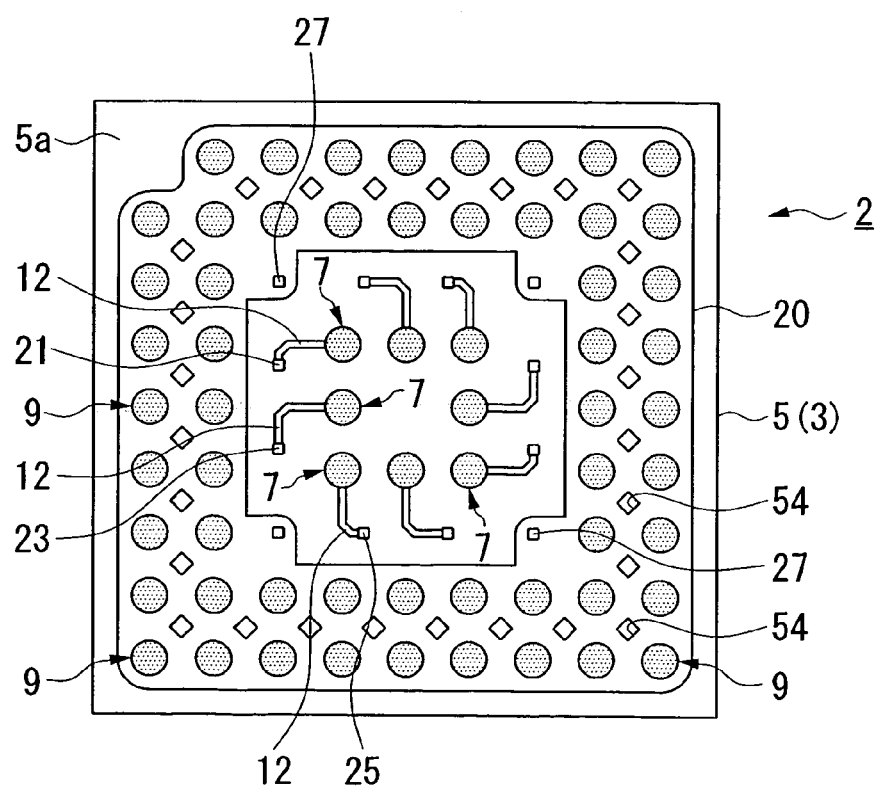
FIG. 11 is a plan view showing a fourth modified example of the first embodiment in which a first wiring portion is formed in the center area of an insulating layer, and a second wiring portion is formed in the peripheral area of the insulating layer.

According to a semiconductor device 2 shown in FIG. 11, even though the insulating layer 5 and the molded resin 17 are each subjected to thermal deformation, amounts of thermal deformation occurring in the center areas of the insulating layer 5 and the molded resin 17 are smaller than amounts of thermal deformation occurring in the peripheral areas of the insulating layer 5 and the molded resin 17. For this reason, an amount of thermal stress occurring on the first wiring portion 12 becomes smaller than an amount of thermal stress occurring on the second wiring layer 20. That is, even when the first wiring portion 12 is reduced in thickness, it is possible to avoid the occurrence of breaks of the first wiring layer 12 due to the thermal stress.

The second wiring portion 20 can be formed in a larger area on the surface 5a of the insulating layer 5 compared with the first wiring portion 12. This allows the second wiring layer 20 to adequately absorb a relatively large amount of thermal stress, which may be greater than that of the first wiring portion 12. Therefore, it is possible to avoid the occurrence of breaks of the second wiring portion 20 due to the thermal stress. Thus, it is possible to improve the reliability of the semiconductor device 2.

Figure 12:
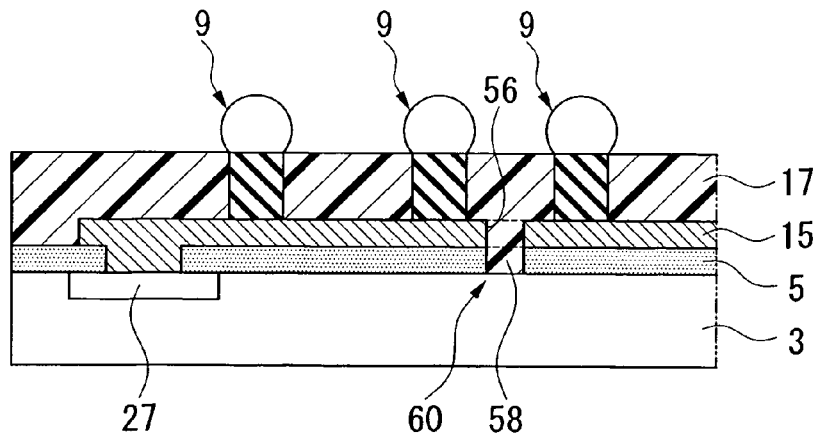
FIG. 12 is a cross sectional view showing a fifth modified example of the first embodiment, which is modified with regard to an engagement portion establishing mutual engagement between a second wiring portion and a molded resin.

In the present embodiment, the engagement portion 53 is constituted by the hole 54 formed in the second wiring portion 15 and the projection 51 formed in the molded resin 17. Herein, the engagement portion 53 is not necessarily constituted as described above but is necessarily constituted in the shape guaranteeing the mutual engagement between the second wiring portion 15 and the molded resin 17. That is, it is possible to modify the present embodiment such that as shown in FIG. 12, an engagement portion 60 is constituted by a hole 56, which is formed to penetrate through the second wiring portion 15 and the insulating layer 5, and a projection 58 of the molded resin 17, which engages with the hole 56. Alternatively, a projection is formed by the second wiring portion 15 and is directed towards the molded resin 17, which in turn provides a hollow engaging with the projection, thus forming an engagement portion.

Figure 13:
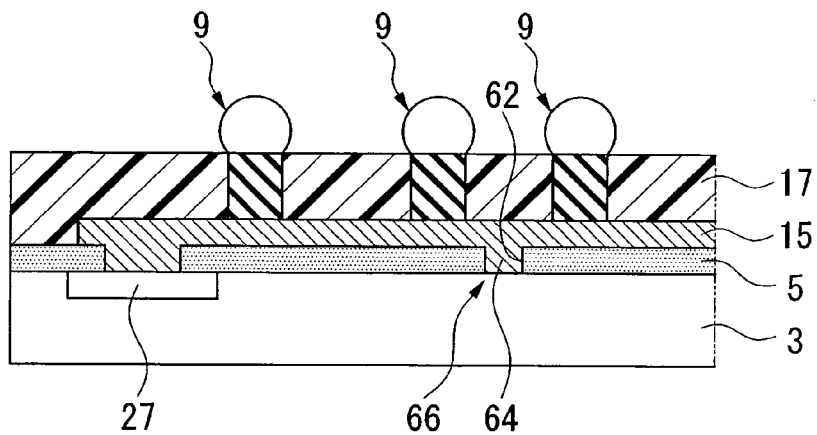
FIG. 13 is a cross sectional view showing a sixth modified example of the first embodiment, which is modified with regard to an engagement portion establishing mutual engagement between the second wiring portion and insulating layer.

The engagement is not necessarily realized by the engagement portions 53 and 60, which establish engagement between the second wiring portion 15 and the molded resin 17. It is possible to provide an engagement portion realizing mutual engagement between the second wiring portion 15 and the insulating layer 5. For example, as shown in FIG. 13, it is possible to provide an engagement portion 66 constituted by a hole 62, which is formed to penetrate through the insulating layer 5 in its thickness direction, and a projection 64, which is formed in the second wiring portion 15 so as to engage with the hole 62.

In the above, even though the second wiring portion 15 and the insulating layer 5 are composed of different materials having different coefficients of thermal expansion, the second wiring portion 15 is deformed to suit the thermal deformation of the insulating layer 5. This reliably prevents the second wiring portion 15 from separating from the insulating layer 5. Hence, it is possible to improve the reliability of the semiconductor device 1.

Figure 14:
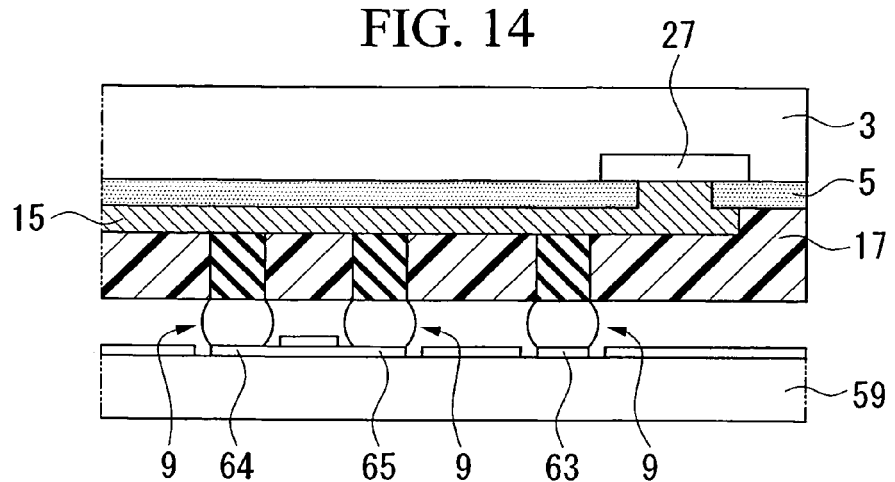
FIG. 14 is a cross sectional view showing a seventh modified example of the first embodiment, in which adjacent lands are integrally connected together on the board.

FIG. 5 shows that a plurality of lands 63 are formed on the board 59 within the semiconductor unit 61. It is possible to modify the present embodiment such that as shown in FIG. 14, lands 64 and 65 mutually adjoining each other are integrally connected together on the surface of the board 59.

The aforementioned modification allows heat, which is absorbed by the heat-dissipation electrode 9, to efficiently transmit from the land 64 to the other land 65. This realizes efficient heat dissipation in which heat generated by the semiconductor chip 3 is efficiently transmitted from the heat-dissipation electrode 9 to the board 59.

In the present embodiment, the electrodes 7 and 9 are each equipped with the posts 45 having cylindrical shapes, which are elongated from the surfaces 11a, 13a, and 15a of the wiring portions 11, 13, and 15 to the surface 17a of the molded resin 17. It is possible to modify the present embodiment such that without forming the posts 45, the solder balls 47 are directly attached onto the wiring portions 11, 13, and 15. This modification reduces the thickness of the molded resin 17 for enclosing the wiring portions 11, 13, and 15. Hence, it is possible to reduce the overall thickness of the semiconductor device 1.

Figure 15A:
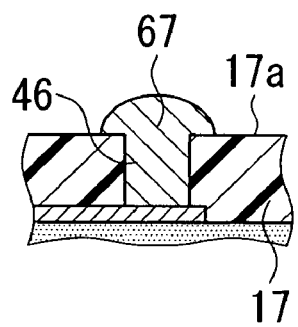
FIG. 15A is a cross sectional view showing a projection that is integrally formed together with a post, which is used for the formation of an electrode.
Figure 15B:
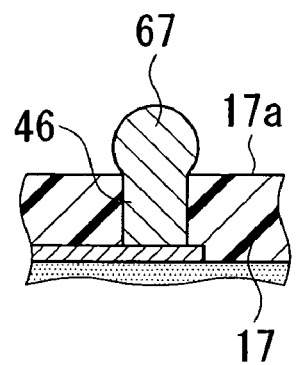
FIG. 15B is a cross sectional view showing the projection that is vertically extended.
Figure 15C:
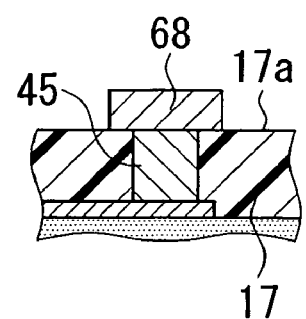
FIG. 15C is a cross sectional view showing a projection that is formed on a post, which is used for the formation of an electrode.

The electrodes 7 and 9 are not necessarily equipped with the solder balls 47 because it is merely required that at least prescribed parts of the electrodes 7 and 9 are projected above the surface 17a of the molded resin 17. For example, as shown in FIGS. 15A and 15B, a projection 67 projecting from the molded resin 17 can be formed integrally with a post 46. It is possible to use screen process printing realized by growth of plating and application of copper paste, for the formation of the projection 67. Alternatively, as shown in FIG. 15C, after the formation of the post 45 and the molded resin 17, resist patterning is performed so as to form a projection 68, having a rectangular shape in plan view, by growth of plating.

The electrodes 7 and 9 are not necessarily constituted by the posts 45 and 46, the solder balls 47, and the projections 67 and 68. That is, the electrodes 7 and 9 can be formed by use of the posts 45 and 46 only. In this case, when the semiconductor device 1 is mounted on the board 59, soldering is performed to establish electric connections between the posts 45 and 46 and electronic circuits of the board 59.

2. Second Embodiment

Figure 16:
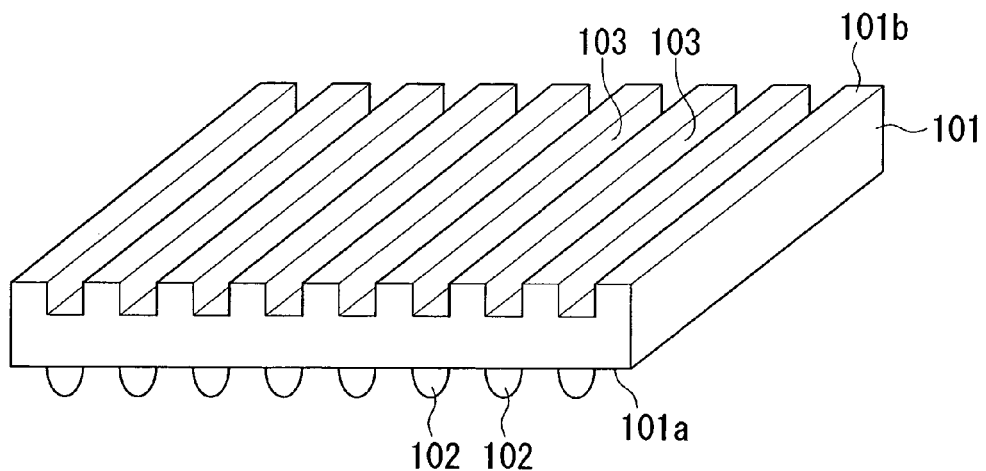
FIG. 16 is a perspective view showing the exterior appearance of a wafer level chip size package (WLCSP) in accordance with a second embodiment of the invention.
Figure 17:
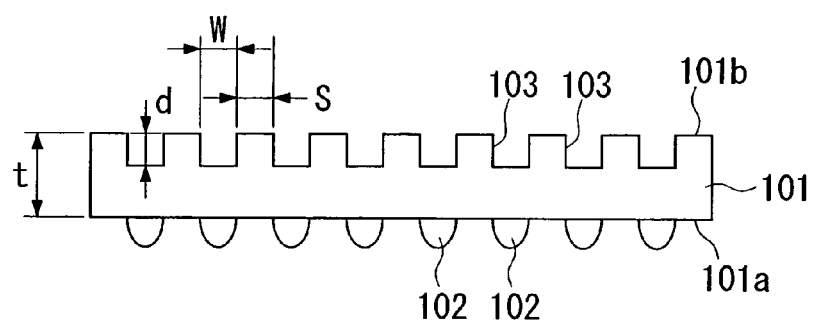
FIG. 17 is a front view of the WLCSP of the second embodiment.
Figure 18:
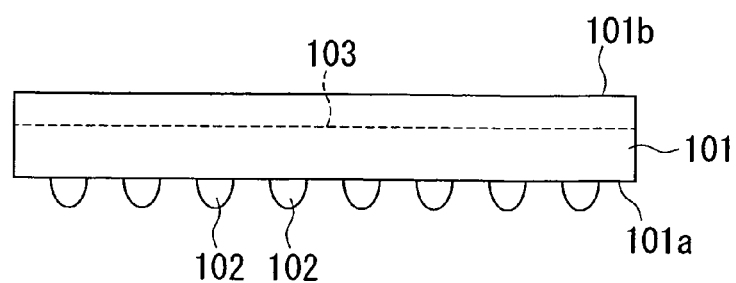
FIG. 18 is a side view of the WLCSP of the second embodiment.

FIG. 16 is a perspective view showing the exterior appearance of a wafer level chip size package (WLCSP) in accordance with a second embodiment of the invention. FIG. 17 is a front view of the WLSCP; and FIG. 18 is a side view of the WLCSP. Reference numeral 101 designates a silicon substrate (or a semiconductor substrate) having a rectangular shape in plan view, on which integrated circuits (or electronic circuits, not shown) are formed. Reference numerals 102 designate metal pads realizing connections with external devices, which are arranged in a rectangular formation along the peripheral portion of a prescribed surface 101a of the silicon substrate 101 and each of which has a semi-elliptical shape in cross section. Reference numerals 103 designate channels, which are formed in parallel with each other on a backside surface 101b opposite to the prescribed surface 101a and each of which has a rectangular shape in cross section. As shown in FIG. 17, the channels 103 are each defined in dimensions using depth 'd' and width 'w' as well as distance 's' therebetween.

As the channels 103 are each made deeper in depth d, it is possible to increase the overall area of the backside surface 101b; however, when the depth d is increased so much, the rigidity of the silicon substrate 101 should be degraded. Therefore, it is preferable that the depth d ranges from 20% to 50% the thickness t of the silicon substrate 101.

For example, when the silicon substrate 101 has a square shape whose length is 5 mm and whose thickness t is 500 μm, the depth d of the channel 103 ranges from 100 μm to 250 μm, preferably, it is set into the range of 150 μm+30 μm. The width w ranges from 200 μm to 500 μm, and preferably, it is set into the range of 250 µm±25 µm. The distance s between adjacent channels 103 ranges from 200 µm to 500 µm, preferably, it is set into the range of 250 µm±25 µm.

According to the aforementioned dimensions, it is possible to form five to ten channels 103 on the silicon substrate 101.

In the manufacture of the WLCSP, integrated circuits (and other components such as sensors as necessary) are formed on the prescribed surface 101*a* of the silicon substrate 101, and bumps (not shown) used for the formation of the metal pads 102 are formed in the peripheral portion of the prescribed surface 101*a*. A passivation film is formed on the prescribed surface 101*a* except the bumps so as to protect integrated circuits and other components.

Then, a cutting machine such as a grinder is used to form the channels 103 on the backside surface 101*b* of the silicon substrate 101. Thus, it is possible to produce the WLCSP.

In the WLCSP of the present embodiment in which a plurality of channels 103 are formed in parallel with each other on the backside surface 101*b* opposite to the prescribed surface 101*a* of the silicon substrate 101, it is possible to increase the overall area of the backside surface 101*b* without increasing the effective area of the semiconductor substrate 101. This improves heat dissipation characteristics of the WLCSP.

In addition, the WLCSP of the present embodiment is manufactured such that a cutting machine such as a grinder is used to form the channels 103 on the backside surface 101*b* of the silicon substrate 101. That is, the channels 103 are formed using a simple and inexpensive machine, which does not increase the manufacturing cost.

The present embodiment can be modified in a variety of ways, which will be described below.

(a) First Modified Example

Figure 19:
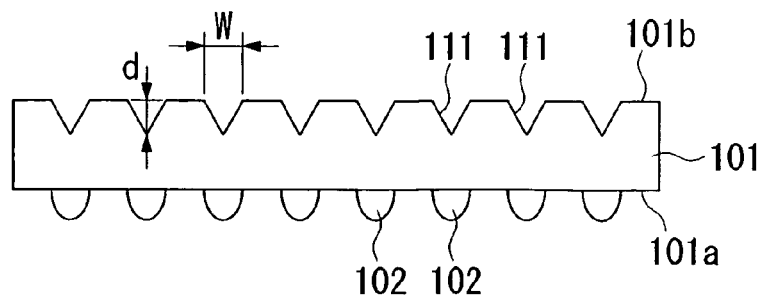
FIG. 19 is a front view showing a first modified example of the WLCSP.

FIG. 19 is a front view showing a wafer level chip size package (WLCSP) in accordance with a first modified example of the present embodiment. Compared with the aforementioned WLCSP shown in FIG. 17 in which the channels 103 are formed using a cutting machine such as a grinder so that they have rectangular shapes in cross section, the WLCSP shown in FIG. 19 is characterized in that anisotropic etching is performed along crystal planes of the silicon substrate 101, whereby channels 111 each having a triangular shape in cross section are formed on the backside surface 101*b*.

In order to realize heat dissipation characteristics substantially identical to those of the aforementioned WLCSP, it is necessary to appropriately adjust dimensions of the channels 111 each having a triangular shape in cross section, which is defined by width 'w' and depth 'd'.

The width w and depth d can be adjusted by appropriately changing the composition of an etching solution and conditions of anisotropic etching.

For example, a silicon dioxide film is formed to partially cover the backside surface 101*b* opposite to the prescribed surface 101*a* of the silicon substrate 101, wherein prescribed parts of the silicon substrate 101, which are not covered with the silicon dioxide, are subjected to etching at 90° C.

As a result, the WLCSP of the first modified example can demonstrate prescribed effects substantially identical to those of the aforementioned WLCSP.

(b) Second Modified Example

Figure 20:
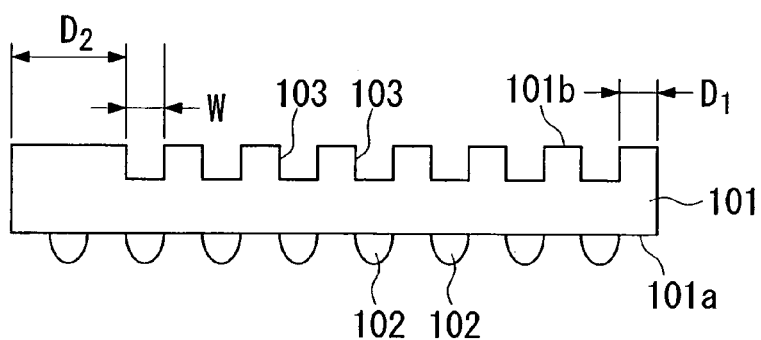
FIG. 20 is a front view showing a second modified example of the WLCSP.

FIG. 20 is a front view showing a wafer level chip size package (WLCSP) in accordance with a second modified example of the present embodiment. Compared with the aforementioned WLCSP shown in FIG. 17 in which the same distance is arranged with respect to the outermost channels 103 that are formed in proximity to both ends of the silicon substrate 101, the WLCSP shown in FIG. 20 is characterized in that a distance $D_1$ measured between the rightmost channel 103 and the right end of the silicon substrate 101 differs from a distance $D_2$ measured between the leftmost channel 103 and the left end of the silicon substrate 101.

The WLCSP of the second modified example can demonstrate prescribed effects substantially identical to those of the aforementioned WLCSP.

The structural feature of the WLCSP, in which the distance $D_1$ between the rightmost channel 103 and the right end of the substrate 101 differs from the distance $D_2$ between the leftmost channel 103 and the left end of the substrate 101, makes it possible to easily discriminate the direction of the backside surface 101*b* by use of a semiconductor laser for detecting the difference between the distances $D_1$ and $D_2$.

(c) Third Modified Example

Figure 21:
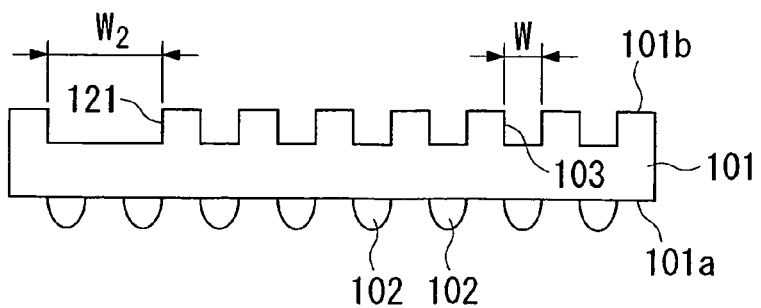
FIG. 21 is a front view showing a third modified example of the WLCSP.

FIG. 21 is a front view showing a wafer level chip size package (WLCSP) in accordance with a third modified example of the present embodiment. Compared with the aforementioned WLCSP shown in FIG. 17 in which all the channels 103 have the same width w, the WLCSP shown in FIG. 21 is characterized in that a leftmost channel 121, which is formed in proximity to the left end of the substrate 101, has a width $w_2$, which differs from the width w of the other channels 103.

The WLCSP of the third modified example can demonstrate prescribed effects substantially identical to those of the aforementioned WLCSP.

The structural feature of the WLCSP, in which the leftmost channel 121 has the width $w_2$ that differs from the width w of the other channels 103, makes it possible to easily discriminate the direction of the backside surface 101*b* by use of a semiconductor laser for detecting the difference between the widths w and $w_2$.

(d) Fourth Modified Example

Figure 22:
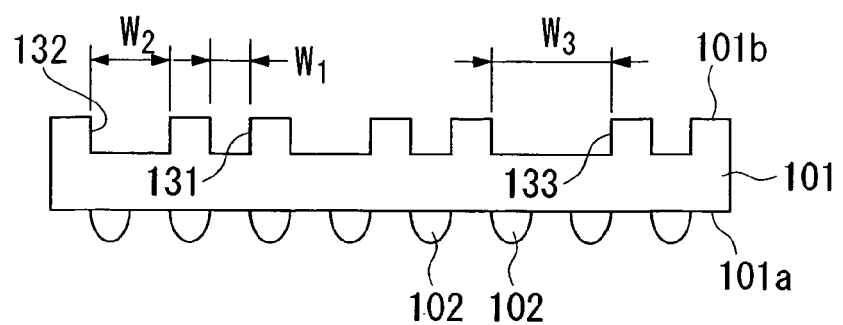
FIG. 22 is a front view showing a fourth modified example of the WLCSP.

FIG. 22 is a front view showing a wafer level chip size package (WLCSP) in accordance with a fourth modified example of the present embodiment. Compared with the aforementioned WLCSP shown in FIG. 17 in which all the channels 103 have the same width w, the WLCSP shown in FIG. 22 is characterized in that plural types of channels 131-133 having different widths are formed with prescribed distances therebetween. That is, the arrangement of the channels 131-133 may serve as a bar code realizing an information identification function.

Specifically, the channels 131, 132, and 133 have widths $w_1$, $w_2$, and $W_3$ respectively, wherein they are arranged in accordance with a prescribed rule so as to serve as a bar code realizing an information identification function.

The WLCSP of the fourth modified example can demonstrate prescribed effects substantially identical to those of the aforementioned WLCSP.

The structural feature of the WLCSP, in which three types of channels 131-133 having different widths are arranged in accordance with a prescribed rule, makes it possible to easily discriminate the direction of the backside surface 101*b* by use of a semiconductor laser for detecting the differences between the widths $w_1$ to $W_3$. That is, it is possible to easily read individual identifications applied to WLCSPs by use of a semiconductor laser for detecting the overall shape of the WLCSP including the channels 131-133. In addition, it is possible to easily identify and manage WLCSPs, and it is possible to easily identify and manage chips installed in WLCSPs.

It is possible to further modify the WLCSP shown in FIG. 22, in which three types of channels 131-133 having different widths are arranged in accordance with a prescribed rule, in such a way that all the channels 131-133 have the same width but they are formed with different distances therebetween, wherein it is also possible to realize identification information by use of the channels 131-133.

In the further modification described above, it is possible to read the identification information realized by the channels 131-133 by use of a semiconductor laser for detecting differences of distances between the channels 131-133.

(e) Fifth Modified Example

Figure 23:
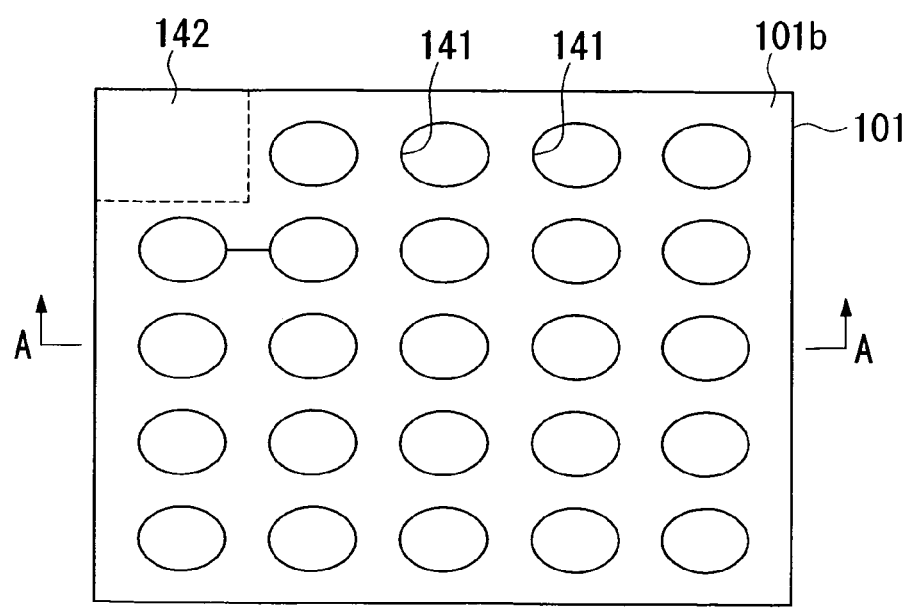
FIG. 23 is a plan view showing a fifth modified example of the WLCSP.
Figure 24:
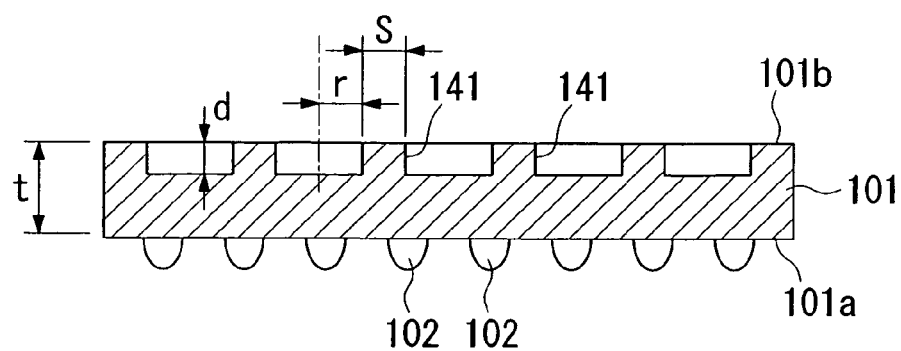
FIG. 24 is a cross sectional view taken along line A-A in FIG. 23.

FIG. 23 is a plan view showing a wafer level chip size package (WLCSP) in accordance with a fifth modified example of the present embodiment; and FIG. 24 is a cross sectional view taken along line A-A in FIG. 23. Compared with the aforementioned WLCSP in which a plurality of channels 103 are formed in parallel with each other on the backside surface 101b of the silicon substrate 101, the WLCSP shown in FIGS. 23 and 24 are characterized in that a plurality of holes 141 each having the same depth 'd' and the same radius 'r' are formed in a matrix form with the same distance 's' therebetween on the backside surface 101b of the silicon substrate 101, wherein no hole is formed in a prescribed corner area 142, which is thus made planar.

It is preferable that the depth d of the hole 141 ranges from 20% to 50% the thickness t of the silicon substrate 101.

For example, when the silicon substrate 101 has a square shape whose length is 5 mm and whose thickness t is 500 μm, the depth d of the hole 141 ranges from 100 μm to 250 μm, preferably, it is set into the range of 180 μm±30 μm. The radius r ranges from 200 μm to 300 μm, preferably, it is set into the range of 250 μm±25 μm. The distance between the adjacent holes 141 ranges from 100 μm to 200 μm, preferably, it is set into the range of 250 μm±25 μm.

According to the aforementioned dimensions set to the holes 141, it is possible to form five to ten holes on the backside surface 101b.

In the manufacture of the WLCSP, integrated circuits (and other components such as sensors as necessary) are formed on the prescribed surface 101a of the silicon substrate 101, and bumps (not shown) used for the formation of metal pads 102 are formed in the peripheral portion of the prescribed surface 101a. A passivation film is formed on the prescribed surface 101a except the bumps so as to protect integrated circuits and other components.

Then, the backside surface 101b of the silicon substrate 101 is subjected to the known photolithography, wherein it is coated with a photosensitive resin and is then subjected to patterning, thus forming a mask composed of the photosensitive resin. Thereafter, the backside surface 101b of the silicon substrate 101 is subjected to isotropic etching or anisotropic etching so as to form the holes 141.

In the above, it is possible to use any one of dry etching or wet etching. As similar to the aforementioned WLCSP shown in FIGS. 16-18, it is possible to form the holes 141 by use of a cutting machine without performing etching.

The WLCSP of the fifth modified example can demonstrate prescribed effects substantially identical to those of the aforementioned WLCSP.

The structural feature of the WLCSP, in which no hole is formed in the planar corner area 142 corresponding to one corner of the backside surface 101b of the silicon substrate 101, makes it possible to discriminate the direction of the backside surface 101b by use of a semiconductor laser for detecting the location of the planar corner area 142.

It is possible to further modify the WLCSP, in which a plurality of holes 141 each having the same radius are formed in a matrix form, in such a way that a plurality of holes having different radiuses are formed in a matrix form.

In the above, identification information can be applied to the arrangement of holes having different radiuses. That is, the identification information applied to the WLCSP can be read by use of a semiconductor laser for detecting differences of radiuses between holes.

(f) Sixth Modified Example

Figure 25:
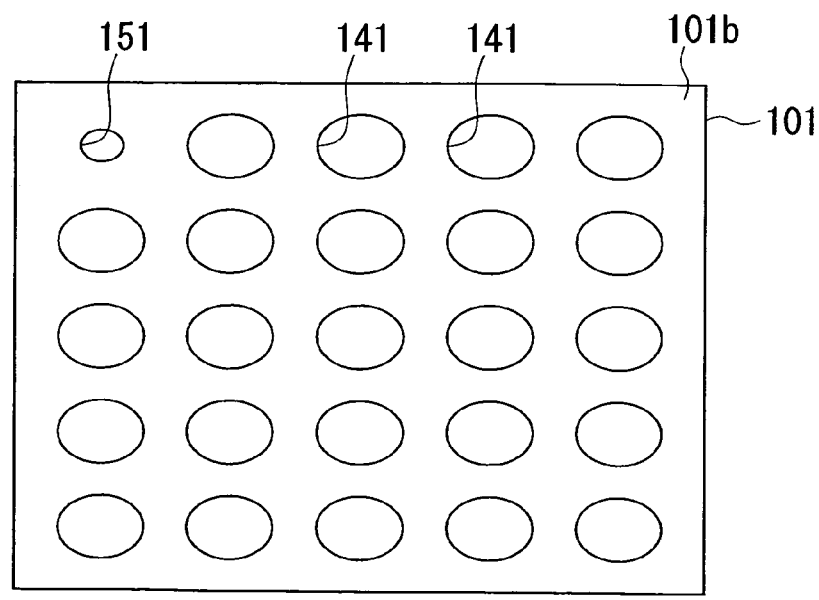
FIG. 25 is a plan view showing a sixth modified example of the WLCSP.

FIG. 25 is a plan view showing a wafer level chip size package (WLCSP) in accordance with a sixth modified example of the present embodiment. Compared with the WLCSP of the fifth modified example in which no hole is formed in the planar corner area 142 corresponding to one corner of the backside surface 101b of the silicon substrate 101, the WLCSP shown in FIG. 25 is characterized in that a hole 151 whose radius differs from the radius of the other holes 141 is formed in one corner of the backside surface 101b of the silicon substrate 101.

The WLCSP of the sixth modified example can demonstrate prescribed effects substantially identical to those of the WLCSP of the fifth modified example.

As described above, the second embodiment and its modified examples have a simple structure in which hollows such as the channels 103, 111, 121, and 131-133, and the holes 141 are appropriately formed for the purpose of heat dissipation on the backside surface 101b opposite to the prescribed surface 101a of the silicon substrate 101 in which integrated circuits are formed. Such a simple structure can be applied to any types of packages other than WLCSP, such as CSP and BGA (i.e., ball grid array), and to any other type of semiconductor chip as well.

3. Third Embodiment

Figure 26:
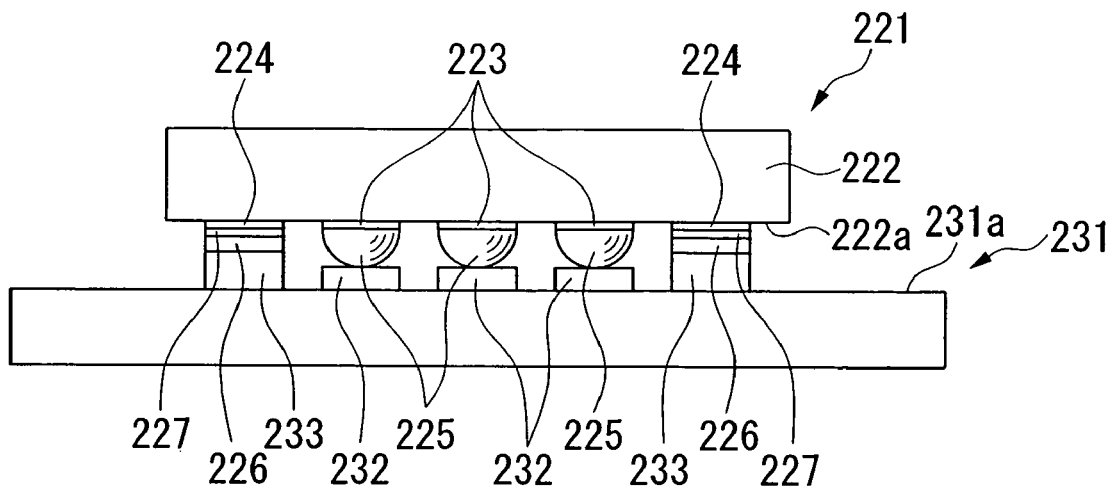
FIG. 26 is a side view showing a wafer level chip size package (WLCSP) that is mounted on a printed-circuit board in accordance with a third embodiment of the invention.
Figure 27:
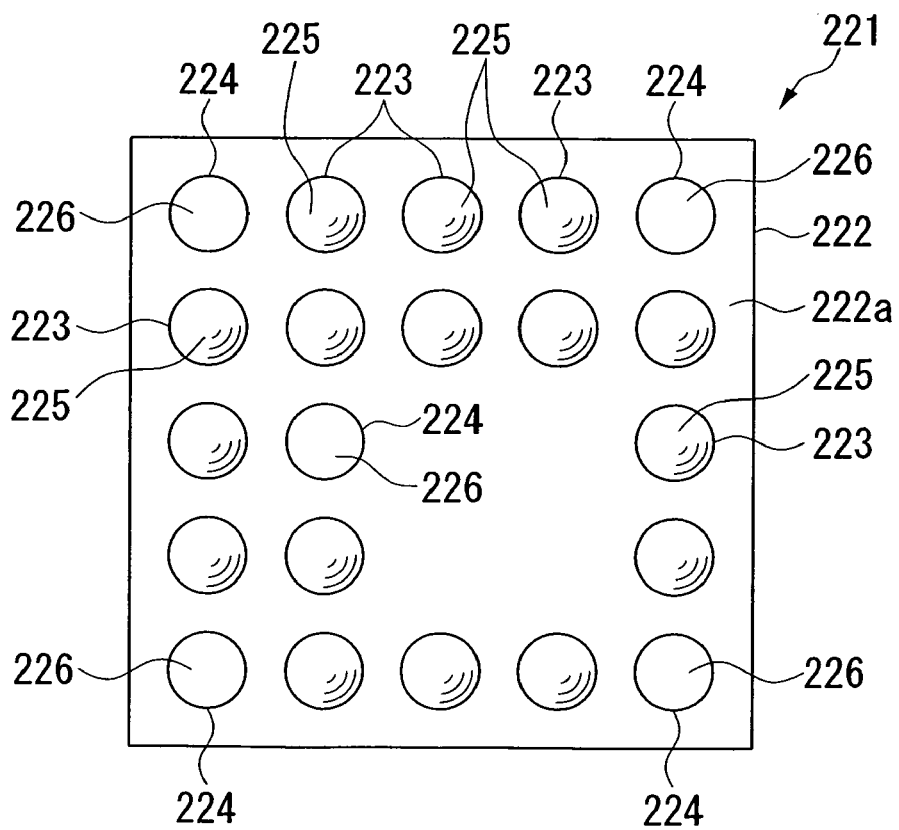
FIG. 27 is a plan view showing a prescribed surface of the WLCSP.
Figure 28:
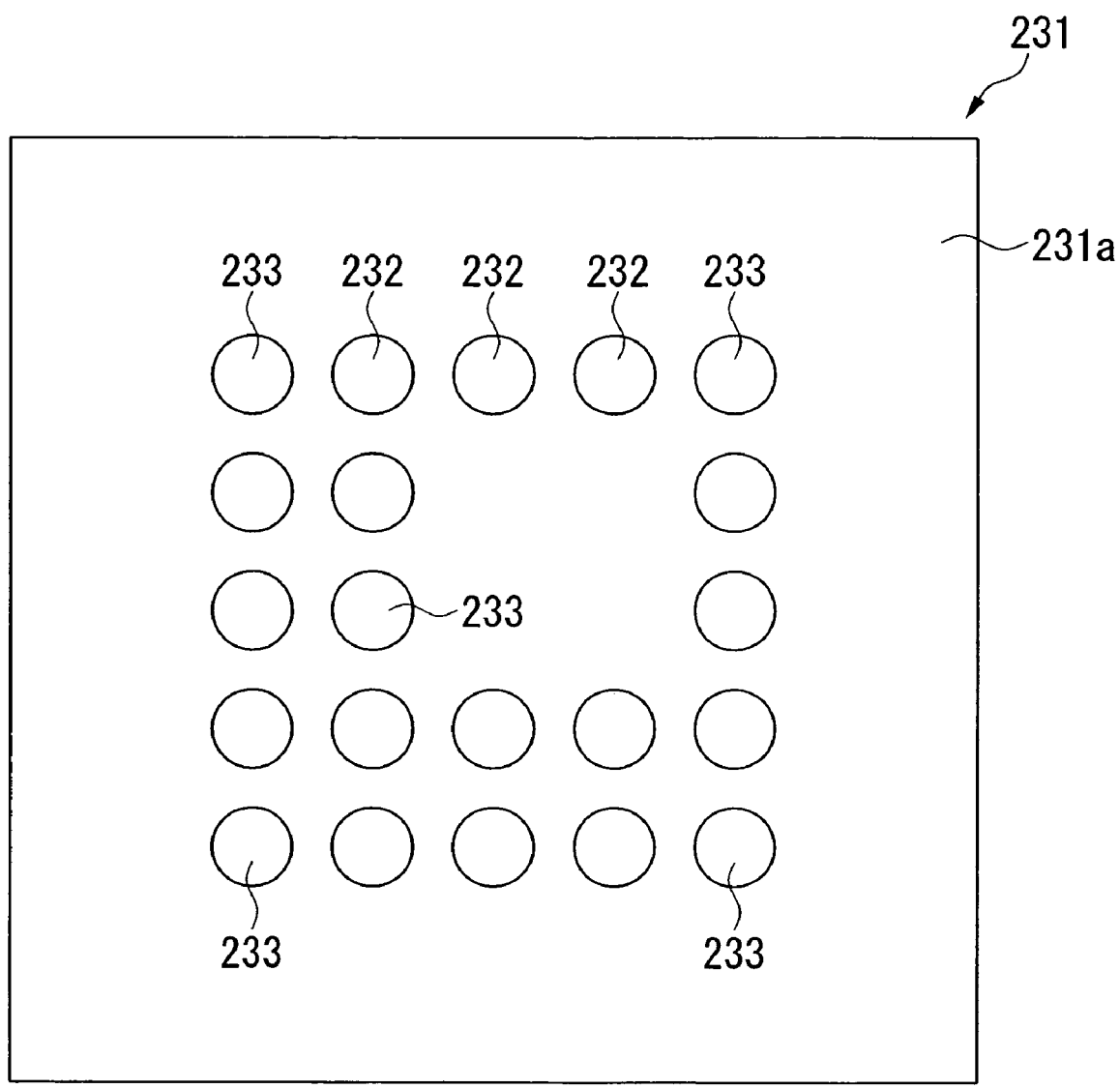
FIG. 28 is a plan view showing a prescribed surface of the printed-circuit board, which is arranged to directly face with the prescribed surface of the WLCSP.

FIG. 26 is a side view showing a wafer level chip size package (WLCSP) that is mounted on a printed-circuit board in accordance with a third embodiment of the invention; FIG. 27 is a plan view showing a prescribed surface of the WLCSP; and FIG. 28 is a plan view showing a prescribed surface of the printed-circuit board.

A WLCSP 221 includes a silicon substrate (or a semiconductor substrate) 222 having a rectangular shape in plan view, in which integrated circuits (or electronic circuits, not shown) are formed. Connection pins (serving as first terminals) 223, which are composed of conductive materials such as copper (Cu) and aluminum (Al) so as to establish electric connections with external devices, are arranged at selected points of the grid on a prescribed surface 222a of the silicon substrate 222. Non-connection pins (serving as second terminals) 224, which are not electrically connected with external devices, are arranged at other selected positions of the grid not overlapping the positions of the connection pins 223. Solder balls 225 are affixed onto the connection pins 223. Magnetic materials 226 each having a disk-like shape is bonded onto the non-connection pins 224 via adhesives 227.

The WLCSP 221 of the present embodiment is designed such that the uniform bonding intensity is applied to all pins on the prescribed surface 222a when mounted onto the printed-circuit board, wherein the non-connection pins 224, which do not at all relate to electric connections with the printed circuit board, are arranged in addition to the connection pins 223, whereby it is possible to establish an appropriate balance regarding the bonding intensity in electric connections with respect to the overall area of the prescribed surface 222a.

In order to realize the substantially same magnetic force by the magnetic materials 226, the non-connection pins 224 joining the magnetic materials 226 are arranged at five positions, that is, four corners of the prescribed surface 222a and approximately the center of the prescribed surface 222a. That is, the magnetic materials 226 are arranged symmetrical to each other with respect to the center axis of the prescribed surface 222a.

A printed-circuit board (simply referred to as a board) 231 has a prescribed surface 231a, which is arranged to directly face the prescribed surface 222a of the WLCSP 221. Herein, electrode patterns 232 are arranged at selected positions of the prescribed surface 231a of the board 231 in correspondence with the connection pins 223 of the WLCSP 221; and magnetic materials 233 are arranged at other selected positions of the prescribed surface 231a of the board 231 in correspondence with the non-connection pins 224 of the WLCSP 221.

As the magnetic materials 226 and 233, it is possible to use one of ferromagnetic materials and weak or soft magnetic materials.

As ferromagnetic materials, it is preferable to use one element selected from among prescribed elements such as iron (Fe), cobalt (Co), nickel (Ni), gadolinium (Gd), terbium (Tb), dysprosium (Dy), holmium (Ho), erbium (Er), and thulium (Tm); or it is preferable to use an alloy composed of two or more elements selected from among the prescribed elements.

As weak magnetic materials, it is preferable to use iron (Fe), cobalt iron (Fe—Co alloy), nickel iron (Fe—Ni alloy), and silicon iron (Fe—Si alloy), for example.

As materials for the solder balls 225, it is preferable to use eutectic solder composed of Sn of 63 weight percent and Pb of 37 weight percent, solder composed of Sn of 60 weight percent and Pb of 40 weight percent, high temperature solder composed of Pb of 95 weight percent and Sn of 5 weight percent, and high temperature solder composed of Sn of 95 weight percent and Sb of 5 weight percent, for example. Other than the aforementioned solder materials, it is possible to use Pb-free solders mainly composed of Ag, Sb, and In.

Thus, magnetic forces are applied between the WLCSP 221 and the board 231 so that the magnetic materials 226, which are arranged at five positions corresponding to four corners and the center of the prescribed surface 222a, attract the magnetic materials 233, which are arranged on the prescribed surface 231a in correspondence with the magnetic materials 226, whereby it is possible to fix the WLCSP 221 onto the prescribed surface 231a of the board 231 with prescribed positioning.

Next, the method how to precisely mount the WLCSP 221 onto the board 231 will be described.

First, the solder balls 225 are arranged on the connection pins 223 of the WLCSP 221 respectively and are then subjected to heating, so that the solder balls 225 are fixedly adhered to the connection pins 223 respectively. In addition, the magnetic materials 226 are respectively attached onto the non-connection pins 224 via the adhesives 227.

The electrode patterns 232 are arranged at selected positions on the prescribed surface 231a of the board 231 in correspondence with the connection pins 223 of the WLCSP 221. The magnetic materials 233 are arranged at other selected positions on the prescribed surface 231a of the board 231 in correspondence with the non-connection pins 224 of the WLCSP 221. When either the magnetic materials 226 or the magnetic materials 233 are composed of ferromagnetic materials, it is unnecessary to apply magnetic fields from the exterior. When both of the magnetic materials 226 and the magnetic materials 233 are composed of weak magnetic materials, it is necessary to magnetize either the magnetic materials 226 or the magnetic materials 233.

Next, the WLCSP 221 is arranged above the board 231 in such a way that the prescribed surface 222a directly faces the prescribed surface 231a. When the WLCSP 221 is brought into close contact with the board 231, the magnetic materials 226 and the magnetic materials 233 mutually attract each other due to magnetic forces thereof, so that the magnetic materials 226 come in close contact with the magnetic materials 233, whereby the magnetic materials 226 and the magnetic materials 233 are fixed together in positioning.

The aforementioned assembly constituted by the WLCSP 221 and the board 231 is put into a solder reflow furnace or a heat treatment furnace, in which it is heated at a prescribed temperature for a prescribed time, so that the solder balls 225 are melted so as to establish electric connections between the connection pins 223 and the electrode patterns 232. During the heating and melting, the magnetic materials 226 and the magnetic materials 233 are fixed together in positioning due to magnetic forces thereof; hence, even when the solder balls 225 are melted, it is not likely that positional deviations occur between the connection pins 223 and the electrode patterns 232.

In the aforementioned structure adapted to the WLCSP 221 and the board 231, which are assembled together, the magnetic materials 226 respectively join the non-connection pins 224 on the prescribed surface 222a of the WLCSP 221, and the magnetic materials 233 are arranged at selected positions on the prescribed surface 231a of the board 231 in correspondence with the non-connection pins 224, so that the magnetic materials 226 of the WLCSP 221 fixedly join the magnetic materials 233 of the board 231 in positioning due to magnetic forces. Hence, it is possible to easily establish fixed positioning between the WLCSP 221 and the board 231. Compared with the conventional method in which packages join boards by use of sockets, the present embodiment is advantageous in that the WLCSP 221 can be easily attach to and detach from the board 231.

As described above, the magnetic materials 226 and 233 have positioning functions; therefore, it is possible to easily establish positioning and fixation between the WLCSP 221 and the board 231 by use of the magnetic materials 226 and 233. This eliminates the necessity of adjusting positioning between the WLCSP 221 and the board 231.

The present embodiment can be modified in a variety of ways, which will be described below.

(a) First Modified Example

Figure 29:
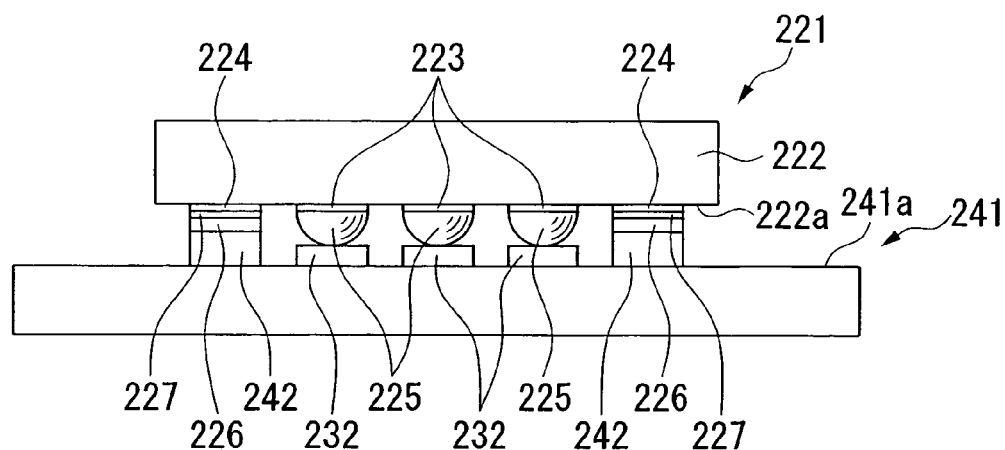
FIG. 29 is a side view showing a WLCSP attached onto a board in accordance with a first modified example of the third embodiment.
Figure 30:
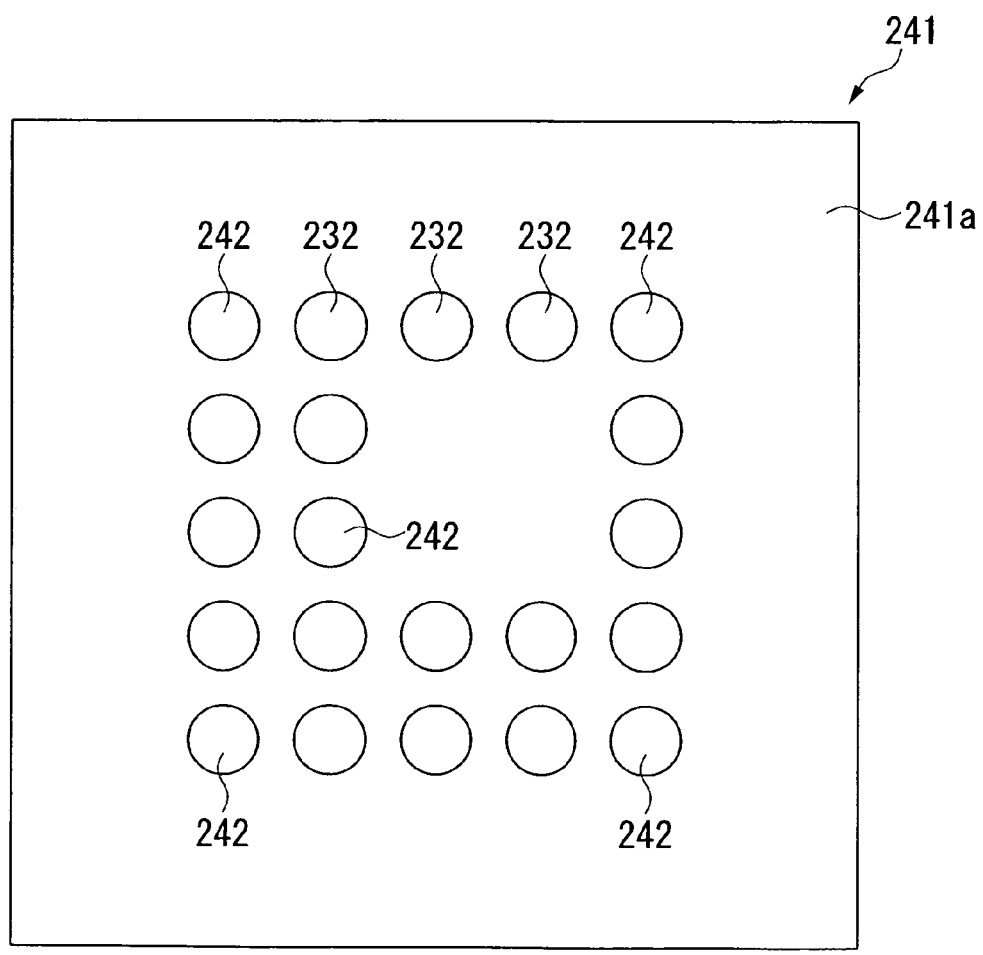
FIG. 30 is a plan view showing the board used in the first modified example of the third embodiment.

FIG. 29 is a side view showing a wafer level chip size package (WLCSP) that is attached onto a printed-circuit board in accordance with a first modified example of the present embodiment; and FIG. 30 is a plan view showing a prescribed surface of the printed-circuit board, which directly faces a prescribed surface of the WLCSP. Compared with the board 231 using the magnetic materials 233 shown in FIG. 28, a board 241 shown in FIG. 30 is characterized in that a plurality of permanent magnets 242 are substituted for the magnetic materials 233 and are attached onto a prescribed surface 241a.

The permanent magnets 242 are arranged at five positions corresponding to four corners and the center of the prescribed surface 241a of the board 241, wherein they attract the magnetic materials 226 attached to the prescribed surface 222a of the WLCSP 221, so that the magnetic materials 226 come in close contact with the permanent magnets 242 so as to establish fixed positioning therebetween.

The method how to precisely mount the WLCSP 221 onto the board 241 is identical to the aforementioned method that is described in conjunction with the present embodiment.

The first modified example can demonstrate prescribed effects and operations identical to those of the present embodiment.

Since the permanent magnets 242 are substituted for the magnetic materials 233, it is unnecessary to magnetize the board 241 in an external magnetic field.

(b) Second Modified Example

Figure 31:
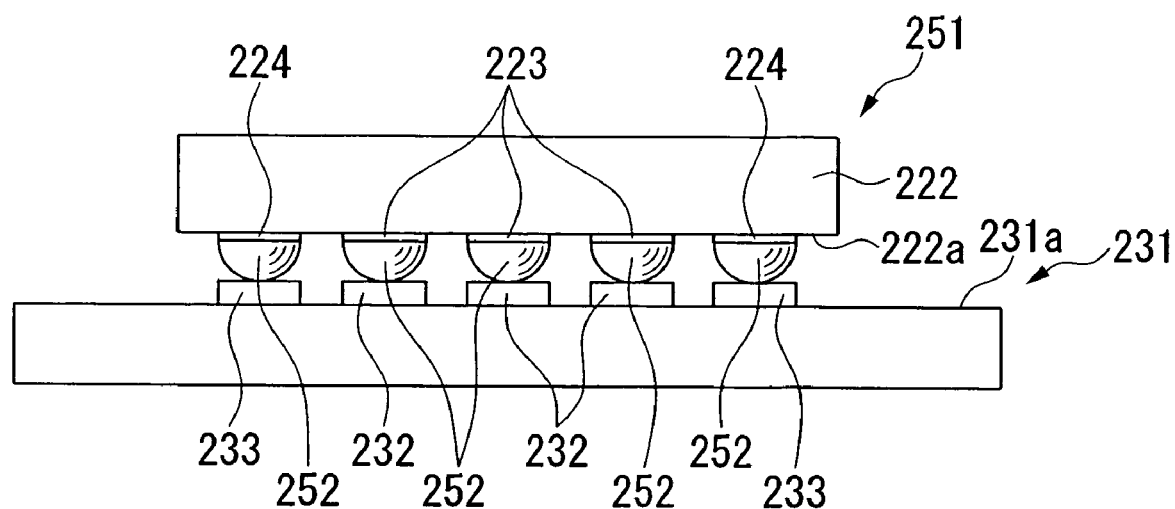
FIG. 31 is a side view showing a WLCSP attached onto a board in accordance with a second modified example of the third embodiment.

FIG. 31 is a side view showing a wafer level chip size package (WLCSP) that is attached onto a printed-circuit board in accordance with a second modified example of the present embodiment. Compared with the WLCSP 221 shown in FIG. 26 in which the magnetic materials 226 join only the non-connection pins 224 via the adhesives 227, a WLCSP 251 shown in FIG. 31 is characterized in that solder balls 252 are attached onto all of the connection pins 223 and the non-connection pins 224, wherein each of the solder balls 252 is formed as a complex member in which magnetic powder is dispersed into a solder (or a conductor).

The solder balls 252 are each composed of complex solder in which ferromagnetic powder is dispersed into solder. As the ferromagnetic powder, it is preferable to use one element selected from among prescribed elements such as iron (Fe), cobalt (Co), nickel (Ni), gadolinium (Gd), terbium (Tb), dysprosium (Dy), holmium (Ho), erbium (Er), and thulium (Tm); or it is preferable to use an alloy composed of two or more elements selected from among the prescribed elements. The ferromagnetic powder is dispersed into solder composed of Sn of 63 weight percent and Pb of 37 weight percent, solder composed of Sn of 60 weight percent and Pb of 40 weight percent, solder composed of Sn of 50 weight percent and Pb of 50 weight percent, solder composed of Pb of 95 weight percent and Sn of 5 weight percent, and solder composed of Sn of 95 weight percent and Sb of 5 weight percent, for example.

It is preferable that the content of the ferromagnetic powder ranges from 10 weight percent to 50 weight percent within the total weight of the complex solder; more preferably, it is set to 35 weight percent.

When the content of the ferromagnetic powder is less than 10 weight percent, the magnetic force should be reduced so much so that the WLCSP 251 may be difficult to be fixed to the board 231. When the content of the ferromagnetic powder exceeds 50 weight percent, it becomes likely that the solder is degraded in adhesion, melting ability, and strength.

Instead of the ferromagnetic powder, it is possible to use weak magnetic powder, which is composed of iron (Fe), cobalt iron (Fe—Co alloy), nickel iron (Fe—Ni alloy), and silicon iron (Fe—Si alloy), for example.

The second modified example can demonstrate prescribed effects and operations identical to those of the present embodiment.

Since the complex solder balls 252 join all of the connection pins 223 and the non-connection pins 224, the second modified example can be realized by a simple step for arranging the complex solder balls 252 on the prescribed surface 222a of the WLCSP 251. This eliminates a step for arranging the magnetic materials 226 onto the prescribed surface 231a of the board 231; thus, it is possible to reduce the manufacturing process.

(c) Third Modified Example

Figure 32:
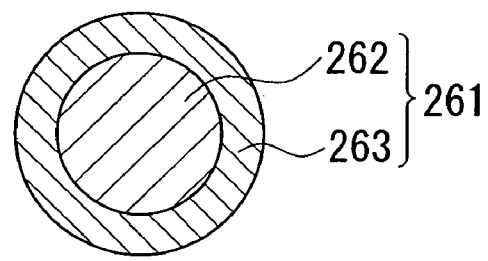
FIG. 32 is a cross sectional view showing a solder ball used for a WLCSP in accordance with a third modified example of the third embodiment.

FIG. 32 is a cross sectional view a solder ball used in a wafer level chip size package (WLCSP) in accordance with a third modified example of the present embodiment. Compared with the complex solder ball 252 shown in FIG. 31 in which magnetic powder is dispersed into solder, a solder ball 261 shown in FIG. 32 has a two-layered structure in which a spherical magnetic member 262 is encompassed by a solder layer (or a conductive layer) 263.

As the magnetic member 262, it is preferable to use ferromagnetic powder composed of one element selected from among prescribed elements such as iron (Fe), cobalt (Co), nickel (Ni), gadolinium (Gd), terbium (Tb), dysprosium (Dy), holmium (Ho), erbium (Er), and thulium (Tm); or it is preferable to use an alloy composed of two or more elements selected from among the prescribed elements. As the solder layer 163, it is preferable to use solder composed of Sn of 63 weight percent and Pb of 37 weight percent, solder composed of Sn of 60 weight percent and Pb of 40 weight percent, solder composed of Sn of 50 weight percent and Pb of 50 weight percent, solder composed of Pb of 95 weight percent and Sn of 5 weight percent, and solder composed of Sn of 95 weight percent and Sb of 5 weight percent, for example.

The size and shape of the solder ball 261 are appropriately determined to suit the connection pins 223 and the non-connection pins 224, so that they are not specifically determined in dimensions. In the case of the solder ball 261 having a spherical shape as shown in FIG. 32, the diameter of the magnetic member 262 ranges from 50 μm to 300 μm; and the thickness of the solder layer 263 ranges from 70 μm to 200 μm.

The preferable content of the magnetic power for use in the magnetic member 262 within the solder ball 261 is similar to the aforementioned content of the ferromagnetic powder.

The third modified example can demonstrate prescribed effects and operations identical to those of the present embodiment.

(d) Fourth Modified Example

Figure 33:
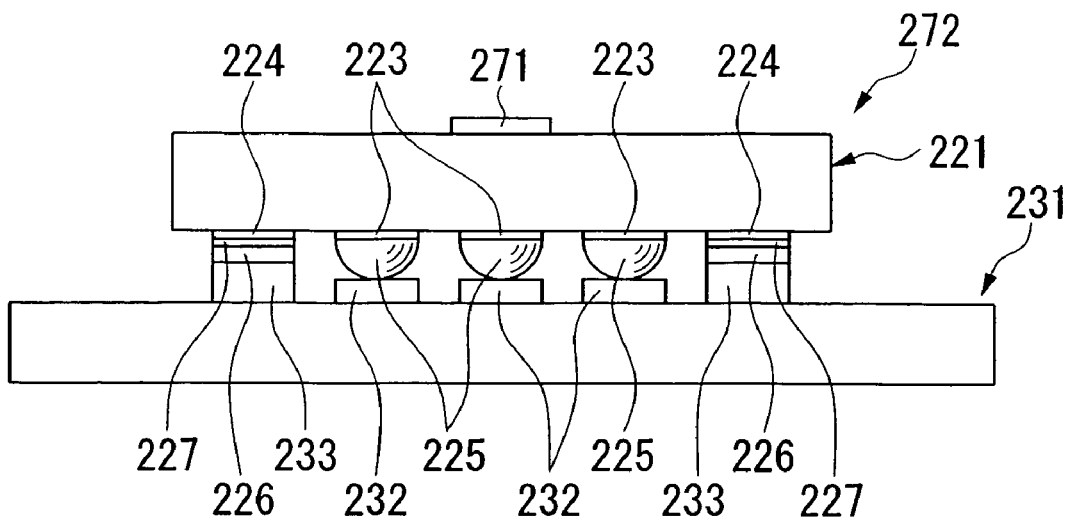
FIG. 33 is a side view showing a WLCSP attached onto a board in accordance with a fourth modified example of the third embodiment.
Figure 34:
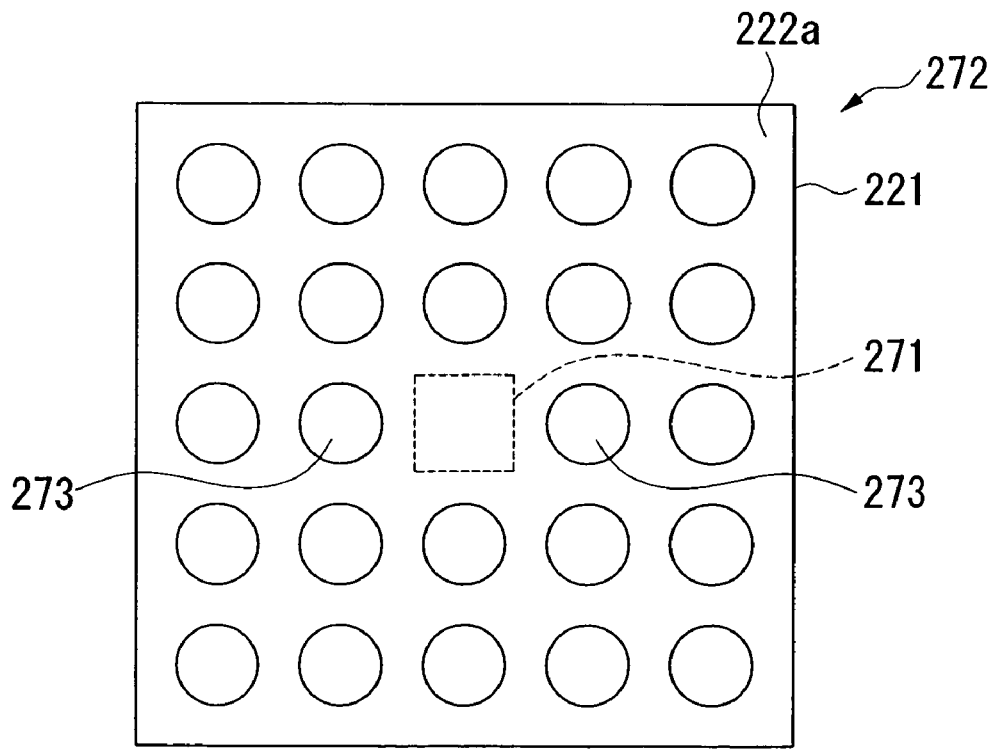
FIG. 34 is a plan view showing a prescribed surface of the WLCSP, which directly faces a prescribed surface of the board shown in FIG. 33.
Figure 35:
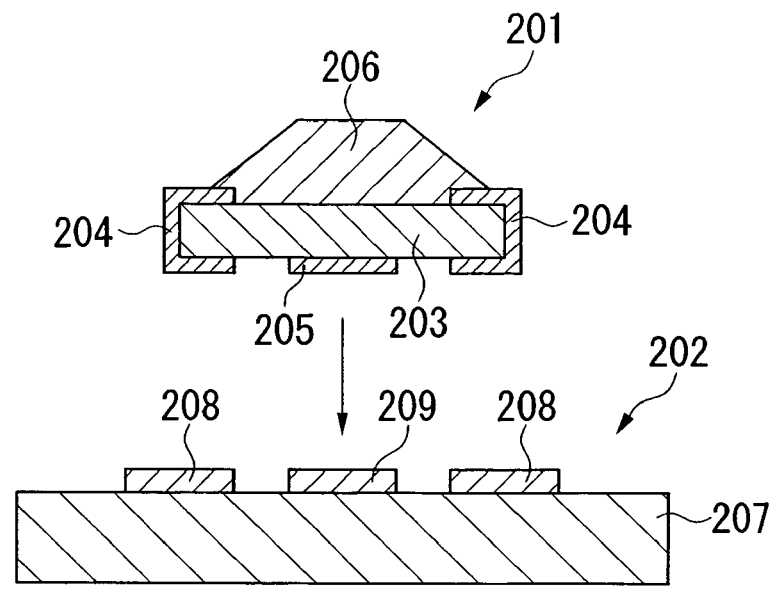
FIG. 35 is a cross sectional view showing a method for mounting a chip module onto a wiring board by use of a permanent magnet and magnetic materials.
Figure 36:
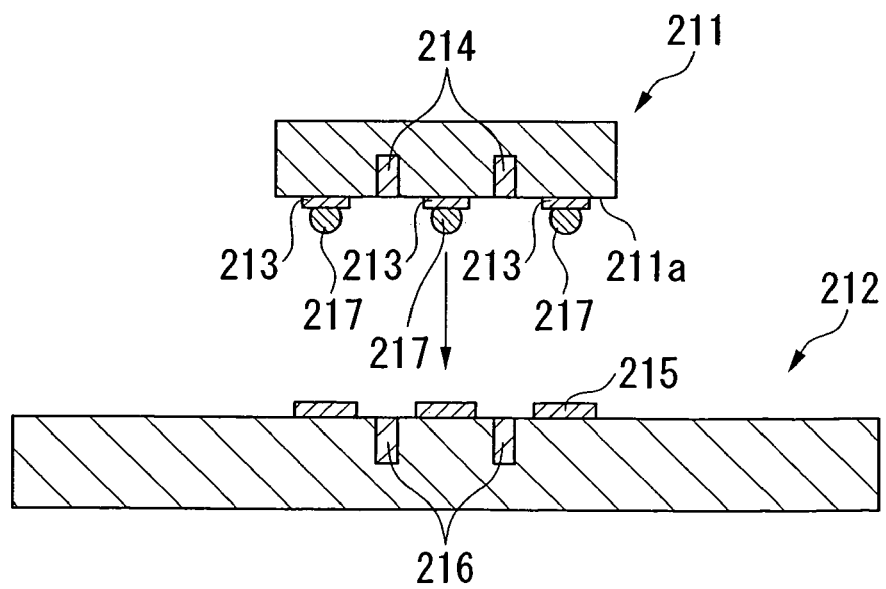
FIG. 36 is a cross sectional view showing a method for mounting an IC chip onto a printed-circuit board by use of magnetic materials and solder balls.

FIG. 33 is a side view showing a wafer level chip size package (WLCSP) that is attached onto a board; and FIG. 34 is a plan view showing a prescribed surface of the WLCSP. Compared with the present embodiment shown in FIG. 26 in which the WLCSP 221 is mounted on the board 231, the fourth modified example is characterized in that a WLCSP 272 corresponding to the WLCSP 221 equipped with a giant magnetoresistive element (i.e., a GMR element for detecting physical quantity) 271 is mounted on the board 231.

As shown in FIG. 34, a plurality of non-connection balls 273 composed of weak magnetic materials are regularly arranged on the prescribed surface 222a of the WLCSP 221 except at a prescribed area, which is vertically opposite to the position of GMR element 271 through the thickness of the WLCSP 221. This increases the sensitivity of the GMR element 271 in response to an external magnetic field.

It is possible to replace the GMR element 271 with other components such as hall-effect transducers, tunnel magnetoresistive elements (i.e., TMR elements), pressure sensors, and temperature sensors, which are integrated into the WLCSP 221 so as to simultaneously detect physical quantities such as hall effects, magnetic fields, pressure, and temperature.

For example, when a hall-effect transducer (or a TMR element) that is sensitive to magnetism in a vertical direction is substituted for the GMR element 271, it may be necessary to arrange a non-connection ball 273 on the prescribed surface 222a at a prescribed position, which is vertically opposite to the position of the hall-effect transducer (or TMR element) through the thickness of the WLCSP 221.

In addition, it is possible to further improve a sensing ability by adhering a magnetic plate composed of permalloy (i.e., iron-nickel alloy) onto the prescribed surface 222a of the WLCSP 221.

The fourth modified example can demonstrate prescribed effects and operations identical to those of the present embodiment.

Since the WLCSP 272 corresponding to the WLCSP 221 equipped with the GMR element 271 is mounted on the board 231, it is possible to realize a sophisticated device having both the functions of the WLCSP 221 and the GMR element 271, which can be integrated together.

As described above, the present embodiment and its modified examples halve a simple structure in which the magnetic materials 226 join the non-connection pins 224 that are arranged at selected positions of the grid on the prescribed surface 222a of the silicon substrate 222 on which integrated circuits are formed. Such a simple structure can be applied to any types of packages other than WLCSP, such as CSP and BGA, and to any types of semiconductor chips as well.

4. Fourth Embodiment

Figure 37:
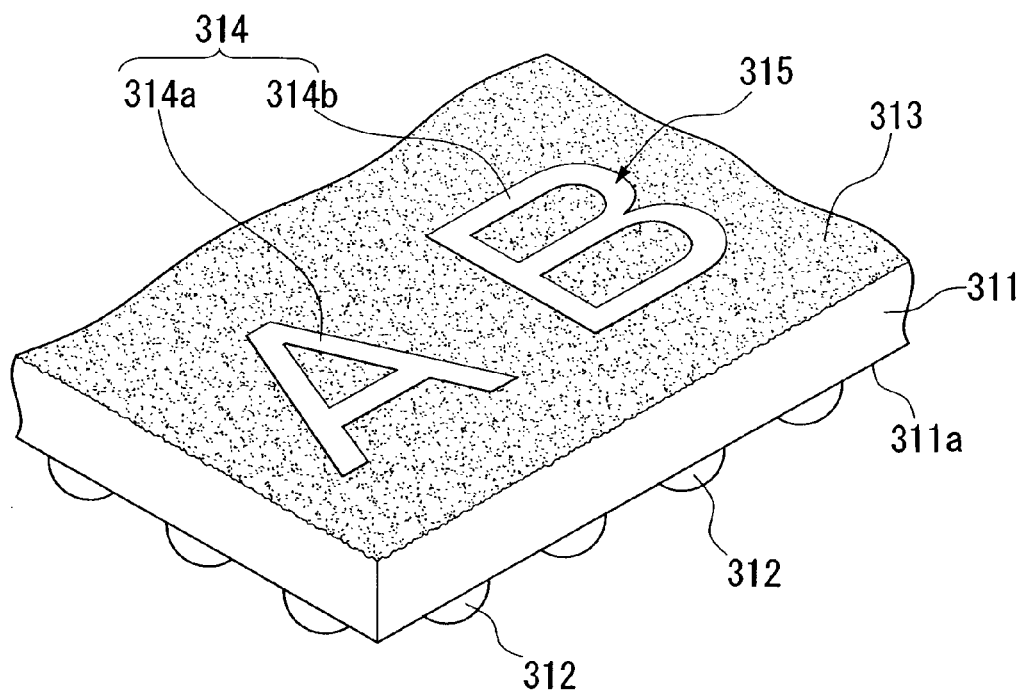
FIG. 37 is a perspective view showing the exterior appearance of a wafer level chip size package (WLCSP) in accordance with a fourth embodiment of the invention.

FIG. 37 is a perspective view showing the exterior appearance of a wafer level chip size package (WLCSP) in accordance with a fourth embodiment of the invention, wherein reference numeral 311 designates a silicon substrate (or a semiconductor substrate) having a rectangular shape in plan view, in which integrated circuits (or electronic circuits, not shown) are formed; reference numerals 312 designate metal pads having hemispherical shapes in cross section, which are used for establishing connections with external devices and which are arranged in the peripheral area of a prescribed surface 311a of the silicon substrate 311; reference numeral 313 designates a rough surface area whose degree of surface roughness 'Ra' is greater than a prescribed value and which is formed on a backside surface opposite to the prescribed surface 311a by sandblasting; reference numerals 314 designate planar surface areas, which are not subjected to surface roughness on the backside surface other than the rough surface area 313 and which are therefore secured in the original planarity of the silicon substrate 311.

The planar surface areas 314 designate two characters 314a and 314b (representing 'A' and 'B'), which form an identification mark (or an identifier) 315 for the WLCSP.

It is preferable that the surface roughness degree Ra adapted to the rough surface area 313 ranges from 10 μm to 100 μm; and more preferably, it ranges from 10 μm to 50 μm; and further preferably, it is set to 20 μm. It is preferable that the surface roughness Ra adapted to the planar surface areas 314 ranges from 0.05 μm to 5 μm; and more preferably, it ranges from 1 μm to 3 μm; and further preferably, it is set to 2 μm.

Figure 38:
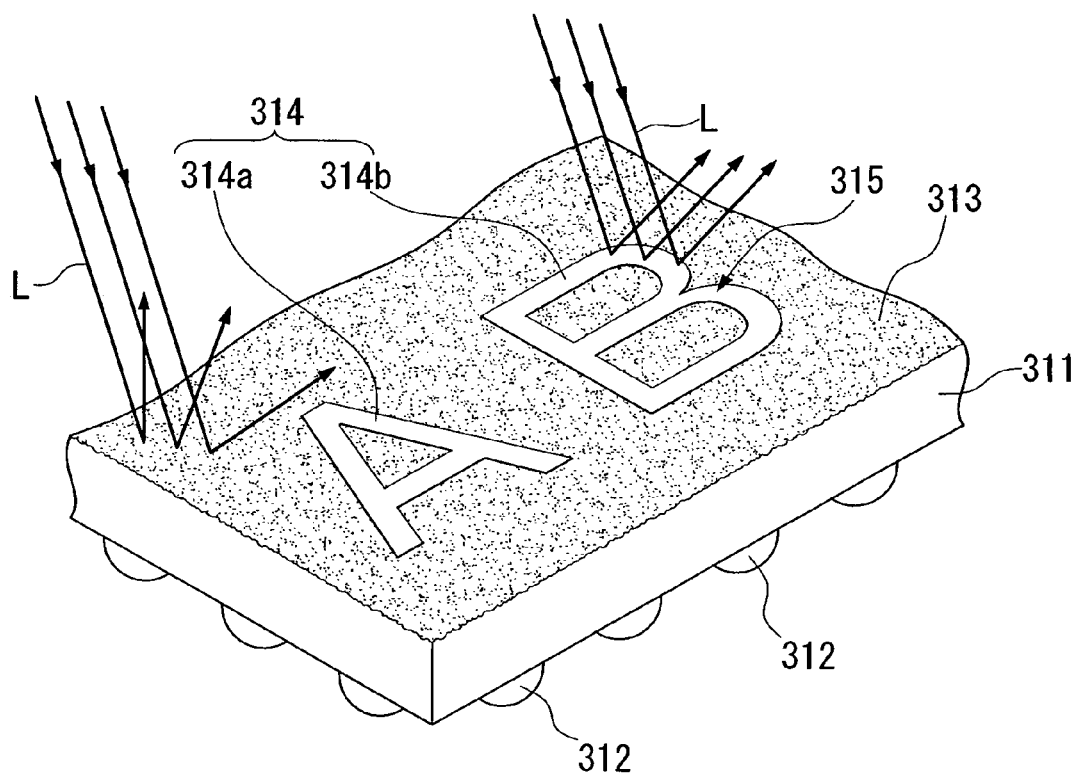
FIG. 38 is a perspective view in which light is incident on the backside surface of a silicon substrate of the WLCSP, thus realizing recognition of an identification mark consisting of prescribed characters.

As shown in FIG. 38, when light L is incident on the backside surface of the WLCSP, irregular reflection of light occurs on the rough surface area 313, while regular reflection of light occurs on the planar surface areas 314 (on which light is reflected in a single direction). This causes gloss differences between the rough surface area 313 and the planar surface areas 314. Such gloss differences can be visibly recognized by human eyes and make it possible for a human operator to easily discriminate between the rough surface area 313 and the planar surface areas 314. Therefore, it is possible for human operator to visibly recognize the identification mark 315 consisting of the characters 314a and 314b realized by the planar surface areas 314 with ease.

Next, a manufacturing method for the WLCSP of the present embodiment will be described particularly with respect to the formation of the rough surface area 313.

Figure 39A:
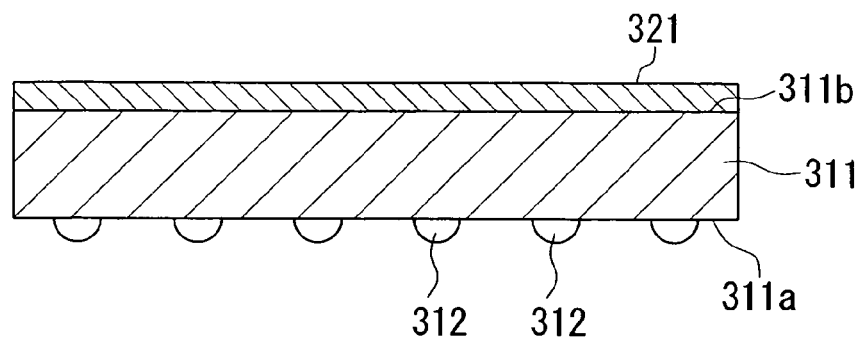
FIG. 39A is a cross sectional view showing a first step for manufacturing the WLCSP in which a mask layer is formed on the backside of the silicon substrate.

As shown in FIG. 39A, there is provided a silicon substrate 311 having a plurality of metal pads 312 on a prescribed surface 311a thereof. In accordance with the spin-coat method, photosensitive materials (which differ from materials used for the formation of the silicon substrate 311) having high sandblasting resistance such as photosensitive polyimide resin, polyurethane resin, acrylic resin, and photosensitive SOG (Silicon On Glass) are applied to a backside surface 311b of the silicon substrate 311, which is then dried so as to form a mask layer (or a photosensitive layer) 321.

Figure 39B:
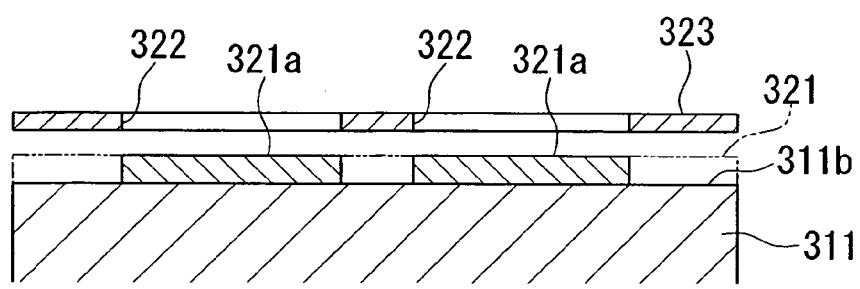
FIG. 39B is a cross sectional view showing a second step for manufacturing the WLCSP in which the mask layer is subjected to exposure and development and is then removed so as to leave mask layers matching shapes of prescribed characters forming an identification mark.

As shown in FIG. 39B, a mask 323 having openings 322 realizing an identification mark is arranged on the mask layer 321, which is then subjected to exposure and development, whereby prescribed portions of the mask layer 321 are selectively left while other portions are removed. Thus, it is possible to form mask layers 321a corresponding to the identification mark.

Figure 39C:
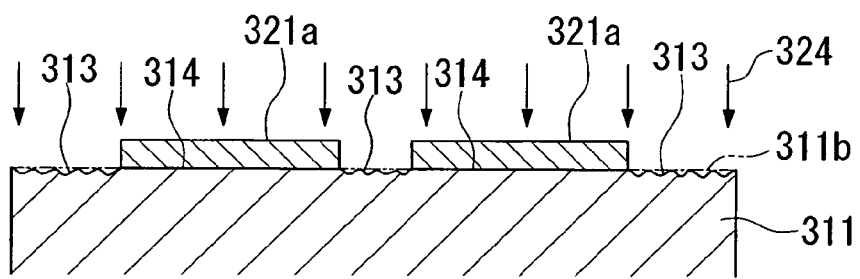
FIG. 39C is a cross sectional view showing a third step for manufacturing the WLCSP in which the backside surface is subjected to sandblasting by way of the mask layers.

As shown in FIG. 39C, the backside surface 311b of the silicon substrate 311 is subjected to rough surface treatment according to sandblasting by way of the mask layers 321a. Specifically, inorganic particulates 324 such as silicon oxide particulates and soda-glass particulates are sprayed onto the mask layer 321a and the exposed portions of the backside surface 311b, wherein due to high sandblasting resistance, the mask layers 321a reject the inorganic particulates 324 so that prescribed portions of the backside surface 311b thereunder are not harmed, while the exposed portions of the backside surface 311b not having sandblasting resistance are easily sandblasted by the inorganic particulates 324 sprayed thereon and are roughened.

As a result, the exposed portions of the backside surface 311b is subjected to sandblasting, thus forming the rough surface area 313 whose surface roughness Ra ranged from 50 μm to 100 μm. The prescribed portions of the backside surface 311b covered with the mask layers 321a are not subjected to sandblasting, thus forming the planar surface areas 314 whose surface roughness Ra ranges from 0.05 μm to 10 μm.

Figure 39D:
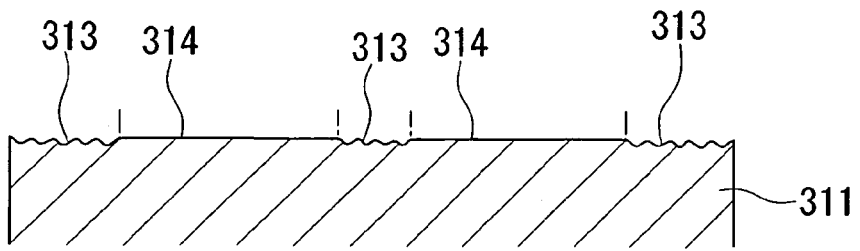
FIG. 39D is a cross sectional view showing a fourth step for manufacturing the WLCSP in which the mask layers are removed so as to expose planar surface areas representing the prescribed characters of the identification mark.

As shown in FIG. 39D, the mask layers 321a are separated off from the backside surface 313, so that the planar surface areas 314 are exposed.

As described above, the rough surface area 313 and the planar surface areas 314 are formed on the backside surface 311b of the silicon substrate 311. By shaping the planar surface areas 314 to form the aforementioned characters 314a and 314b, it is possible to realize the identification mark 315 consisting of the characters 314a and 314b.

According to the WLCSP of the present embodiment, the rough surface area 313, which is subjected to sandblasting, and the planar surface areas 314 are formed on the backside surface 311b opposite to the prescribed surface 311a of the silicon substrate 311, wherein the planar surface areas 314 are shaped to form the identification mark 315 consisting of the characters 314a and 314b. Due to differences of surface roughness, it is possible for a human operator to visually recognize the identification mark 315 with ease. This eliminates difficulty and error regarding recognition of the identification mark 315.

Due to the formation of the rough surface area 313 that partially occupies the overall area of the backside surface 311b, it is possible to increase the overall surface area with respect to the backside surface 311b of the silicon substrate 311, which is thus improved in heat-dissipation characteristics.

In the above, identification of each WLCSP is made based on differences of surface roughness, which can be easily recognized by human eyes. In addition, the present embodiment does not degrade the semiconductor element in order to realize identification.

According to the manufacturing method of the WLCSP of the present embodiment, the mask layer 321 is formed on the backside surface 311b of the silicon substrate 311 and is then subjected to exposure and development so as to form the mask layers 321a, by which the backside surface 311b is subjected to surface roughness treatment and which are then separated off from the backside surface 311b. Thus, it is possible to easily form the rough surface area 313 and the planar surface areas 314 on the backside surface 311b of the silicon substrate 311 by use of a simple machine.

The present embodiment can be modified in a variety of ways, which will be described below.

Figure 40:
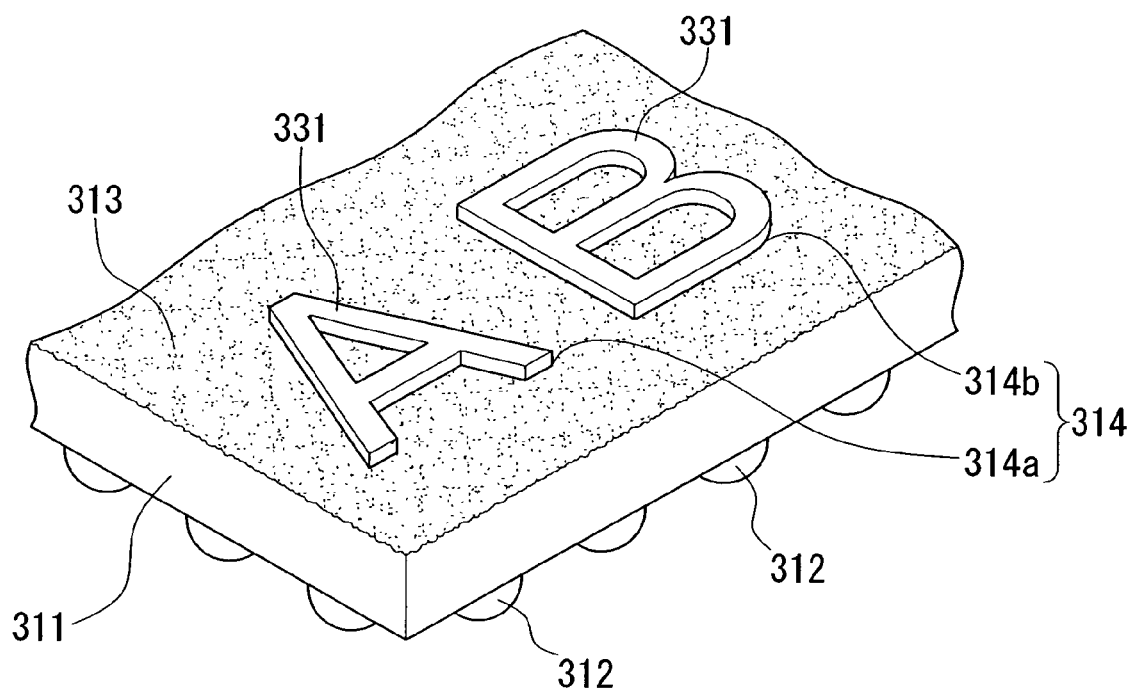
FIG. 40 is a perspective view showing a WLCSP according to a modified example of the fourth embodiment.
Figure 41:
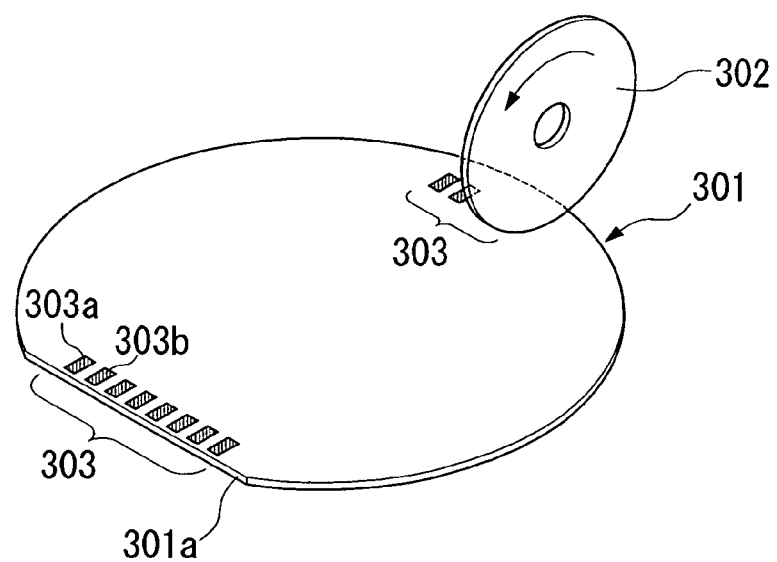
FIG. 41 is a perspective view showing a semiconductor wafer having bar codes.
Figure 42:
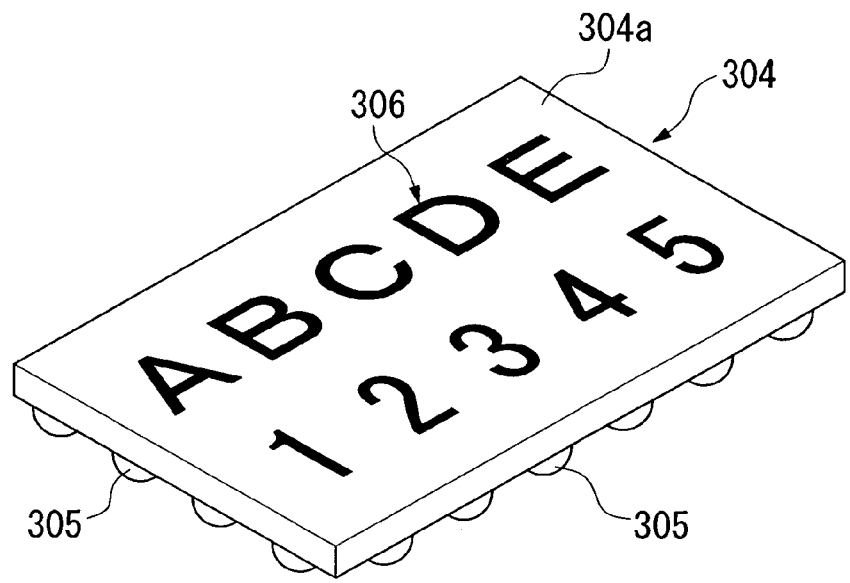
FIG. 42 is a perspective view showing an example of a WLCSP having identification codes.
Figure 43:
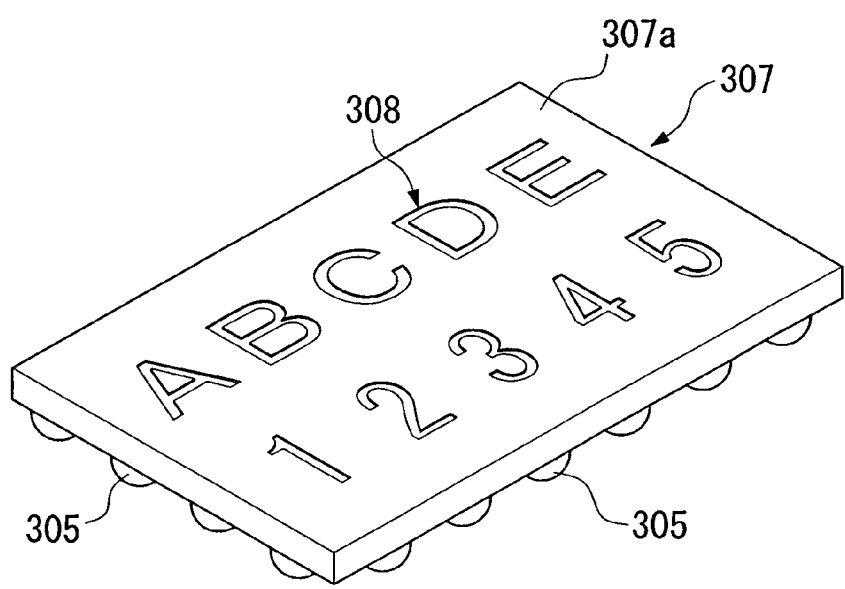
FIG. 43 is a perspective view showing another example of a WLCSP having identification codes.

FIG. 40 is a perspective view showing a WLCSP in accordance with a modified example of the present embodiment. Compared with the WLCSP shown in FIGS. 37 and 38 in which the mask layers 321a are separated off from the backside surface 311b of the silicon substrate 311, the WLCSP shown in FIG. 40 is characterized in that mask layers (or photosensitive layers) 331 composed of photosensitive materials (which differ from materials used for the formation of the silicon substrate 311) having high sandblasting resistance and thermal conductivity such as photosensitive polyimide resin, polyurethane resin, photosensitive SOG (Silicon On Glass) are formed to cover the planar surface areas 314 and are not separated from the backside surface 311b of the silicon substrate 311.

The modified example can demonstrate prescribed effects and operations identical to those of the present embodiment.

Since the mask layers 331 are composed of photosensitive materials having high sandblasting resistance and thermal conductivity, it is possible to increase the overall surface area of the backside surface 311b of the silicon substrate 311, which is thus improved in heat-dissipation characteristics.

The identification mark 315 is not necessarily formed by the planar surface areas 314. That is, an identification mark consisting of prescribed characters can be formed by appropriately shaping the rough surface area 313.

The rough surface area 313 is not necessarily formed by sandblasting. For example, irregularities representing stripes, islands, and dots can be formed on the rough surface area 313 by the dicer blade method and the like, whereby it is possible to improve heat-dissipation characteristics. Of course, sandblasting can be additionally performed on irregularities of the rough surface area 313.

When a silicon wafer is subjected to dicing and cut into individual packages (each corresponding to the WLCSP), scribing regions of the silicon wafer are subjected to half cutting using a dicer blade so as to form an identification mark, which is then subjected to sandblasting. In this case, round edges are formed on prescribed portions of the silicon wafer subjected to half cutting. This makes it very difficult for packages derived from the silicon wafer to be partially cut and broken; thus, it is possible to improve the reliability of the semiconductor element.

The surface roughness treatment is not necessarily realized by sandblasting. That is, it is possible to use a variety of blasting methods for the surface roughness treatment, such as air-blasting method, shot-blasting method, and micro-blasting method.

Blasting materials (or polishing materials) are not necessarily limited to the inorganic particulates 324. That is, it is possible to use mineral materials such as garnet, ceramic materials such as zirconia and glass beads, metallic materials such as iron powder, steel beads, stainless steel beads, steel wires, and stainless steel wires, and resin materials such as nylon and polycarbonate.

In the present embodiment, the backside surface 311b of the silicon substrate 311 is subjected to surface roughness treatment using the mask layers 321a. Without using the mask layers 321a, the overall area of the backside surface 311 is subjected to blasting and is made rough; then, an identification mark is directly drawn on such 'rough' backside surface 311b by micro-blasting, or the other area is subjected to micro-blasting.

Incidentally, the identification mark can be appropriately shaped to represent any types of characters, numerals, symbols, codes, and images.

As described above, the present embodiment, in which sandblasting is performed on the backside surface 311b opposite to the prescribed surface 311a of the silicon substrate 311 so as to form the rough surface area 313 and the planar surface areas 314 realizing the identification mark 315 consisting of the characters 314a and 314b, can be applied to any types of packages other than WLCSP, such as CSP and BGA.

5. Fifth Embodiment

Figure 44A:
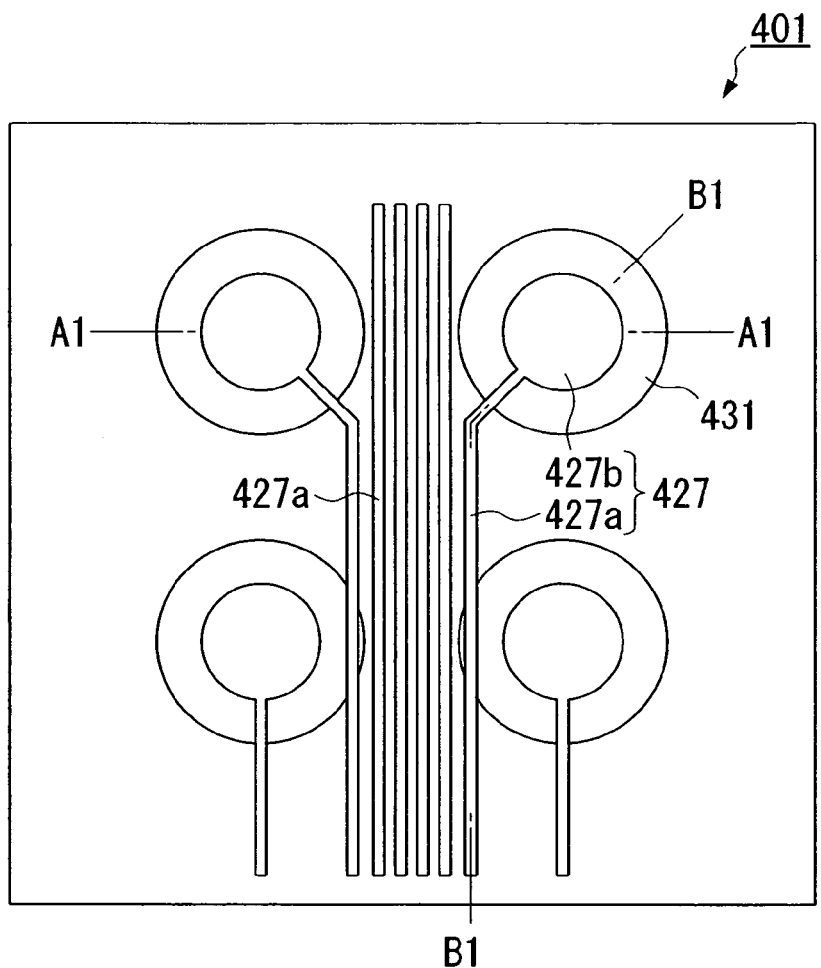
FIG. 44A is a plan view showing a semiconductor device encapsulated in a wafer level chip size package (WLCSP) in accordance with a fifth embodiment of the invention.
Figure 44B:
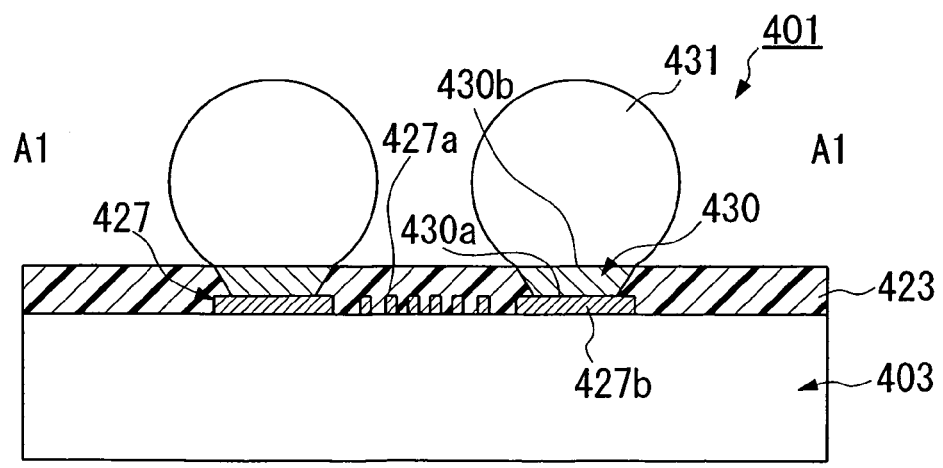
FIG. 44B is a cross sectional view taken along line A1-A1 in FIG. 44A.
Figure 45:
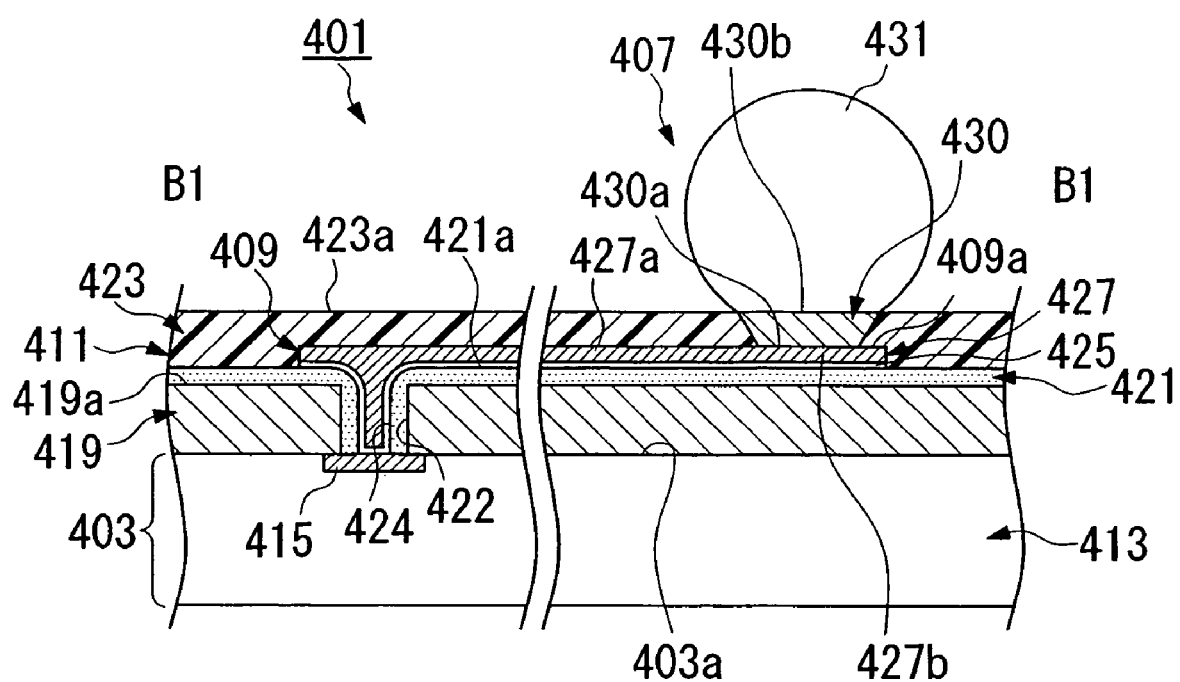
FIG. 45 is a cross sectional view taken along line B1-B1 in FIG. 44A.

FIG. 44A is a plan view showing a semiconductor device encapsulated in a wafer level chip size package (WLCSP) connected with external terminals viewed from re-wiring layers in accordance with a fifth embodiment of the invention; FIG. 44B is a cross sectional view taken along line A1-A1 in FIG. 44A; and FIG. 45 is a cross sectional view taken along line B1-B1 in FIG. 44A. These illustrations are not drawn precisely in terms of scales and dimensions, wherein metal posts are partially deformed to clearly show outstanding shapes thereof.

FIG. 45 shows a semiconductor chip 403 incorporating a pad electrode 415, wherein a re-wiring layer 427 is connected with the pad electrode 415, a metal post 430 (serving as an electrode 407) is connected with the re-wiring layer 427; and an external terminal 431 is attached onto the metal post 430.

Specifically, the semiconductor chip 403 includes a silicon substrate 413 on which integrated circuits are formed and a plurality of pad electrodes 415, which are formed on the silicon substrate 413. A passivation film 419 is formed on the surface of the semiconductor chip 403 in such a way that the upper surface of the pad electrode 415 is opened. The passivation film 419 is formed by the lamination of layers composed of $SiO_2$ and SiN, which possesses high heat resistance and electric insulation.

An insulating portion 411 is realized by the sequential formation of a protection film 421 and an enclosed resin 423, which are formed on the passivation film 419.

The protection film 421 is composed of polyimide, wherein it is formed to cover a surface 419a of the passivation film 419 and interior walls of an opening 422, which is defined by the pad electrode 415 and the passivation film 419.

The enclosed resin 423 is formed to cover a surface 421a of the protection film 421 and a surface 403a of the semiconductor chip 403 as well as the metal post 430 and a wiring portion 409, which will be described later.

The wiring portion 409 is partially embedded in an opening 424 defined between the pad electrode 415 and the protection film 421, wherein it is formed to pass through between the protection film 421 and the enclosed resin 423 within the insulating portion 411 and is elongated towards the lower end of the metal post 430. The wiring portion 409 is formed by the lamination of an under-barrier metal (UBM) layer 425 and the re-wiring layer 427, which are sequentially formed on the surface 421a of the protection film 421. The under-barrier metal layer 425 is formed by the lamination of layers composed of titanium (or chromium) and copper; and the re-wiring layer 427 is composed of copper. As shown in FIGS. 44A and 44B, the re-wiring layer 427 is constituted by re-wires 427a, which are drawn from the pad electrode 415, and post bases 427b attached to prescribed ends of the re-wires 427a, wherein the post bases 427b are increased in widths compared with the re-wires 427a and are each formed in circular shape in plan view. The under-barrier metal layer 425 is adequately reduced in thickness compared with the re-wiring layer 427. For example, the under-barrier metal layer 425 is formed by the lamination of a lower layer of 0.18 μm and an upper layer of 0.6 μm; and the thickness of the re-wiring layer 427 ranges from 4 μm to 5 μm.

The electrode 407 is formed on the post base 427b of the re-wiring layer 427, wherein it is constituted by the metal post 430, which is composed of copper and is formed in circular shape in plan view, and the external terminal 431 such as a solder ball, which is attached to the upper end of the metal post 430. The metal post 430 is enclosed in the enclosed resin 423 in the periphery thereof, wherein its surface 430b lying close to the external terminal 431 substantially matches a surface 423a of the enclosed resin 423 in the same plane. The external terminal 431 projects from the surface 423a of the enclosed resin 423.

The metal post 430 has a tapered shape (defined between surfaces 430a and 430b) in which the diameter thereof gradually increases in a direction from the re-wiring layer 427 to the external terminal 431. Therefore, the sectional area of the metal post 430 gradually increases in a direction from the surface 430a lying close to the re-wiring layer 427 to the surface 430b lying close to the external terminal 431. In short, the surface 430b is made greater than the surface 430a.

In addition, the maximal diameter of the external terminal 431 is greater than the maximal diameter of the metal post 430 (i.e., the diameter of the surface 430b lying close to the external terminal 431). Therefore, the maximal sectional area of the external terminal 431 is made greater than the surface 430b of the metal post 430 lying close to the external terminal 431.

Incidentally, the term "diameter" used in the present embodiment designates the length in plan view, which lies in a direction traversing re-wires (i.e., lines and spaces) arranged adjacent to metal posts, i.e., a direction along the line A1-A1 in FIG. 44A.

Figure 50:
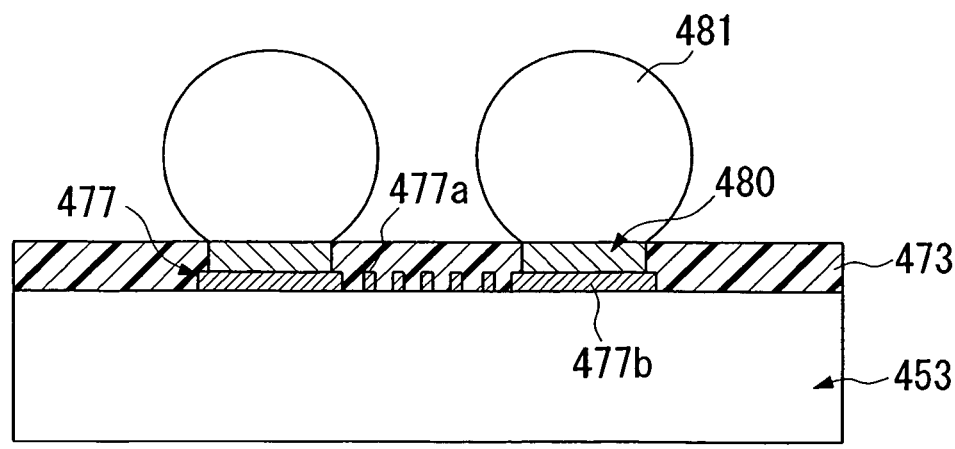
FIG. 50 is a cross sectional view showing an example of a semiconductor device encapsulated in a WLCSP.

The present embodiment is characterized in that the metal post 430 has a tapered shape in which the surface 430a lying close to the re-wiring layer 427 is smaller than the surface 430b lying close to the external terminal 431. This reduces a ratio of the area that the post base 427b occupies the re-wiring layer 427, which in turn increases a degree of freedom regarding drawing of re-wires 427a without using multi-layered structures for the re-wiring layer 427. Thus, even when pitches between external terminals substantially match widths and pitches of re-wires, it is possible to increase the total number of re-wires 427a existing between the adjacent external terminals 431, which is clearly shown by the comparison between FIG. 44B and FIG. 50.

As described above, the present embodiment demonstrates a relatively high degree of freedom regarding design and arrangement of external terminals; hence, the present embodiment can adequately cope with complicated arrangement of external terminals and also can cope with high integration and density packaging in which pitches between external terminals are reduced so as to increase the total density of external terminals. In particular, the semiconductor device 401 of the present embodiment can secure an adequately large area for the surface 430b of the metal post 430 lying close to the external terminal 431, which in turn secures an adequate joining strength between the metal post 430 and the external terminal 431. Compared with the 'spherical' metal post, the metal post 430 is unlikely to be damaged or separated due to stress. That is, the semiconductor device 401 has a superior reliability.

In preliminary testing performed before the external terminal 431 is attached onto the metal post 430, the present embodiment secures alignment between a tester probe and the metal post 430 with ease.

In the present embodiment, the maximal sectional area of the external terminal 431 is made greater than the surface 430b of the metal post 430 lying close to the external terminal 431. This makes it easy for a human operator to mount the external terminal 431 on the metal post 430; hence, it is possible to increase the joining strength between the metal post 430 and the external terminal 431. In the preliminary testing performed before the external terminal 431 is attached onto the metal post 430, the present embodiment easily establish alignment between the tester probe and the metal post 430.

Due to a relatively high degree of freedom regarding drawing of re-wires 427a, the present embodiment may enlarge the usage of WLCSP-type semiconductor devices. For example, it is possible to design a semiconductor device having a relatively small number of re-wires 427a, which substantially matches the number of wires drawn in the conventionally known semiconductor device, wherein the re-wires 427a can be broadened in widths, which allow relatively large amounts of electric currents to flow therethrough, whereby the present embodiment can be adapted to integrated circuits requiring relatively large amount of electric currents.

The present embodiment can be modified in a variety of ways, which will be described below.

In the present embodiment, the metal post 430 is formed in a tapered shape, which is not restricted. That is, similar effects can be obtained by merely reducing the surface 430a lying close to the re-wiring layer 427 to be smaller than the surface 430a lying close to the external terminal 431. The metal post 430 may be easily formed with satisfying the aforementioned condition. Herein, it is preferable to form the metal post 430 such that the sectional area thereof is increased in a direction from the re-wiring layer 427 to the external terminal 431.

Figure 46A:
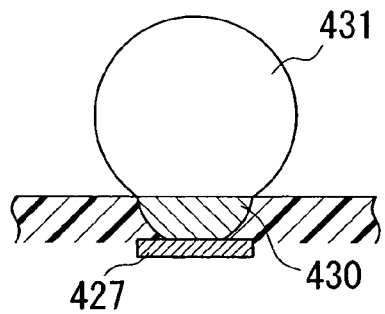
FIG. 46A is a cross sectional view showing a first example of a metal post, on which an external terminal is mounted.
Figure 46B:
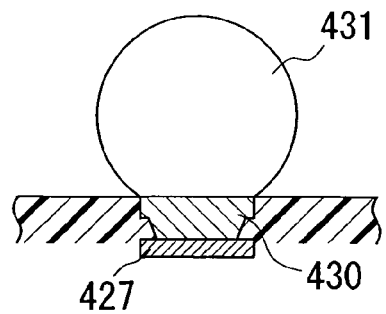
FIG. 46B is a cross sectional view showing a second example of the metal post.
Figure 46C:
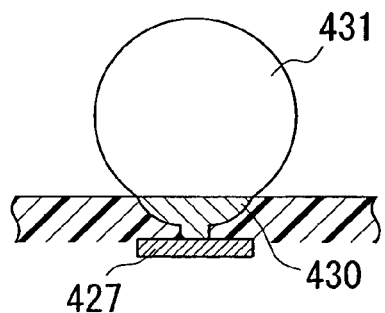
FIG. 46C is a cross sectional view showing a third example of the metal post.
Figure 46D:
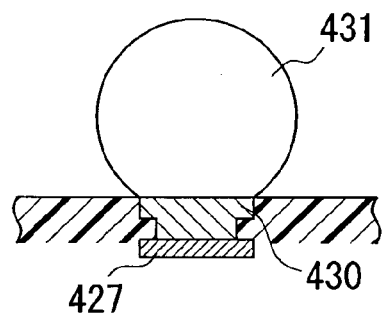
FIG. 46D is a cross sectional view showing a fourth example of the metal post.
Figure 46E:
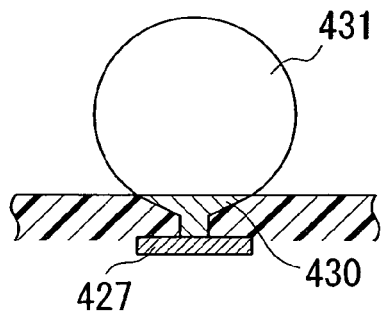
FIG. 46E is a cross sectional view showing a fifth example of the metal post.
Figure 46F:
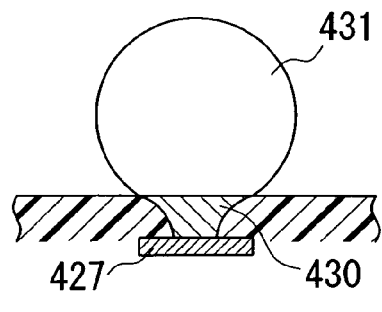
FIG. 46F is a cross sectional view showing a sixth example of the metal post.
Figure 46G:
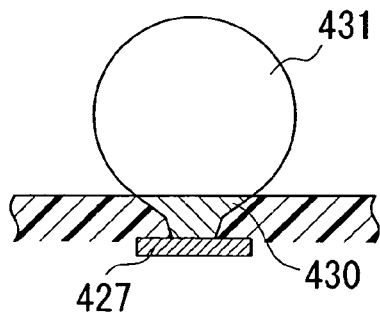
FIG. 46G is a cross sectional view showing a seventh example of the metal post.
Figure 46H:
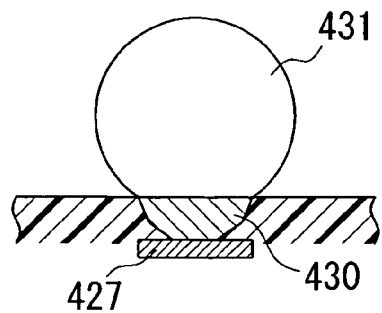
FIG. 46H is a cross sectional view showing an eighth example of the metal post.

Various shapes can be preferably adopted for the metal post 430. For example, FIG. 46A shows a first example of the metal post 430 having a dimple-like shape in which the inclination angle of the wall is gradually increased in the direction from the lower portion to the upper portion. FIG. 46B shows a second example of the metal post 430 in which the lower portion has a tapered shape, and the upper portion has a columnar shape. FIG. 46C shows a third example of the metal post 430 in which the lower portion has a columnar shape, and the upper portion has a dimple-like shape. FIG. 46D shows a fourth example of the metal post 430 in which the upper portion and the lower portion are respectively formed in columnar shapes having different diameters. FIG. 46E shows a fifth example of the metal post 430 in which the lower portion has a columnar shape, and the upper portion has a tapered shape. FIG. 46F shows a sixth example of the metal post 430, which is opposite to the metal post shown in FIG. 46A, in which the inclination angle of the wall is gradually decreased in the direction from the lower portion to the upper portion. FIG. 46G shows a seventh example of the metal post 430 in which the upper portion and the lower portion are respectively formed in tapered shapes having different inclination angles. FIG. 46H shows an eighth example of the metal post 430 in which the upper portion and the lower portion are respectively formed in tapered shapes having different inclination angles.

Next, a manufacturing method for the semiconductor device 401 will be described with reference to FIGS. 47A-47E and FIGS. 48A-48G, each of which is illustrated in correspondence with FIG. 45.

Figure 47A:
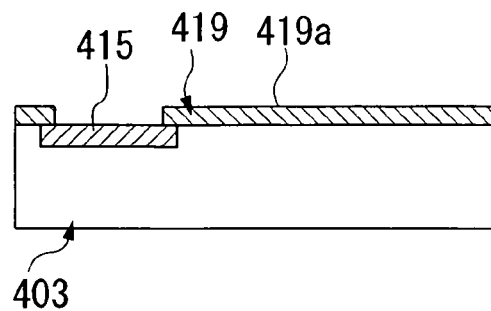
FIG. 47A is a cross sectional view showing a first step for manufacturing the semiconductor device shown in FIG. 45.
Figure 47B:
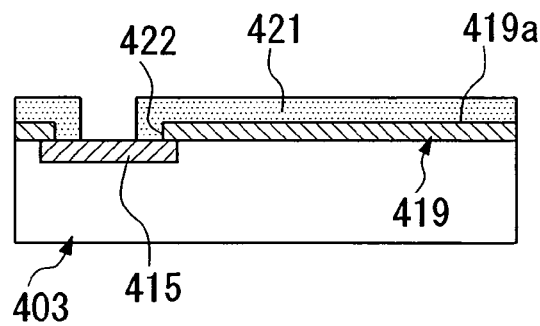
FIG. 47B is a cross sectional view showing a second step for manufacturing the semiconductor device.
Figure 47C:
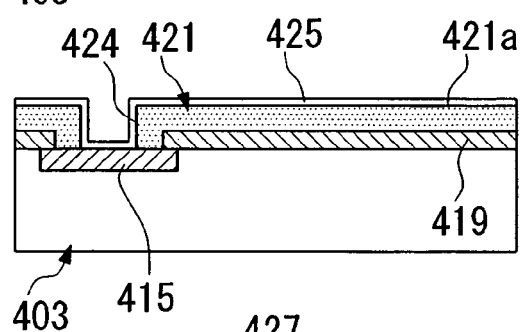
FIG. 47C is a cross sectional view showing a third step for manufacturing the semiconductor device.

First, as shown in FIGS. 47A-47C, on the surface of a semiconductor chip 403, a passivation film 419 is formed to provide opening above a pad electrode 415; a protection film 421 is formed to cover a surface 419a of the passivation film 419 as well as interior walls of an opening 422; and an under-barrier metal (UBM) layer 425 is formed to cover a surface 421a of the protection film 421 as well as interior walls and bottom of an opening 424.

Figure 47D:
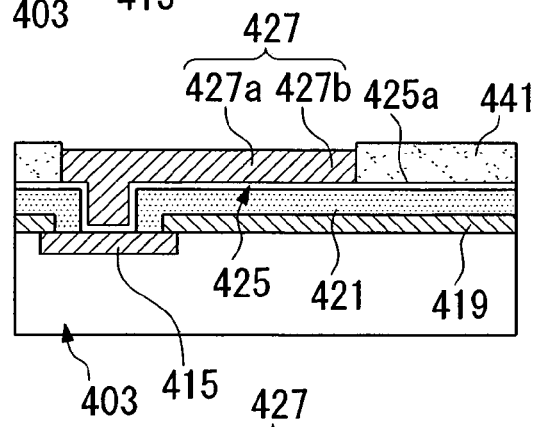
FIG. 47D is a cross sectional view showing a fourth step for manufacturing the semiconductor device.
Figure 47E:
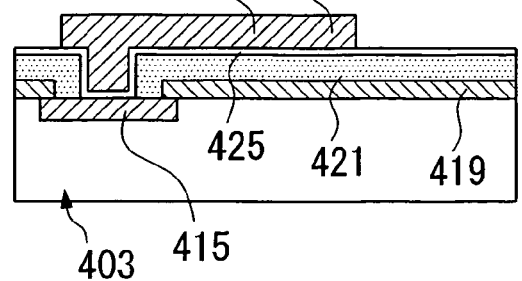
FIG. 47E is a cross sectional view showing a fifth step for manufacturing the semiconductor device.

As shown in FIG. 47D, a photoresist is applied and is subjected to exposure and development so as to form a first resist film 441 on a surface 425a of the under-barrier metal layer 425 except a prescribed area used for the formation of a re-wiring layer 427. By using the first resist film 441 as a mask, an electric current is forced to flow through the under-barrier metal layer 425 so as to perform selective electric-field plating using copper, thus forming the re-wiring layer 427 (i.e., re-wires 427a and post bases 427b). Thereafter, as shown in FIG. 47E, the first resist film 441 is separated off from the under-barrier metal layer 425.

Figure 48A:
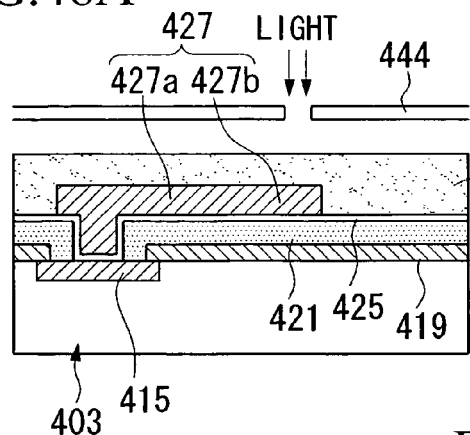
FIG. 48A is a cross sectional view showing a sixth step for manufacturing the semiconductor device.
Figure 48E:
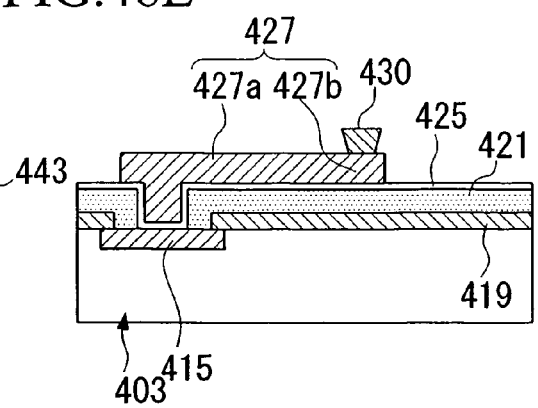
FIG. 48E is a cross sectional view showing a tenth step for manufacturing the semiconductor device.
Figure 48B:
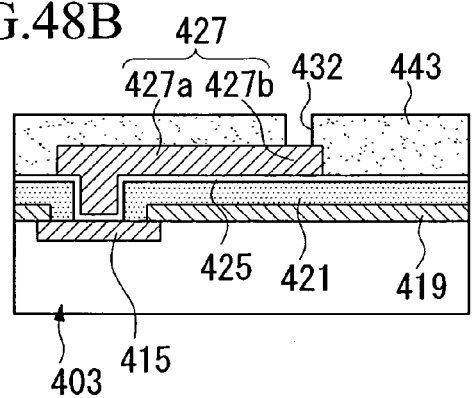
FIG. 48B is a cross sectional view showing a seventh step for manufacturing the semiconductor device.

Next, as shown in FIGS. 48A and 48B, a photoresist 443 used for the formation is a metal post is applied and is subjected to exposure and development, thus forming a 'straight' opening 432 on the metal base 427b of the re-wiring layer 427, wherein the diameter of the opening 432 is identical to the diameter of a surface 430a of a metal post 430 lying close to the re-wiring layer 427. Then, ultraviolet radiation is irradiated onto the photoresist 443, which is thus hardened. The photoresist 443 is not limited to specific materials; it is preferable to use a novolak resin.

Figure 48F:
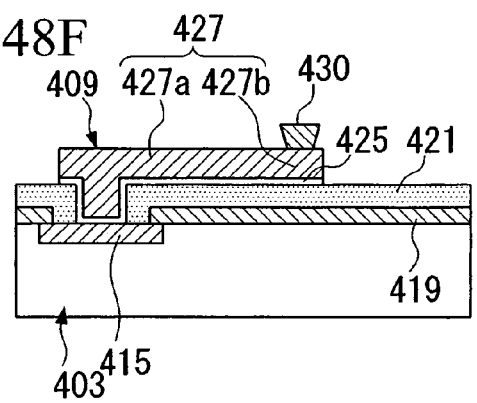
FIG. 48F is a cross sectional view showing an eleventh step for manufacturing the semiconductor device.
Figure 48C:
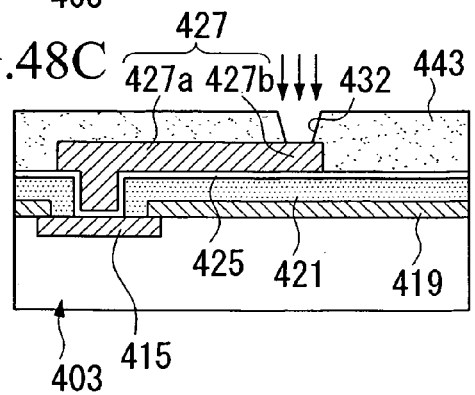
FIG. 48C is a cross sectional view showing an eighth step for manufacturing the semiconductor device.

As shown in FIG. 48C, oxygen plasma ashing is performed with respect to the opening 432, which is thus formed in a tapered shape by enlarging the upper portion thereof. As shown in FIG. 48D, the opening 432 is subjected to heating reflow at a temperature ranging from 90° C. to 200° C., preferably at a temperature ranging from 130° C. to 170° C., further preferably at 160° C., whereby ashed surfaces are made smooth.

Instead of the oxygen plasma ashing, the opening 432 can be formed in a tapered shape by dry etching using $CF_4/CHF_3/He$ (or using Ar or $N_2$). Of course, it is possible to simultaneously use the oxygen plasma ashing and dry etching.

It is possible to use prescribed measures other than dry treatment. For example, as shown in FIG. 48B, the photoresist 443 is subjected to patterning and is then subjected to heating reflow at edges thereof, whereby it is possible to apply a gentle tapered shape to the surfaces of the opening 432.

Alternatively, the photoresist 443 is formed in a two-layered structure including two layers having different characteristic, wherein only the upper portion of the photoresist 443 is subjected to treatment so as to increase the solubility thereof compared with the lower portion. Herein, both the upper portion and lower portion are subjected to development under the same condition, whereby it is possible to simultaneously realize a tapered shape when the opening is formed.

Thus, a second resist film is formed and is used as a mask, wherein as shown in FIG. 48D, selective electric-field plating using copper is performed with respect to the opening 432, thus allowing the growth of the metal post 430 composed of copper. Then, as shown in FIG. 48E, the second resist film is separated off so as to leave the metal post 430 having a tapered shape.

Next, as shown in FIG. 48F, ion milling, wet etching, or dry etching is performed using the re-wiring layer 427 as a mask so as to remove unwanted areas of the under-barrier metal layer 425, whereby the re-wiring layer 427 is divided into isolated pieces.

Figure 48G:
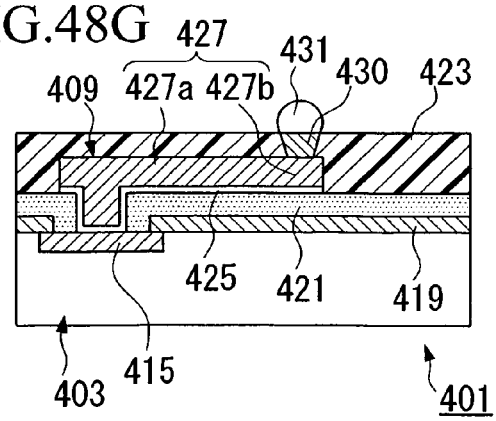
FIG. 48G is a cross sectional view showing a twelfth step for manufacturing the semiconductor device.
Figure 48D:
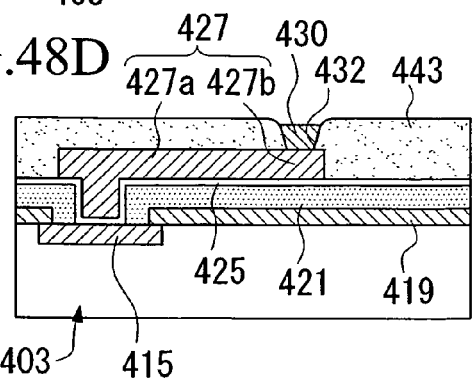
FIG. 48D is a cross sectional view showing a ninth step for manufacturing the semiconductor device.

Lastly, as shown in FIG. 48G, an enclosed resin 423 is formed to cover the surface of the protection film 421 and to enclose the wiring portion 409 and the metal post 430 in such a way that the surface 430b of the metal post 430 lying close to the external terminal 431 is exposed. Furthermore, the external terminal 431 such as a solder ball is attached onto the metal post 430. This, it is possible to complete the production of the semiconductor device 401.

The metal pose 430 having a tapered shape can be easily formed by appropriately modifying the second resist film formation step, which is described in conjunction with FIGS. 48A to 48D. Similarly, the metal posts 430 shown in FIGS. 46A and 46F can be easily formed. In short, the present embodiment is designed such that the sectional area of the metal post 430 is gradually increased in the direction from the re-wiring layer 427 to the external terminal 431. This contributes to simple formation of the metal post 430 while preferably satisfying the prescribed condition in which the surface 430b lying close to the external terminal 431 is greater than the surface 430a lying close to the re-wiring layer 427.

Similarly, the other types of the metal posts 430 shown in FIGS. 46B-46E and 46G-46H can be easily formed by forming two-stage resist films.

Figure 49A:
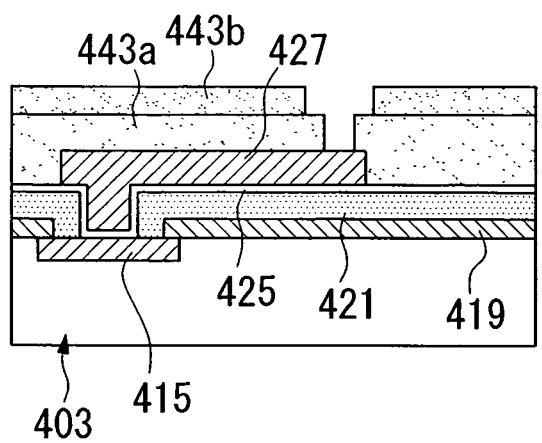
FIG. 49A is a cross sectional view showing the formation of a metal post in manufacturing the semiconductor device.

In the formation of the metal post 430 shown in FIG. 46D, as shown in FIG. 49A, two-stage resist films 443a and 443b having 'straight' openings of different diameters are formed and are then subjected to selective electric-field plating, thus allowing the growth of the metal post 430.

Figure 49B:
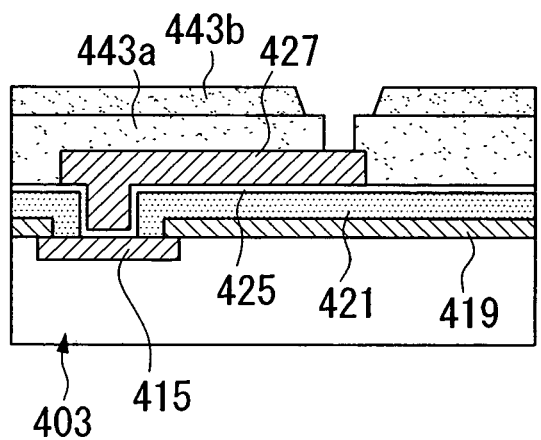
FIG. 49B is a cross sectional view showing the formation of the metal post in manufacturing the semiconductor device.

In the formation regarding the metal posts 430 shown in FIGS. 46B, 46C, 46E, 46G, and 46H, two-stage resist films 443a and 443b shown in FIG. 49A are formed and are then subjected to oxygen plasma ashing or dry etching using $CF_4/CHF_3/He$ as shown in FIG. 49B so that at least one of them is enlarged in opening, wherein they are subjected to selective electric-field plating, thus allowing the metal post 430. FIG. 49B is related to the formation of the metal post 430 shown in FIG. 46C.

The formation regarding the metal posts 430 shown in FIGS. 46B-46E and FIGS. 46G-46H requires complicated manufacturing steps for forming two-stage resist films compared with metal posts having tapered shapes and dimple-like shapes. However, each of the aforementioned metal posts 430 is advantageous in that the diameter of the surface 430b lying close to the external terminal 431 can be made larger than the diameter of the post base 427b. This is preferable in terms of a degree of freedom regarding re-wiring, which secures adequately widths of re-wires in the re-wiring layer 427; and this is also preferable in terms of the joining strength between the metal post 430 and the external terminal 431.

6. Sixth Embodiment

Figure 51:
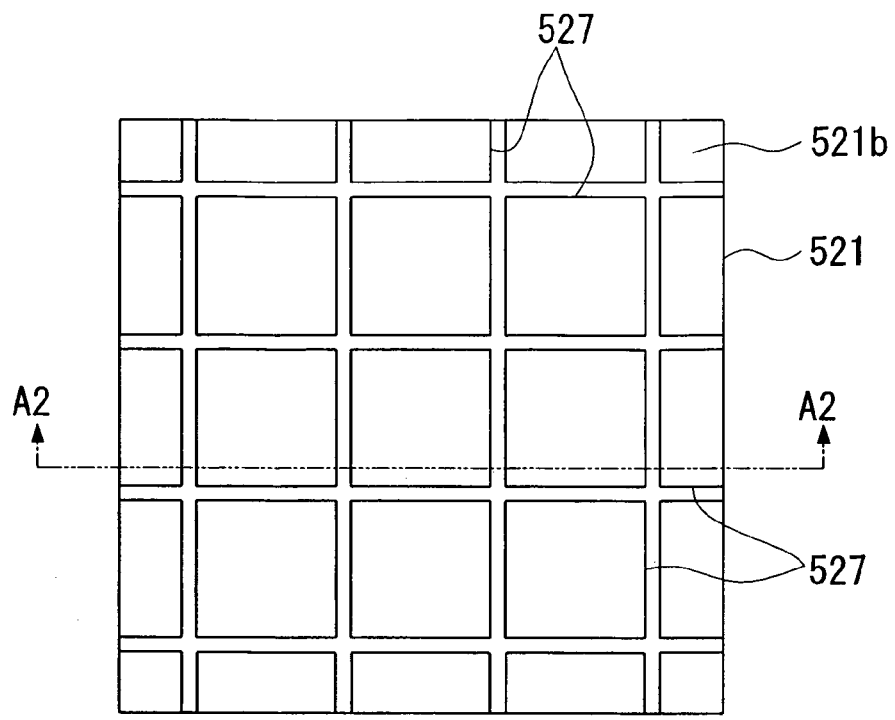
FIG. 51 is a plan view showing a wafer level chip size package (WLCSP) in accordance with a sixth embodiment of the invention.
Figure 52:
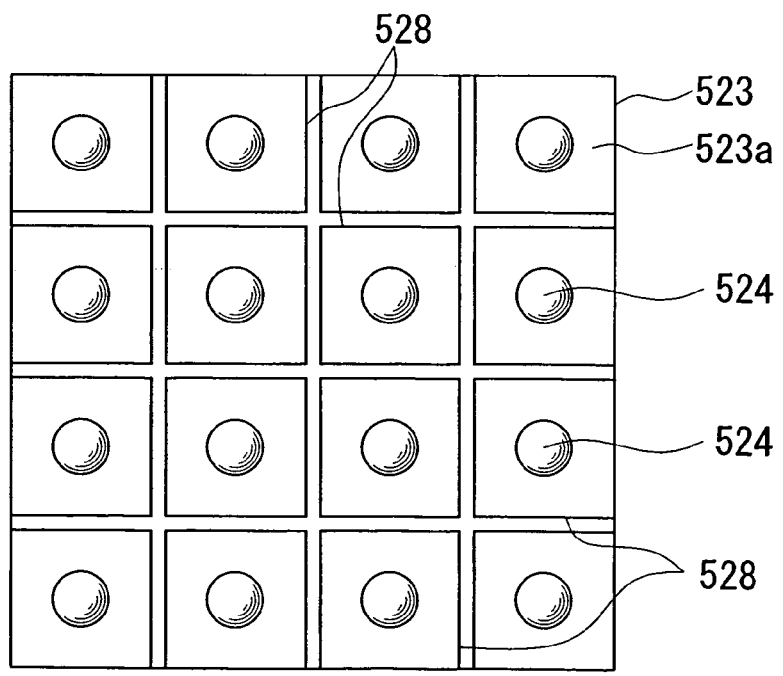
FIG. 52 is a rear view of the WLCSP.
Figure 53:
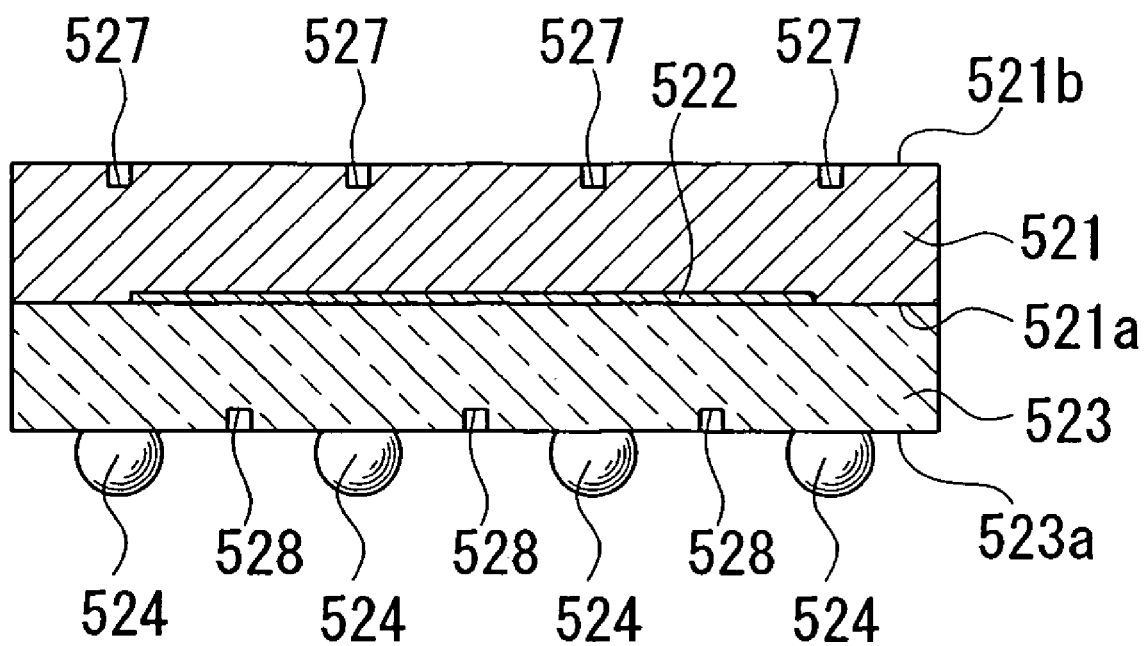
FIG. 53 is a cross sectional view taken along line A2-A2 in FIG. 51.

FIG. 51 is a plan view showing a wafer level chip size package (WLCSP) in accordance with a sixth embodiment of the invention; FIG. 52 is a rear view of the WLCSP; and FIG. 53 is a cross sectional view taken along line A2-A2 in FIG. 51. Reference numeral 521 designates a silicon substrate (or a semiconductor substrate) having a rectangular shape in plan view; reference numeral 522 designates an integrated circuit (or electronic circuits) formed on a surface 521a of the silicon substrate 521; reference numeral 523 designates an enclosed resin layer formed on the surface 521a including the integrated circuit 522; reference numerals 524 designate external terminals that establish electric connections with the integrated circuit 522 and that are partially exposed on a surface 523a of the resin enclosed layer 523.

A plurality of channels 527 (e.g., eight channels in FIG. 51) are formed in a matrix form on a backside surface 521b opposite to the surface 521a of the silicon substrate 521. The number of the channels 527 can be changed as necessarily.

As the depth of the channel 527 becomes deeper, it is possible to increase the overall surface area of the backside surface 521b of the silicon substrate 521. However, when the depth of the channel 527 becomes too deep, the silicon substrate 521 is reduced in mechanical strength. Hence, it is preferable that the depth of the channel 527 ranges from 5% to 20% the thickness of the silicon substrate 521.

Dimensions regarding the width and depth of the channel 527 can be determined with respect to prescribed dimensions of the silicon substrate 521 whose side is 5 mm and whose thickness is 500 μm, for example, wherein the width of the channel 527 ranges from 20 μm to 150 μm, preferably from 50 μm to 100 μm; and the depth of the channel 527 ranges from 25 μm to 100 μm, preferably from 40 μm to 70 μm.

A plurality of external terminals 524 are formed in a matrix form on the surface 523a of the resin enclosed layer 523; and a plurality of channels 528 (e.g., eight channels in FIG. 52) are formed in a grid-like manner so as to partition individual square sections for the external terminals 524. Herein, intersecting points between the channels 527 substantially match positions of the external terminals 524 on the surface 523a of the resin enclosed layer 523. The number of the channels 528 can be changed as necessarily.

As the depth of the channel 528 becomes deeper, it is possible to increase the overall surface area of the surface 523a of the resin enclosed layer 523. When the depth of the channel 528 becomes too deep, the resin enclosed layer 523 is reduced in mechanical strength. Hence, it is preferable that the depth of the channel 528 ranges from 5% to 20% the thickness of the resin enclosed layer 523.

Dimensions regarding the width and depth of the channel 528 can be determined with respect to prescribed dimensions of the resin enclosed layer 523 whose thickness is 100 μm, wherein the width of the channel 528 ranges from 20 μm to 150 μm, preferably from 50 μm to 100 μm; and the depth of the channel 528 ranges from 5 μm to 20 μm, preferably from 10 μm to 15 μm.

Next, a manufacturing method of the WLCSP will be described.

Figure 54A:
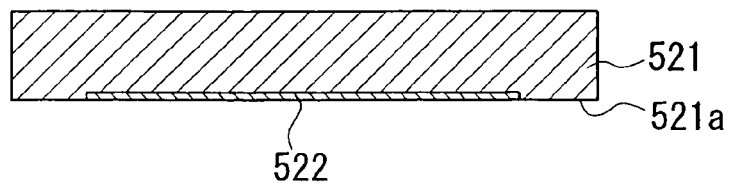
FIG. 54A is a cross sectional view showing a first step for manufacturing the WLCSP.

First, as shown in FIG. 54A an integrated circuit 522 (including electronic circuits and various sensors as necessarily) is formed on a surface 521a of a silicon substrate 521; connection pads (not shown) for establishing electric connections with external terminals 524 are formed in the peripheral area of the integrated circuit 522; and an insulating film (not shown) is formed to cover the integrated circuit 522 except prescribed areas corresponding to the connection pads, thus protecting circuits and components.

Figure 54B:
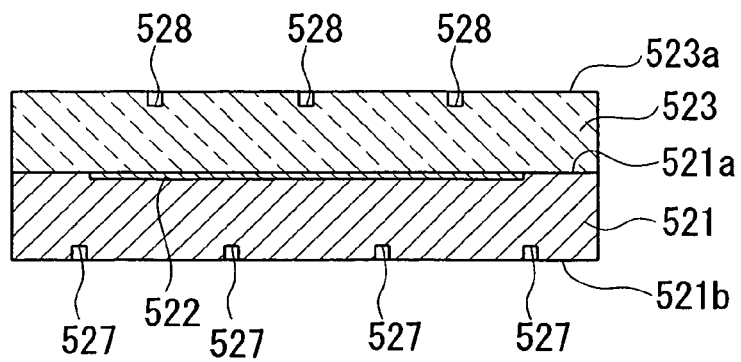
FIG. 54B is cross sectional view showing a second step for manufacturing the WLCSP.

As shown in FIG. 54B, a re-wiring layer (not shown) and a resin enclosed layer 523 are formed on the surface 521a of the silicon substrate 521. A cutting machine such as a grinder I used to form channels 527 on a backside surface 521b of the silicon substrate 521 and to form channels 528 on a surface 523a of the resin enclosed layer 523.

Figure 54C:
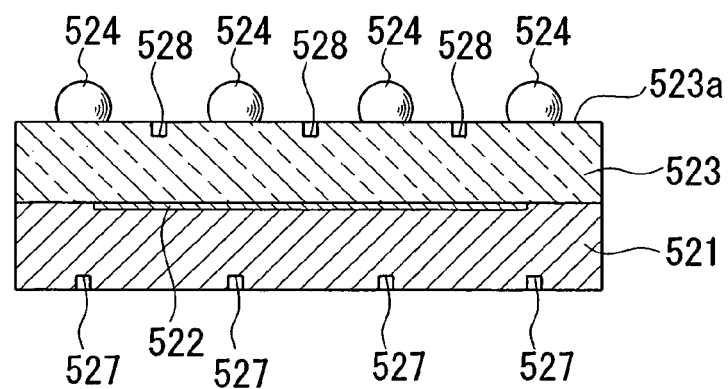
FIG. 54C is a cross sectional view showing a third step for manufacturing the WLCSP.

As shown in FIG. 54C, the external terminals 524 connected with the re-wiring layer are formed on the surface 523a of the resin enclosed layer 523.

Figure 54D:
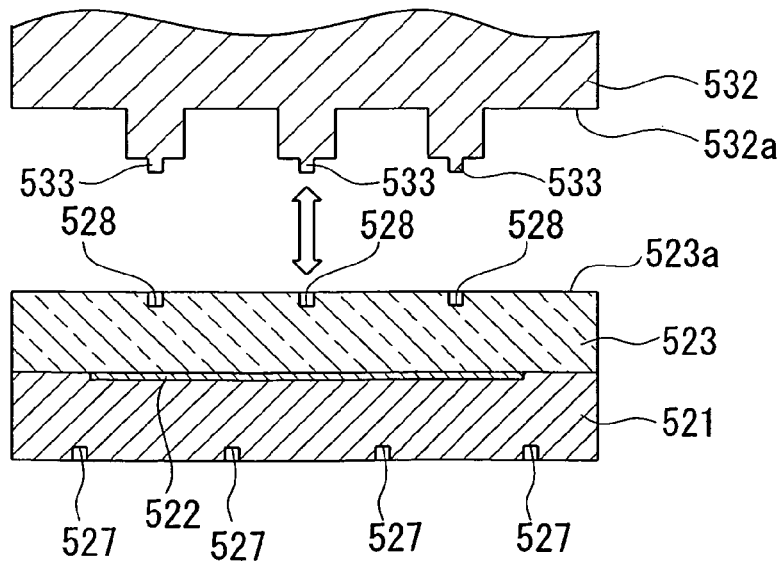
FIG. 54D is cross sectional view showing a fourth step for manufacturing the WLCSP.

Instead of using the cutting machine such as a grinder, as shown in FIG. 54D, a metal mold 532 having punches 533, which are projected from a lower surface 532a at prescribed positions and whose shapes are complementary to shapes of the channels 528, is moved downward so that the punches 533 press the surface 523a of the resin enclosed layer 523, thus forming the channels 528. Thus, it is possible to produce the WLCSP of the present embodiment.

According to the present embodiment, a plurality of channels 527 are formed on the backside surface 521b of the silicon substrate 521, and a plurality of channels 528 are formed on the surface 523a of the resin enclosed layer 523, whereby it is possible to reduce the entire curvature of the WLCSP including the silicon substrate 521 and the resin enclosed layer 523, or it may be possible to avoid the occurrence of the overall curvature of the WLCSP.

Due to the formation of the channels 527 and 528, it is possible to increase the effective surface areas with regard to the backside surface 521b of the silicon substrate 521 and the surface 523a of the resin enclosed layer 523. This makes it possible to improve the joining strength of the WLCSP joining the printed-circuit board.

Since the effective surface areas are increased with regard to the backside surface 521b of the silicon substrate 521 and the surface 523a of the resin enclosed layer 523, it is possible to improve heat-dissipation characteristics with regard to the WLCSP, which is thus stabilized in performance and is improved in reliability.

The prevent embodiment can be modified in a variety of ways, which will be described below.

Figure 55:
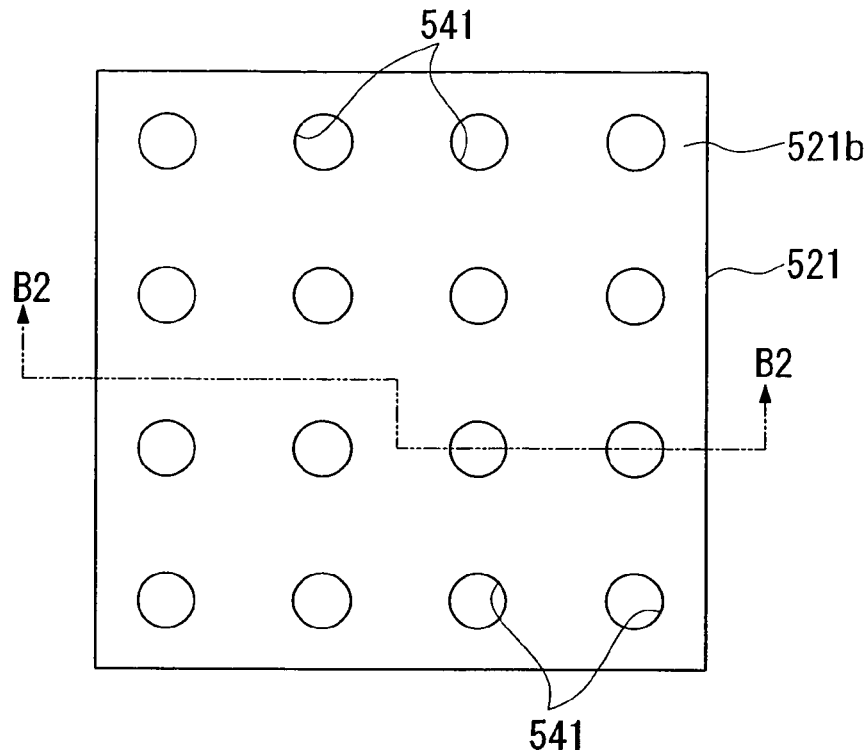
FIG. 55 is a plan view showing a WLCSP according to a first modified example of the sixth embodiment.
Figure 56:
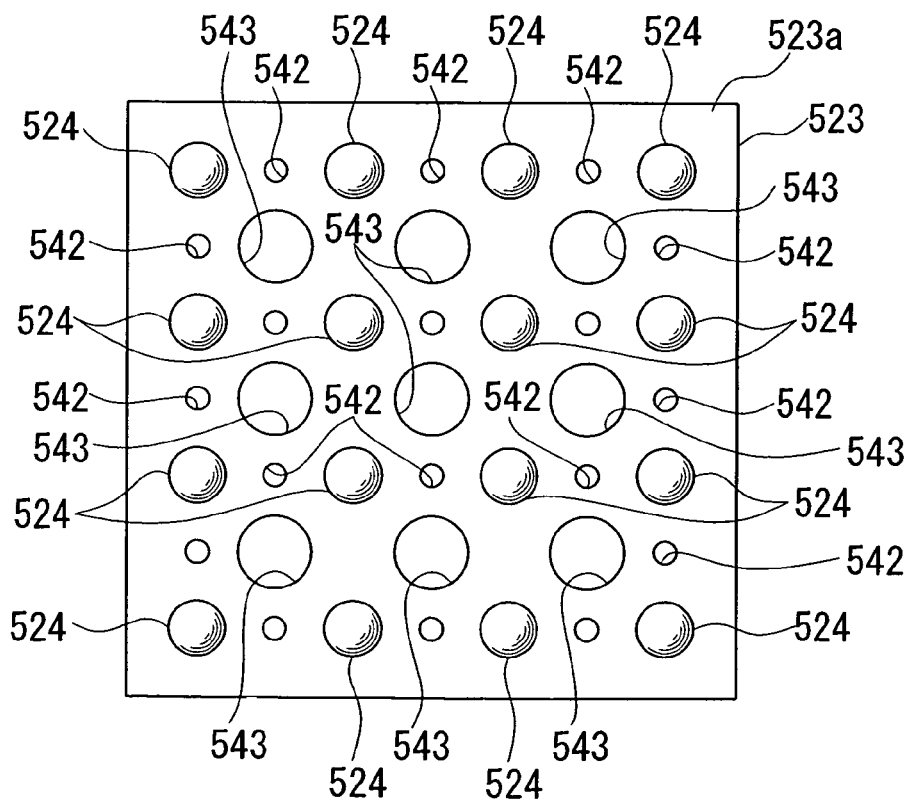
FIG. 56 is a rear view of the WLCSP.
Figure 57:
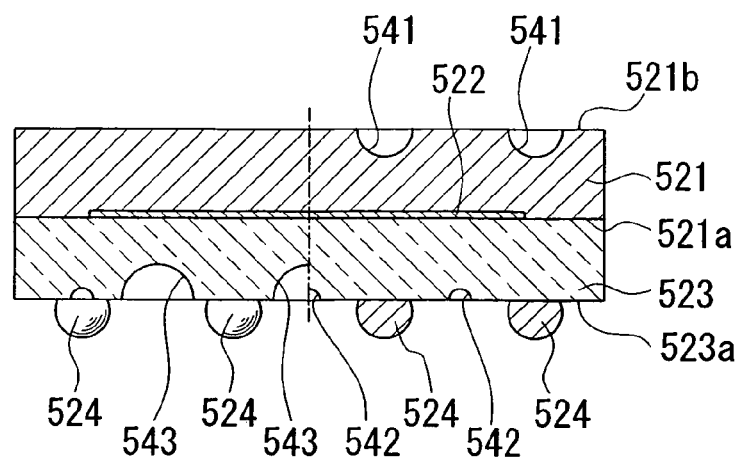
FIG. 57 is a cross sectional view taken along line B2-B2 in FIG. 55.

FIG. 55 is a plan view showing a first modified example of the WLCSP; FIG. 56 is a rear view of the WLCSP; and FIG. 57 is a cross sectional view taken along line B2-B2 in FIG. 55. Compared with the WLCSP of the present embodiment in which a plurality of channels 527 are formed in a matrix form on the backside surface 521b of the silicon substrate 521, and a plurality of channels 528 are formed in a grid-like manner so as to partition square sections of the external terminals 524 on the surface 523a of the resin enclosed layer 523, the WLCSP of the first modified example is characterized in that a plurality of hemispherical dimples (or hollows) 541 are formed in a matrix form on the backside surface 521b of the silicon substrate 521; a plurality of small dimples (or small hollows) 542 having small radiuses of curvature are formed at prescribed positions between the external terminals 524 on the surface 523a of the resin enclosed layer 523; and a plurality of large dimples (or large hollows) having large radiuses of curvature are formed at center positions each encompassed by four external terminals 524.

As the maximal depth of the dimple 541 becomes deeper, it is possible to increase the overall surface area of the backside surface 521b of the silicon substrate 521. However, when the depth of the dimple 541 becomes too deep, the silicon substrate 521 is reduced in mechanical strength. Hence, it is preferable that the depth of the dimple 541 ranges from 5% to 20% the thickness of the silicon substrate 521. The number of the dimples 541 can be changed as necessarily.

Dimensions regarding the opening diameter and maximal depth of the dimple 541 can be determined with respect to prescribed dimensions of the silicon substrate 521 whose length is 5 mm and whose thickness is 500 μm, wherein the opening diameter of the dimple 541 ranges from 30 μm to 300 μm, preferably from 100 μm to 200 μm; and the maximal depth of the dimple 541 ranges from 25 μm to 100 μm, preferably from 40 μm to 70 μm.

Incidentally, shapes, sizes, and numbers of the dimples 542 and 543 formed on the surface 523a of the resin enclosed layer 523 can be changed as necessarily.

Dimensions regarding the opening diameter and maximal depth of the large dimple 543 can be determined with respect to prescribed dimensions of the resin enclosed layer 523 whose length is 5 mm and whose thickness is 100 μm, wherein the opening diameter of the large dimple 543 ranges from 100 μm to 300 μm, preferably from 150 μm to 200 μm; and the maximal depth of the large dimple 543 ranges from 25 μm to 100 μm, preferably from 40 μm to 70 μm.

It is preferable that the opening diameter and maximal depth of the small dimple 542 be smaller than the opening diameter and maximal depth of the large dimple 543. For example, the opening diameter of the small dimple 542 ranges from 30 μm to 100 μm, preferably from 50 μm to 80 μm; and the maximal depth of the small dimple 542 ranges from 10 μm to 50 μm, preferably from 20 μm to 40 μm.

Next, a manufacturing method of the first modified example of the WLCSP will be described, wherein the following description will be given with respect to only the differences compared with the manufacturing method of the WLCSP of the present embodiment.

The integrated circuit 522 and insulating film are formed on the surface 521a of the silicon substrate 521, which is then subjected to dry etching, wet etching, sandblasting, and laser processing, thus forming the dimples 541.

Figure 58:
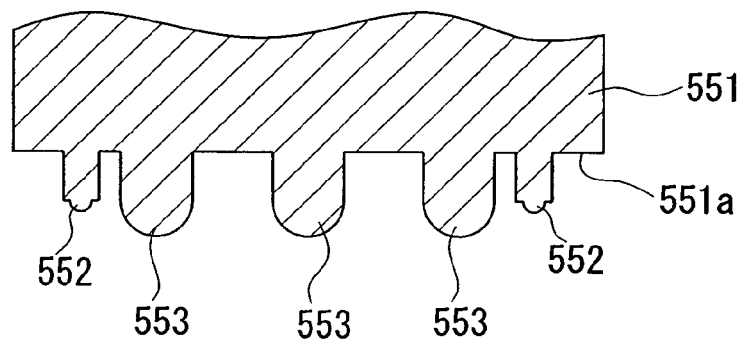
FIG. 58 is a cross sectional view showing a metal mold used for the formation of dimples.

The resin enclosed layer 523 is formed on the surface 521a of the silicon substrate 521. Then, a metal mold 551 shown in FIG. 58 is used to form the small dimples 542 and the large dimples 543 on the surface 523a of the resin enclosed layer 523.

The metal mold 551 provides a plurality of punches 552 whose shapes are complementary to shapes of the small dimples 542 and a plurality of punches 553 whose shapes are complementary to shapes o the large dimples 543, all of which are formed at prescribed positions on a lower surface 551a. The metal mold 551 is moved downward so that the punches 552 and 553 press the surface 523a of the resin enclosed layer 523, whereby it is possible to form the small dimples 542 and the large dimples 543.

The first modified example can demonstrate prescribed effects identical to those of the present embodiment.

Figure 59:
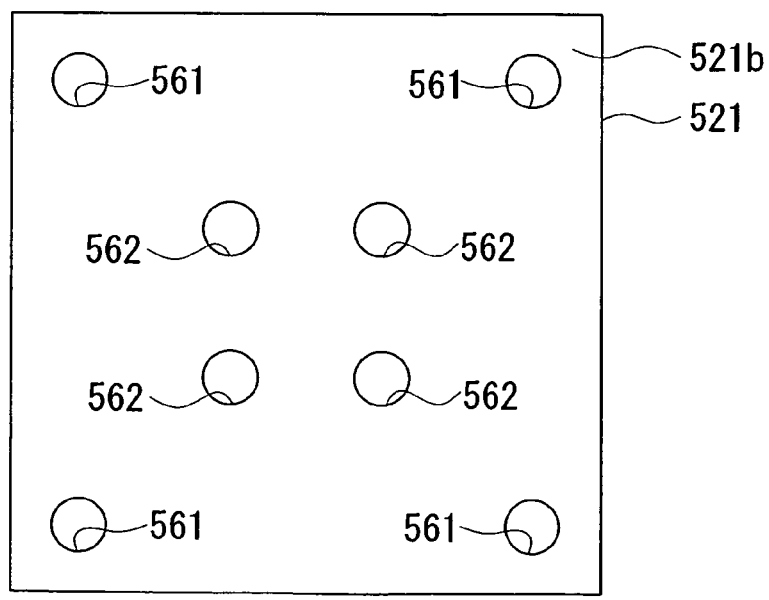
FIG. 59 is a plan view showing a WLCSP according to a second modified example of the sixth embodiment.

FIG. 59 is a plan view showing a second modified example of the WLCSP. Compared with the WLCSP of the first modified example in which the hemispherical dimples 541 are formed on the backside surface 521b of the silicon substrate 521, the WLCSP of the second modified example is characterized in that a plurality of hemispherical dimples 561 are formed on four corners of the backside surface 521b of the silicon substrate 521, and a plurality of hemispherical dimples 562 are formed in the center area of the backside surface 521b of the silicon substrate 521.

Shapes and sizes of the dimples 561 and 562 are substantially identical to those of the dimples 541 used in the WLCSP of the first modified example.

The second modified example can demonstrate prescribed effects substantially identical to those of the first modified example.

Due to the formation of the hemispherical dimples 561 on the four corners of the backside surface 521b of the silicon substrate 521 that may be easily curved, it is possible to reliably avoid the occurrence of the curvature of the silicon substrate 521.

Due to the formation of the hemispherical dimples 562 on the center area of the backside surface 521b of the silicon substrate 521 that may be difficult to dissipate heat therefrom, it is possible to improve heat-dissipation characteristics with regard to the silicon substrate 521.

Figure 60:
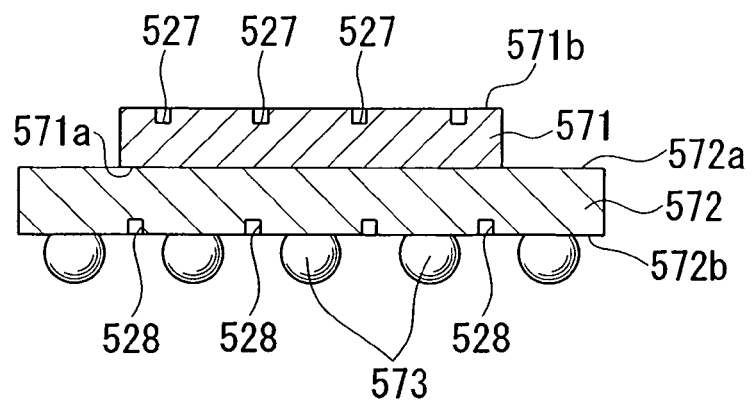
FIG. 60 is a cross sectional view showing a CSP according to a third modified example of the sixth embodiment.
Figure 61:
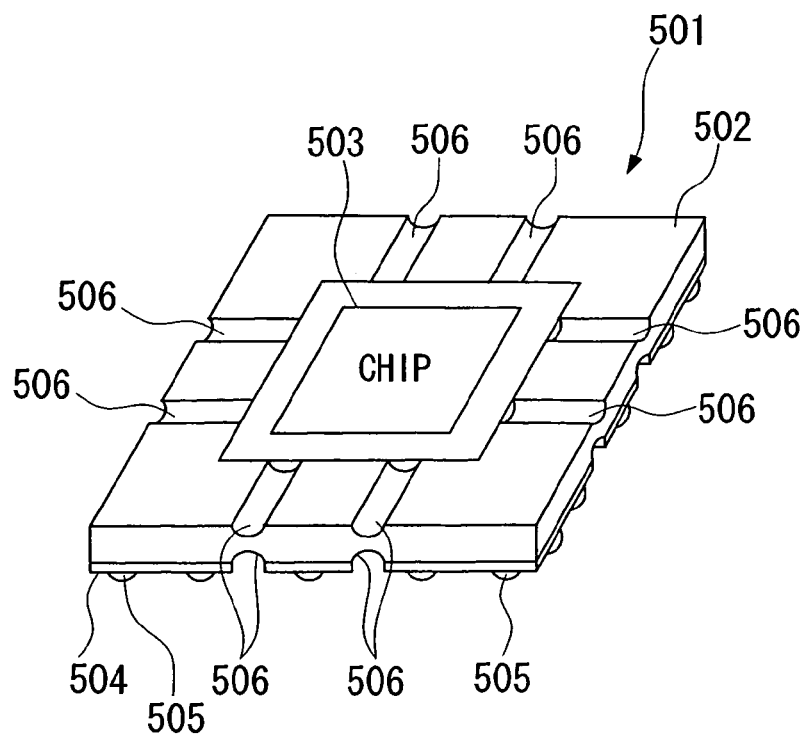
FIG. 61 is a perspective view showing an example of a chip size package (CSP) including a semiconductor chip mounted on a base substrate having V-shaped channel portions.
Figure 62:
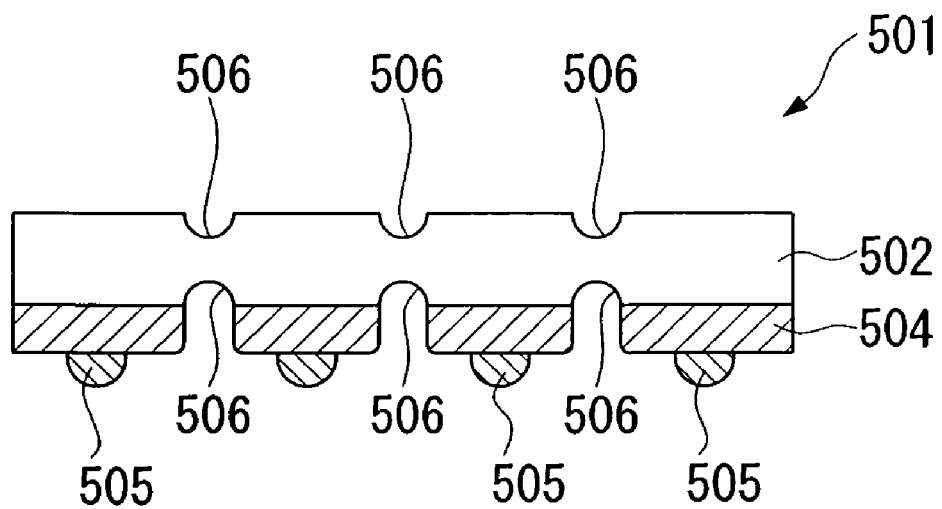
FIG. 62 is a cross sectional view of the CPS shown in FIG. 61.
Figure 63:
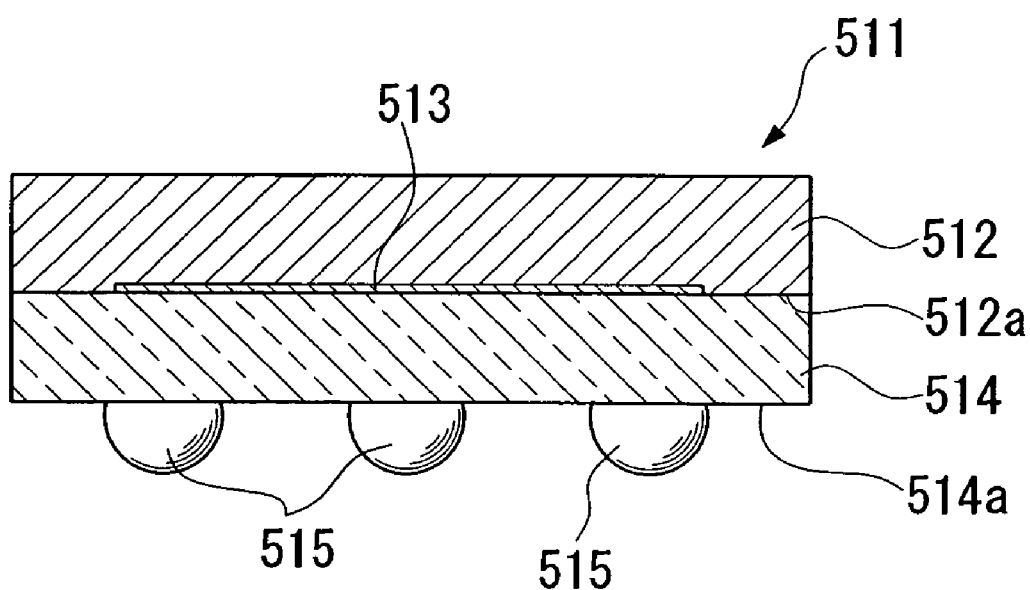
FIG. 63 is a cross sectional view showing an example of a wafer level chip size package (WLCSP) that is conventionally known.

FIG. 60 is a cross sectional view showing a chip size package (CSP) in accordance with a third modified example of the sixth embodiment. Reference numeral 571 designates a silicon substrate in which an integrated circuit (or electronic circuits, not shown) is formed on a surface 571a; reference numeral 572 designates a base substrate (or a second substrate) having a surface 572a electrically connected with a semiconductor chip 571; and reference numerals 573 designate external terminals that are formed on a backside surface 572b of the base substrate 572 and are electrically connected with the integrated circuit.

On the semiconductor chip 571, it is possible to form various thin-film components other than the integrated circuit, such as thin-film temperature sensors and thin-film magnetic sensors.

A plurality of channels 527 are formed in a grid-like manner on the backside surface 571b of the semiconductor chip 571; and a plurality of channels 528 are formed in a grid-like manner on the backside surface 572b of the base substrate 572.

The CSP according to the third modified example can demonstrate prescribed effects identical to those of the WLCSP of the present embodiment.

As described above, the present embodiment contributes to improvements regarding avoidance of curvature, joining strength, and heat-dissipation characteristics, wherein plural channels and plural dimples having desired shapes and sizes are appropriately formed at prescribed positions offering satisfactory effects.

The number and arrangement of channels and shapes of channels can be changed as necessarily. For example, channels can be arranged in a blind-like manner and a net-like manner other than the grid-like manner.

Furthermore, dimples can be appropriately changed in sizes and shapes other than hemispherical shapes as necessarily, wherein they can be formed in cubic shapes and rectangular parallelepiped shapes, for example.

The present embodiment and its modified examples, in which channels or hollows are formed on the semiconductor substrate or on the resin enclosed layer for the purposes of the avoidance of curvature and the improvements of joining strength and heat-dissipation characteristics, can be applied to any types of packages other than CSP and WLCSP, such as BGA.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A semiconductor device comprising:
   a semiconductor chip, having a rectangular shape;
   a plurality of connection pads formed on a surface of the semiconductor chip;
   at least one heat-dissipation pad formed on the surface of the semiconductor chip in proximity to a heating portion of the semiconductor chip;

a first insulating layer formed to cover the surface of the semiconductor chip except prescribed regions corresponding to the connection pads and the at least one heat-dissipation pad;

a plurality of connection electrodes arranged on the surface of the semiconductor device so as to establish electric connections with an external device;

at least one heat-dissipation electrode arranged on the surface of the semiconductor device and connected with the external device;

a first wiring portion formed on a surface of the first insulating layer to establish electric connections between the connection pads and the connection electrodes;

a second wiring portion formed on the surface of the first insulating layer to establish connection between the at least one heat-dissipation pad and the heat-dissipation electrode, wherein the second wiring portion covers the surface of the first insulating layer except a prescribed area corresponding to the first wiring portion;

a second insulating layer enclosing the first wiring portion and the second wiring portion in such a way that the connection electrodes and the at least one heat-dissipation electrode are exposed on the surface of the semiconductor device; and at least one engagement portion that establishes mutual engagement between the second wiring portion and the second insulating layer.

2. The semiconductor device according to claim 1, wherein a plurality of second wiring portions are formed on the surface of the first insulating layer.

3. The semiconductor device according to claim 1, wherein the at least one engagement portion comprising an aperture in one of the second wiring portion or the second insulating layer and a projection filling the aperture from the other of the second wiring portion or the second insulating layer.

4. The semiconductor device according to claim 1, wherein the second wiring portion comprises a sheet.

5. The semiconductor device according to claim 1, wherein the second wiring portion is formed in a central portion of the device and first wiring portion is formed in a periphery of the device.

6. A semiconductor unit comprising:

a semiconductor device including
   a semiconductor chip, having a rectangular shape,
   a plurality of connection pads formed on a surface of the semiconductor chip,
   at least one heat-dissipation pad formed on the surface of the semiconductor chip in proximity to a heating portion of the semiconductor chip,
   a first insulating layer formed to cover the surface of the semiconductor chip except prescribed regions corresponding to the connection pads,
   a plurality of connection electrodes arranged on the surface of the semiconductor device,
   at least one heat-dissipation electrode arranged on the surface of the semiconductor device,
   a first wiring portion formed on a surface of the first insulating layer to establish electric connections between the connection pads and the connection electrodes,
   a second wiring portion formed on the surface of the first insulating layer to establish connection between the heat-dissipation pad and the heat-dissipation electrode, wherein the second wiring portion covers the surface of the first insulating layer except a prescribed area corresponding to the first wiring portion,
   a second insulating layer enclosing the first wiring portion and the second wiring portion in such a way that the connection electrodes and the at least one heat-dissipation electrode are exposed on the surface of the semiconductor chip, and
   at least one engagement portion that establishes mutual engagement between the second wiring portion and the second insulating layer; and a board having at least one land, which is brought into contact with the at least one heat-dissipation electrode.

7. The semiconductor unit according to claim 6, wherein the at least one engagement portion comprising an aperture in one of the second wiring portion or the second insulating layer and a projection filling the aperture from the other of the second wiring portion or the second insulating layer.

8. A semiconductor unit comprising:

a semiconductor device including
   a semiconductor chip, having a rectangular shape,
   a plurality of connection pads formed on a surface of the semiconductor chip,
   at least one heat-dissipation pad formed on the surface of the semiconductor chip in proximity to a heating portion of the semiconductor chip,
   a first insulating layer formed to cover the surface of the semiconductor chip except prescribed regions corresponding to the pads,
   a plurality of connection electrodes arranged on the surface of the semiconductor device so as to establish electric connections with an external device,
   a plurality of heat-dissipation electrodes arranged on the surface of the semiconductor device,
   a first wiring portion formed on a surface of the first insulating layer to establish electric connections between the connection pads and the connection electrodes,
   a second wiring portion that is formed on the surface of the first insulating layer to establish connection between the at least one heat-dissipation pad and the plurality of heat-dissipation electrodes, wherein the second wiring portion covers the surface of the first insulating layer except a prescribed area corresponding to the first wiring portion,
   a second insulating layer enclosing the first wiring portion and the second wiring portion in such a way that the connection electrodes and the plurality of heat-dissipation electrodes are exposed on the surface of the semiconductor chip, and
   at least one engagement portion that establishes mutual engagement between the second wiring portion and the second insulating layer; and a board having a plurality of lands, which are brought into contact with the plurality of heat-dissipation electrodes, wherein mutually adjoining lands are integrally connected together.

9. The semiconductor unit according to claim 8, wherein the at least one engagement portion comprising an aperture in one of the second wiring portion or the second insulating layer and a projection filling the aperture from the other of the second wiring portion or the second insulating layer.

* * * * *